US010903237B1

(12) United States Patent
Hosoda et al.

(10) Patent No.: US 10,903,237 B1
(45) Date of Patent: Jan. 26, 2021

(54) THREE-DIMENSIONAL MEMORY DEVICE INCLUDING STEPPED CONNECTION PLATES AND METHODS OF FORMING THE SAME

(71) Applicant: SANDISK TECHNOLOGIES LLC, Addison, TX (US)

(72) Inventors: Naohiro Hosoda, Yokkaichi (JP); Hiroyuki Ogawa, Nagoya (JP); Yuki Mizutani, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/671,561

(22) Filed: Nov. 1, 2019

(51) Int. Cl.

| | |
|---|---|
| ***H01L 27/11582*** | (2017.01) |
| ***H01L 27/11556*** | (2017.01) |
| ***H01L 27/11524*** | (2017.01) |
| ***H01L 23/528*** | (2006.01) |
| ***H01L 27/1157*** | (2017.01) |
| ***H01L 27/11565*** | (2017.01) |

(Continued)

(52) U.S. Cl.
CPC .... *H01L 27/11582* (2013.01); *H01L 23/5226* (2013.01); *H01L 23/5283* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 5,915,167 | A | 6/1999 | Leedy |
| 9,806,093 | B2 | 10/2017 | Toyama et al. |
| 9,818,693 | B2 | 11/2017 | Toyama et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Thien F Tran
(74) *Attorney, Agent, or Firm* — The Marbury Law Group PLLC

(57) ABSTRACT

Memory stack structures and dielectric wall structures are formed through a vertically alternating sequence of continuous insulating layers and continuous sacrificial material layers. Backside trenches are formed to divide the vertically alternating sequence into multiple alternating stacks. First portions of the continuous sacrificial material layers are replaced with electrically conductive layers. A connection region including a pair of dielectric wall structures is provided between a first memory array region and a second memory array region of a first alternating stack. Second portions of the continuous sacrificial material layers remain between the pair of dielectric wall structures as a vertical stack of dielectric plates. An upper subset of the first electrically conductive layers is patterned and is divided into multiple discrete portions. The multiple discrete portions are electrically connected by a respective set of connection metal interconnect structures. A metal via structure may be formed through the dielectric plates.

20 Claims, 63 Drawing Sheets

(51) Int. Cl.
*H01L 23/522* (2006.01)
*H01L 27/11519* (2017.01)

(56) References Cited

U.S. PATENT DOCUMENTS

| | | | | |
|---|---|---|---|---|
| 9,818,759 | B2 | 11/2017 | Kai et al. | |
| 9,853,992 | B1 | 12/2017 | Kumar et al. | |
| 10,038,006 | B2 | 7/2018 | Furihata et al. | |
| 10,381,364 | B2 | 8/2019 | Zhou et al. | |
| 10,381,371 | B2 | 8/2019 | Ogawa et al. | |
| 2017/0179026 | A1 | 6/2017 | Toyama et al. | |
| 2017/0179151 | A1 | 6/2017 | Kai et al. | |
| 2017/0179152 | A1 | 6/2017 | Toyama et al. | |
| 2017/0179153 | A1 | 6/2017 | Ogawa et al. | |
| 2017/0179154 | A1 | 6/2017 | Furihata et al. | |
| 2018/0366482 | A1 | 12/2018 | Zhou et al. | |
| 2020/0168513 | A1* | 5/2020 | Sawai | H01L 27/11565 |

OTHER PUBLICATIONS

U.S. Appl. No. 16/215,912, filed Dec. 11, 2018, SanDisk Technologies LLC.
U.S. Appl. No. 16/353,048, filed Mar. 14, 2019, SanDisk Technologies LLC.
U.S. Appl. No. 16/362,988, filed Mar. 25, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/444,125, filed Jun. 18, 2019, SanDisk Technologies LLC.
U.S. Appl. No. 16/444,186, filed Jun. 18, 2019, SanDisk Technologies LLC.
U.S. Appl. No. 16/547,971, filed Sep. 22, 2019, SanDisk Technologies LLC.

* cited by examiner

THREE-DIMENSIONAL MEMORY DEVICE INCLUDING STEPPED CONNECTION PLATES AND METHODS OF FORMING THE SAME

FIELD

The present disclosure relates generally to the field of semiconductor devices, and particular to a three-dimensional memory device including a through-memory-level metal via structure and stepped connection plates and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional semiconductor device is provided, which comprises: a first alternating stack of insulating layers and electrically conductive layers located over a substrate and laterally spaced apart from neighboring alternating stacks of respective insulating layers and respective electrically conductive layers by a first backside trench and a second backside trench that laterally extend along a first horizontal direction; first memory stack structures extending through a first memory array region of the first alternating stack and second memory stack structures extending through a second memory array region of the first alternating stack, wherein the second memory array region is laterally offset from the memory array region by a connection region; and dielectric wall structures located in the connection region and vertically extending through the first alternating stack, wherein: each electrically conductive layer within a first subset of the electrically conductive layers comprises a word line or a source select gate electrode, and continuously extends between the first memory array region and the second memory array region through the connection region; each electrically conductive layer within a second subset of the electrically conductive layers comprises a drain select gate electrode, and does not extend through the connection region such that each drain select gate electrode is physically divided into a first portion located in the first memory array region and a second portion located in the second memory array region; and the first portion of each drain select gate electrode is electrically connected to a second portion of the same drain select gate electrode by a respective set of connection metal interconnect structures through a respective connection plate located between one of the dielectric wall structures and a proximal one of the first and second backside trenches.

According to another aspect of the present disclosure, a method of forming a three-dimensional memory device is provided, which comprises: forming a vertically alternating sequence of continuous insulating layers and continuous sacrificial material layers over a substrate; forming memory stack structures extending through the vertically alternating sequence; forming dielectric wall structures that laterally extend along a first horizontal direction and laterally spaced apart from each other along a second horizontal direction through each layer of the vertically alternating sequence; forming backside trenches laterally extending along the first horizontal direction through the vertically alternating sequence, wherein the vertically alternating sequence is divided into multiple alternating stacks; replacing first portions of the continuous sacrificial material layers with electrically conductive layers, wherein a first alternating stack of insulating layers and electrically conducive layers is formed between a first backside trench and a second backside trench, the first alternating stack comprises a first memory array region including a first subset of the memory stack structures, a second memory array region including a second subset of the memory stack structures, and a connection region including a pair of dielectric wall structures, and second portions of the continuous sacrificial material layers remain between the pair of dielectric wall structures as a vertical stack of dielectric plates; patterning an upper subset of the electrically conductive layers by forming drain-select-level isolation structures therethrough without patterning a lower subset of the electrically conductive layers, wherein connection plates are formed between each of the pair of dielectric wall structures and a proximal one of the first and second backside trenches; and electrically connecting the connection plates to a respective patterned portion of the upper subset of the electrically conductive layers in the first memory array region and to a respective patterned portion of the upper subset of the electrically conductive layers in the second memory array region through connection metal interconnect structures.

DETAILED DESCRIPTION

Figure 1A:
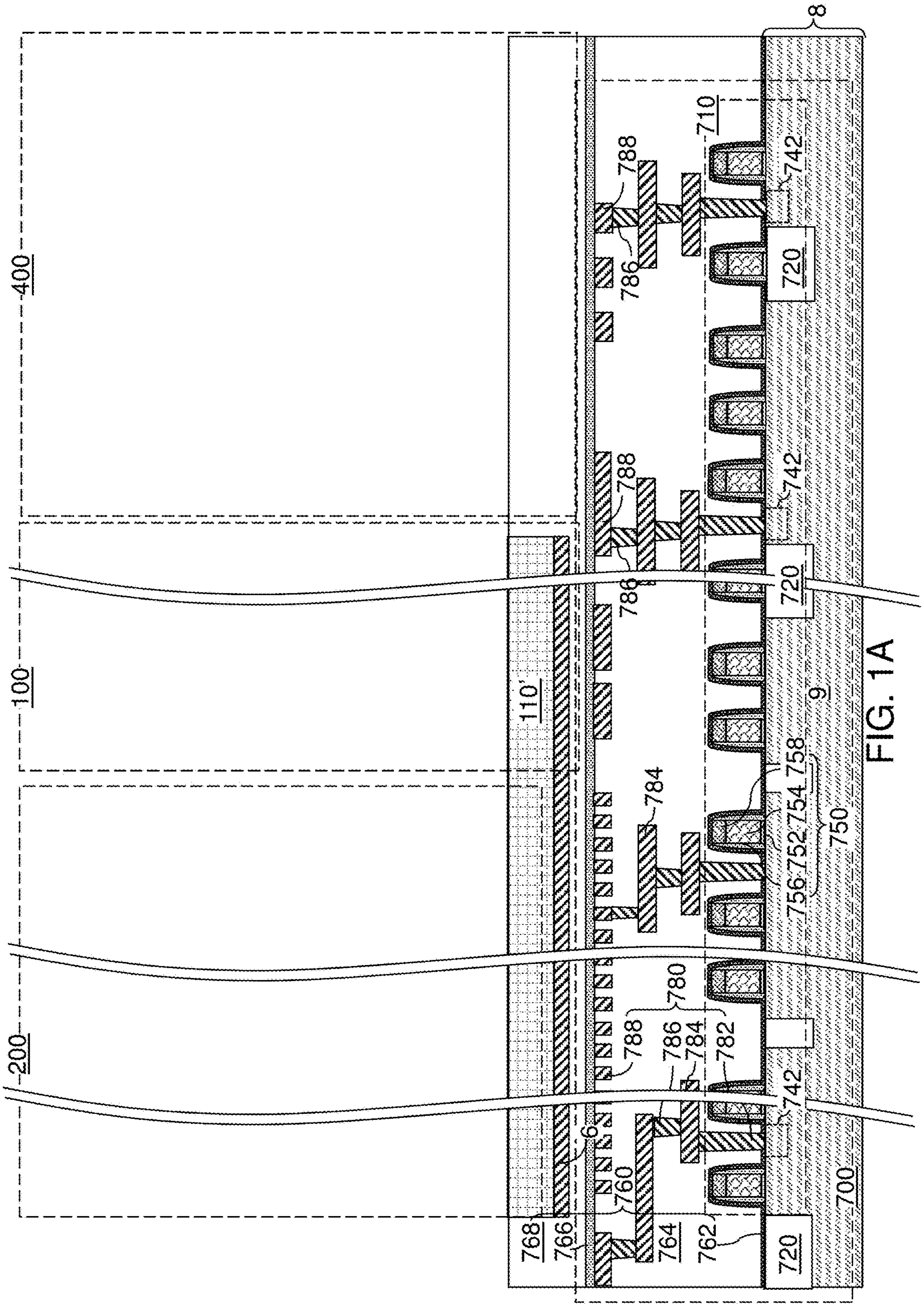
FIG. 1A is a vertical cross-sectional view of an exemplary structure after formation of semiconductor devices, lower-level dielectric material layers, lower-level metal interconnect structures, and in-process source level material layers on a semiconductor substrate according to an embodiment of the present disclosure.

As discussed above, embodiments of the present disclosure provide a three-dimensional memory device including a through-memory-level metal via structure and stepped connection plates and methods of manufacturing the same, the various aspects of which are described herein in detail. The embodiments of the present disclosure may be used to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulating material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
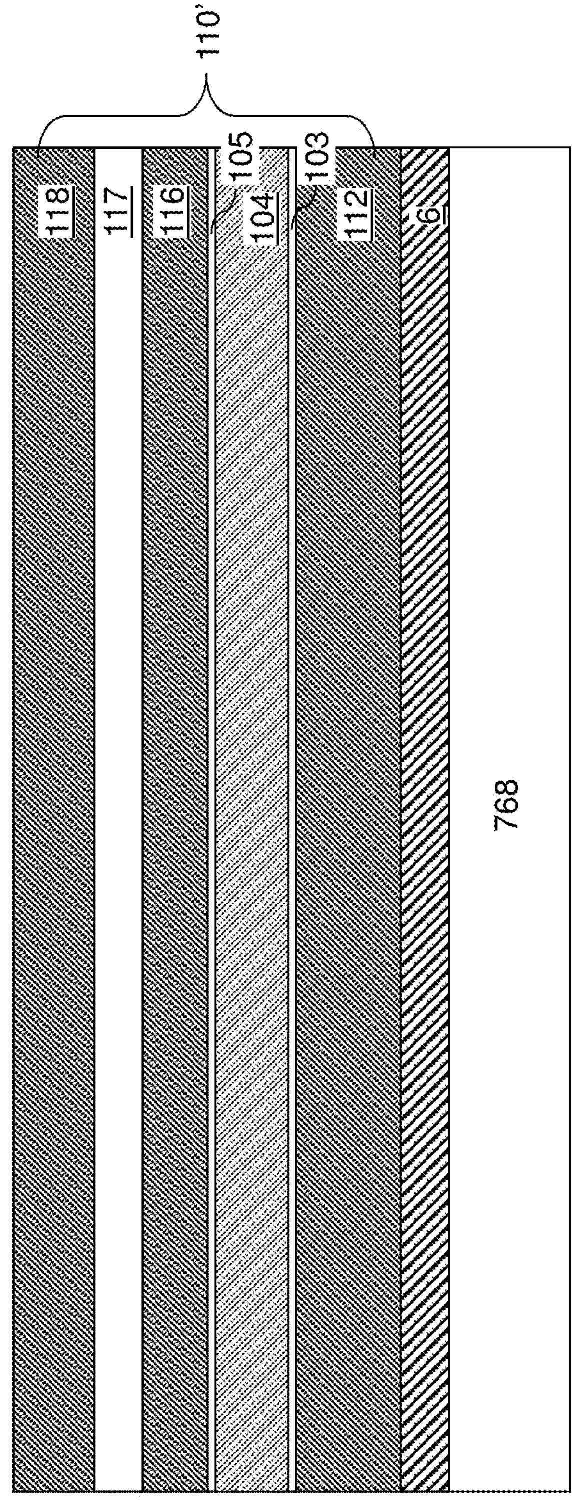
FIG. 1B is a magnified view of the in-process source level material layers and underlying material layers.

Referring to FIGS. 1A and 1B, an exemplary structure according to an embodiment of the present disclosure is illustrated. FIG. 1B is a magnified view of an in-process source-level material layers 110' illustrated in FIG. 1A. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, additional openings in the optional conductive plate layer 6 and the in-process source-level material layers 110' may be formed within the area of a memory array region 100, in which a three-dimensional memory array including memory stack structures is to be subsequently formed.

Multiple memory array regions 100 may be provided in the exemplary structure. In one embodiment, a pair of memory array regions 100 may be laterally spaced apart by a connection region 400 provided therebetween. Each connection region 400 is a region in which electrical connection structures are subsequently formed. The electrical connection structures provide electrical connection between electrically conductive layers provided in different memory array regions 100. In one embodiment, each contiguous set of in-process memory-level material layers 110' may continuously extend between an adjoined pair of a memory array region 100 and a staircase region 200, and may be spaced apart from another contiguous set of in-process memory-level material layers 110' located in another adjoined pair of a memory array region 100 and a staircase region 200 by at least a portion of the connection region 400. In one embodiment, the in-process memory-level material layers 110' may be absent at least at a center region of each connection region 400. In one embodiment, the connection regions 400 may be free of the in-process memory-level material layers 110'.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
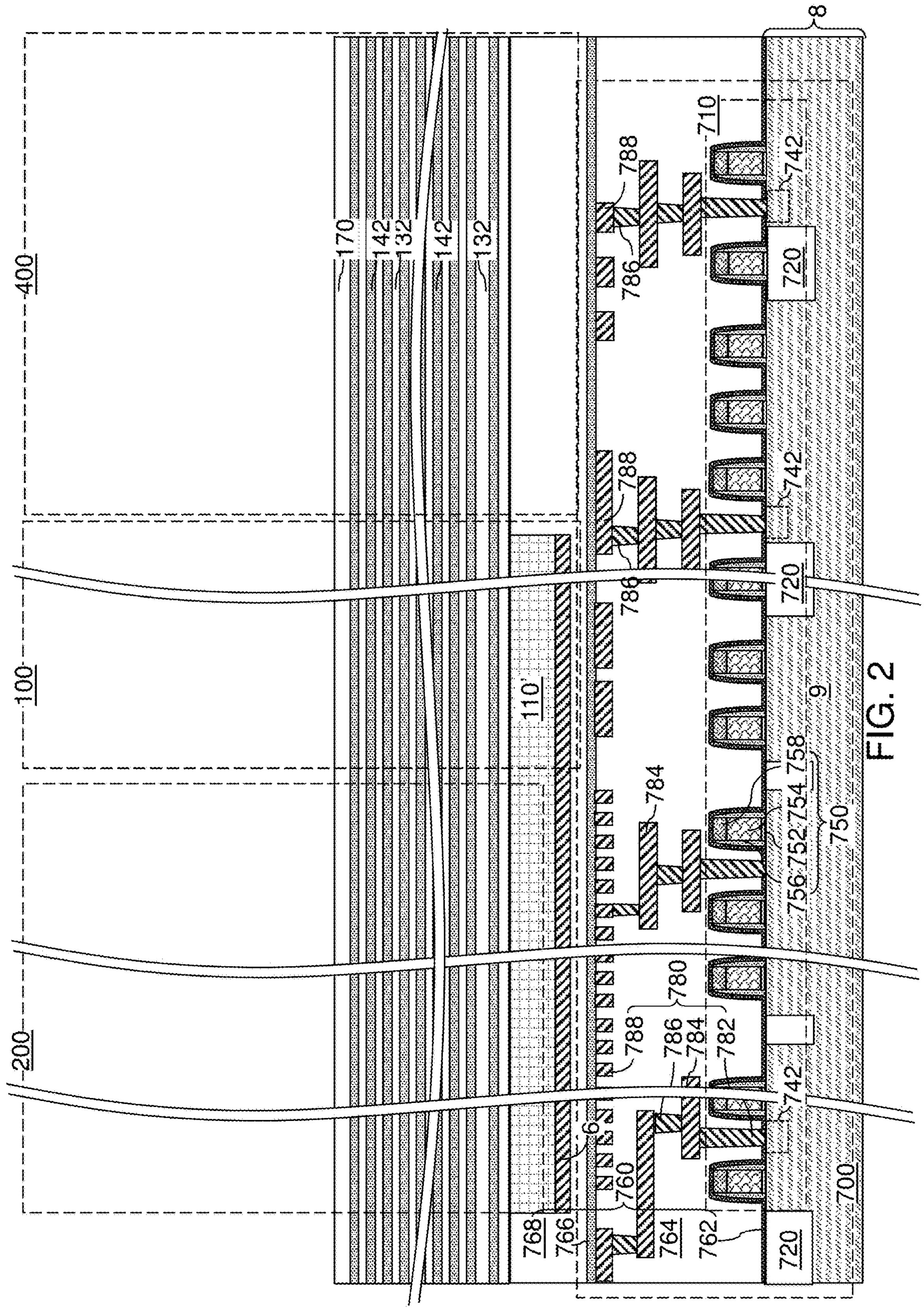
FIG. 2 is a vertical cross-sectional view of the exemplary structure after formation of a first-tier vertically alternating sequence of first insulting layers and first sacrificial material layers according to an embodiment of the present disclosure.

Referring to FIG. 2, a vertically alternating sequence of first material layers and second material layers is subsequently formed. Each first material layer may include a first material, and each second material layer may include a second material that is different from the first material. In case at least another vertically alternating sequence of material layers is subsequently formed over the vertically alternating sequence of the first material layers and the second material layers, the vertically alternating sequence is herein referred to as a first-tier vertically alternating sequence. The level of the first-tier vertically alternating sequence is herein referred to as a first-tier level, and the level of the vertically alternating sequence to be subsequently formed immediately above the first-tier level is herein referred to as a second-tier level, etc.

The first-tier vertically alternating sequence may include first insulting layers 132 as the first material layers, and first spacer layers as the second material layers. In one embodiment, the first spacer layers may be first sacrificial material layers that are subsequently replaced with electrically conductive layers. In another embodiment, the first spacer layers may be electrically conductive layers that are not subsequently replaced with other layers. While the present disclosure is described using embodiments in which sacrificial material layers are replaced with electrically conductive layers, embodiments in which spacer layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, a vertically alternating sequence of first elements and second elements refers to a structure in which instances of the first elements and instances of the second elements alternate along a vertical direction. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier vertically alternating sequence (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier vertically alternating sequence (132, 142) may have a uniform thickness that is substantially invariant within each respective first sacrificial material layer 142.

A first insulating cap layer 170 is subsequently formed over the first vertically alternating sequence (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
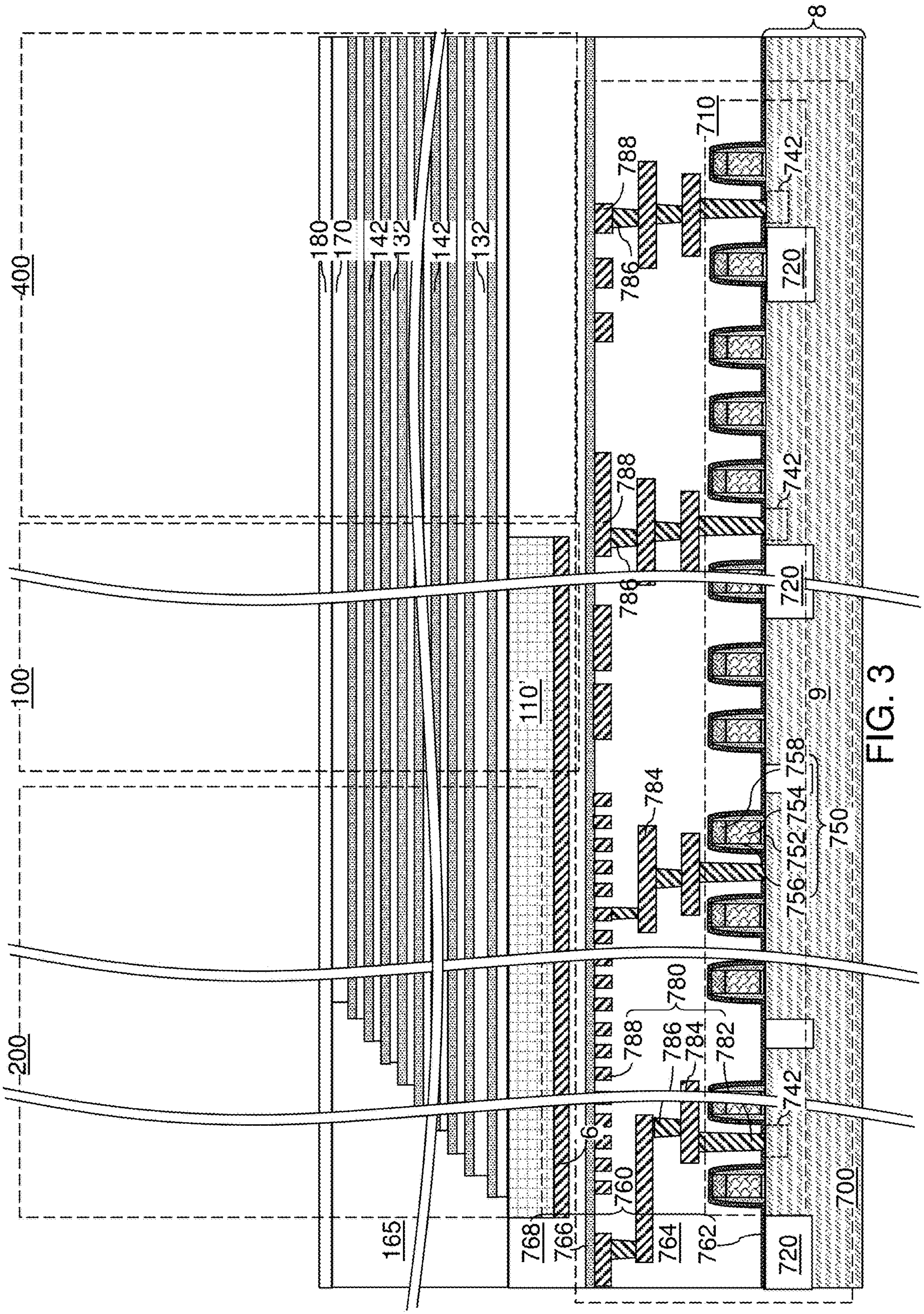
FIG. 3 is a vertical cross-sectional view of the exemplary structure after formation of a first-tier staircase region, a first retro-stepped dielectric material portion, and an inter-tier dielectric layer according to an embodiment of the present disclosure.
Figure 4A:
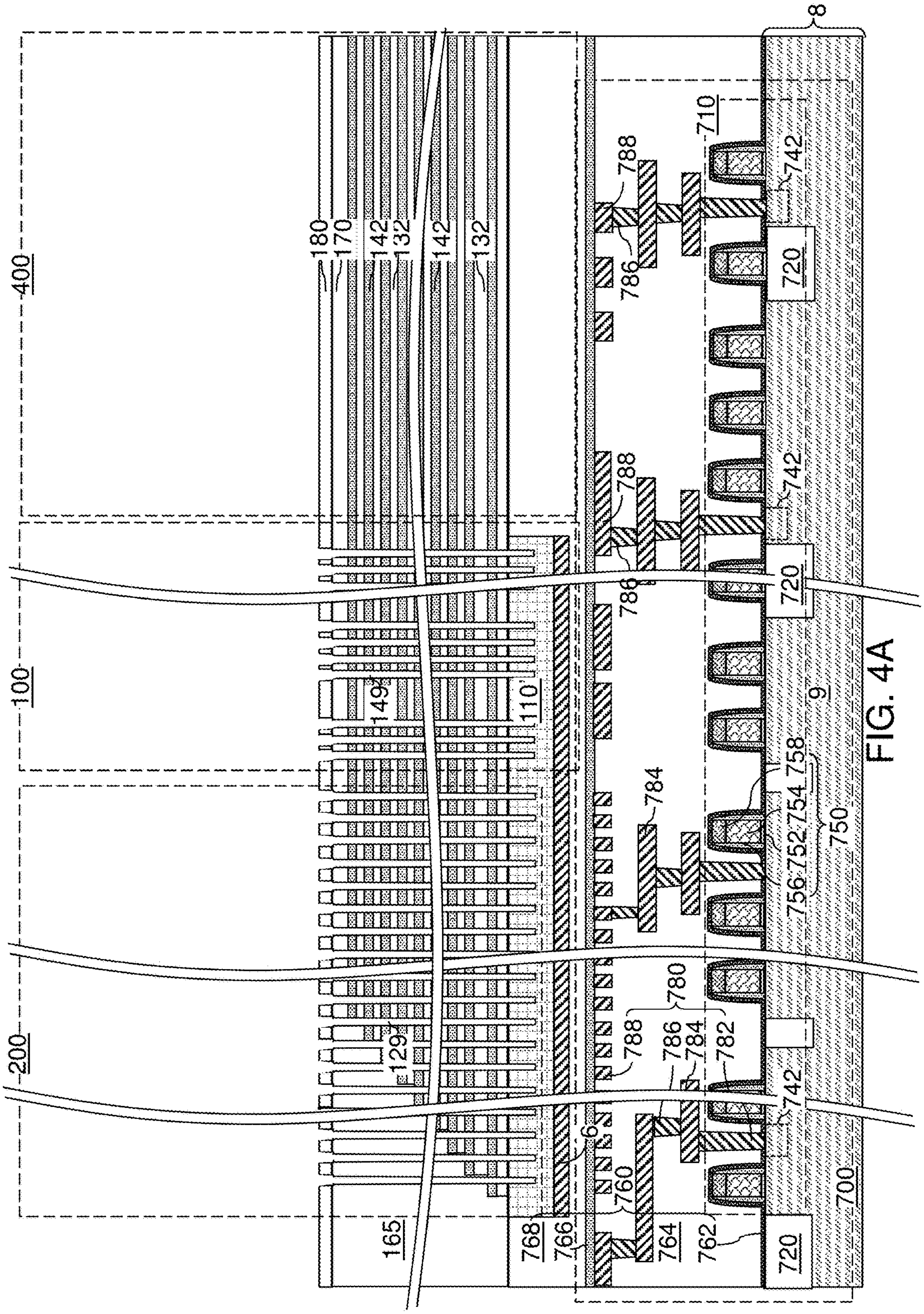
FIG. 4A is a vertical cross-sectional view of the exemplary structure after formation of first-tier memory openings and first-tier support openings according to an embodiment of the present disclosure.
Figure 4B:
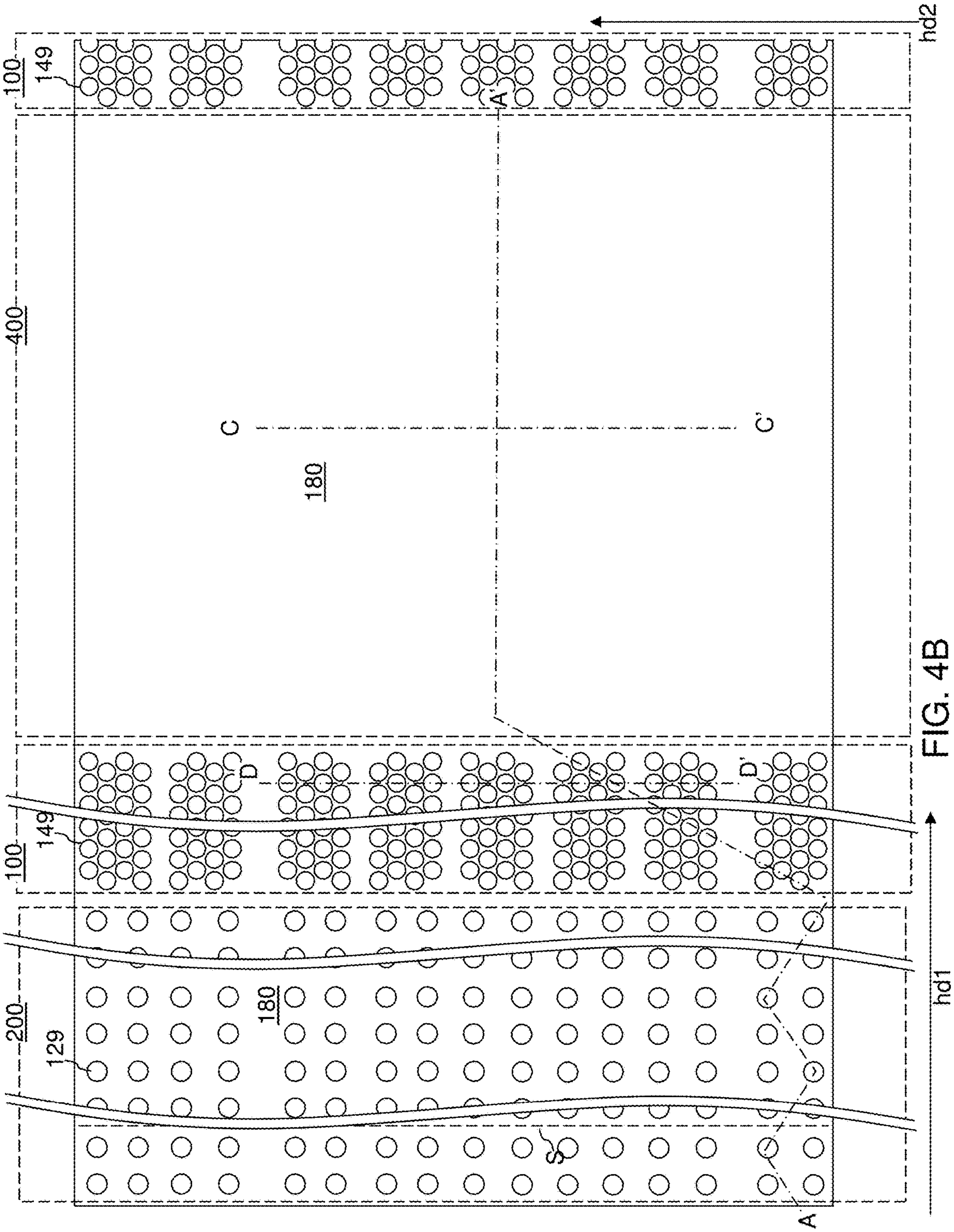
FIG. 4B is a horizontal cross-sectional view of the exemplary structure of FIG. 4A. The hinged vertical plane A-A' corresponds to the plane of the vertical cross-sectional view of FIG. 4A.
Figure 4D:
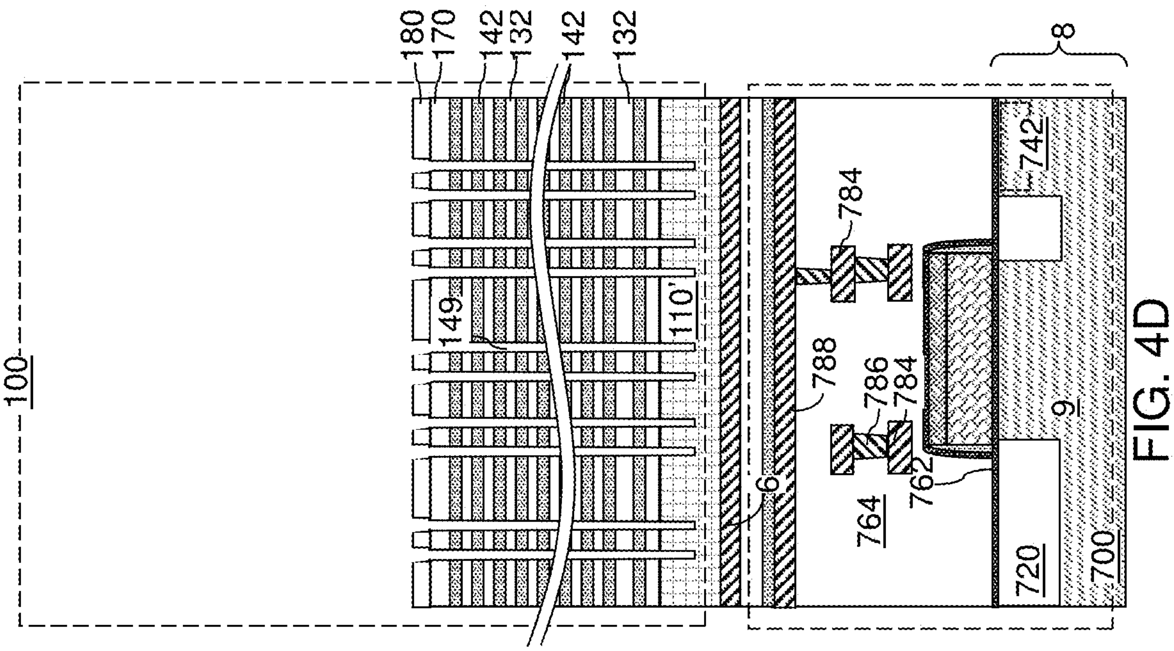
FIG. 4D is a vertical cross-sectional view of the exemplary structure along the vertical plane D-D' of FIG. 4B.
Figure 4C:
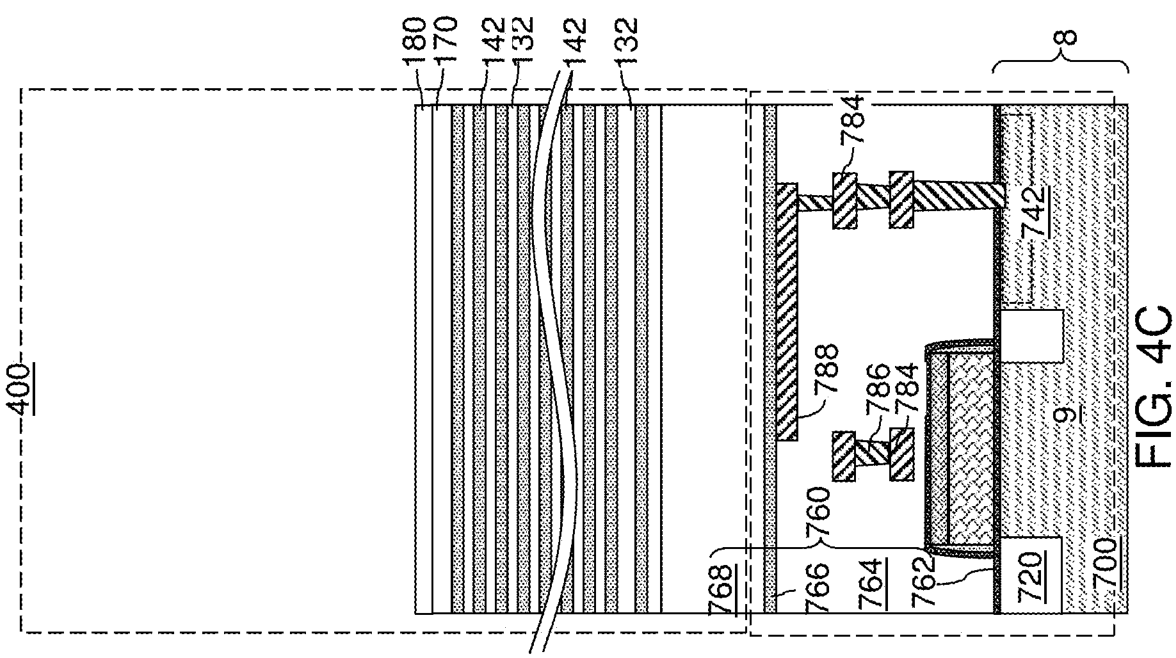
FIG. 4C is a vertical cross-sectional view of the exemplary structure along the vertical plane C-C' of FIG. 4B.
Figure 5A:
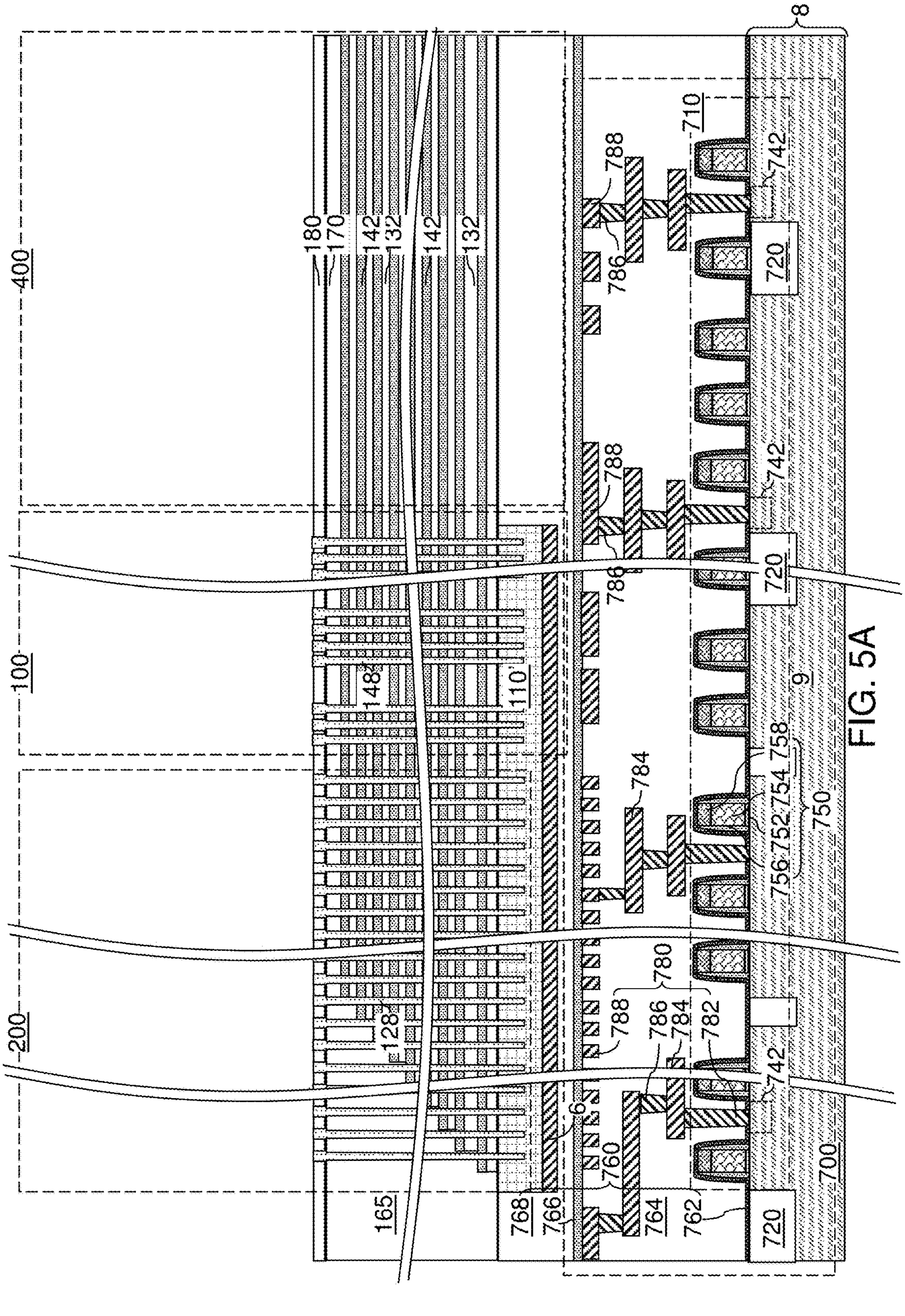
FIG. 5A is a vertical cross-sectional view of the exemplary structure after formation of various sacrificial fill structures according to an embodiment of the present disclosure.
Figure 5B:
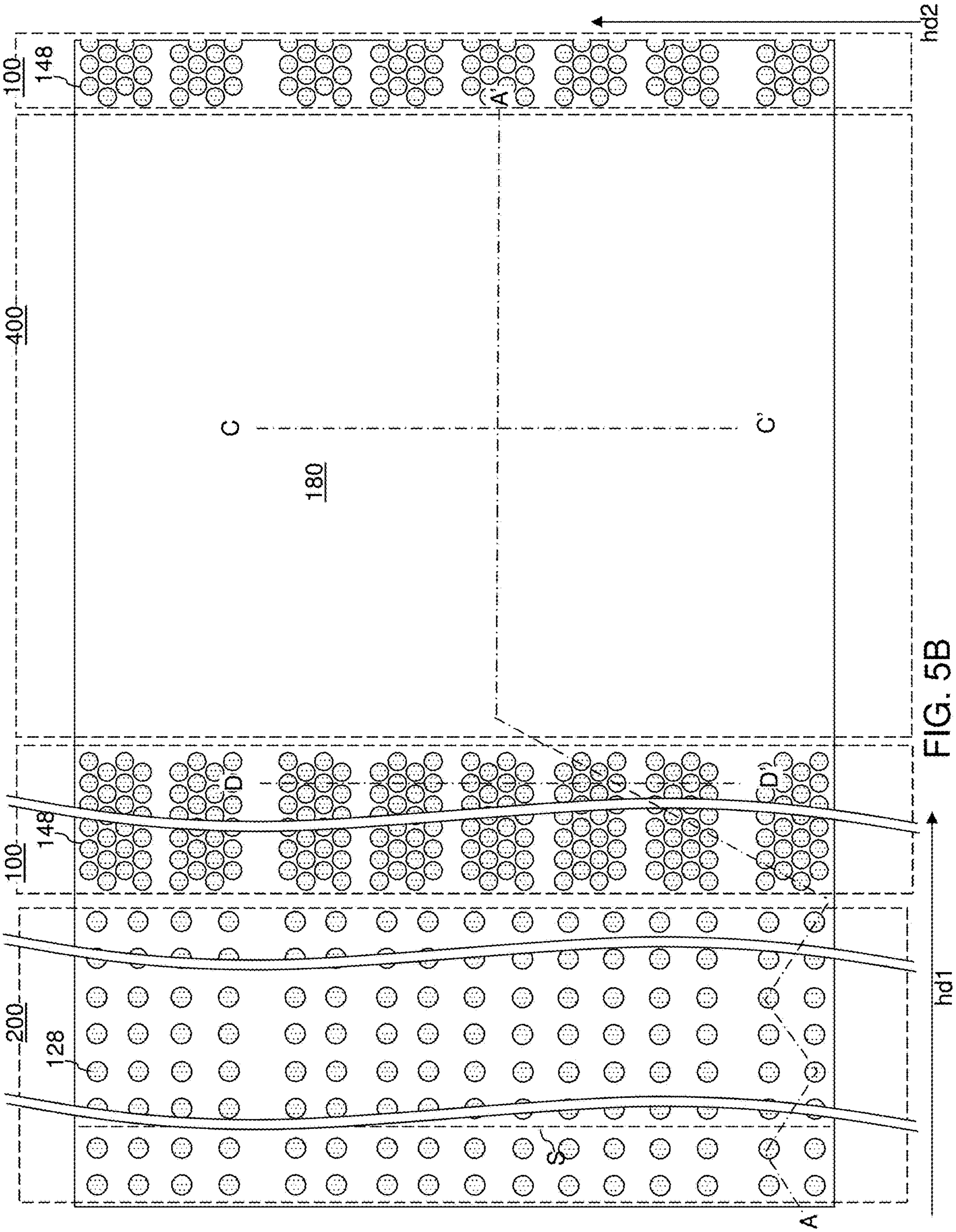
FIG. 5B is a horizontal cross-sectional view of the exemplary structure of FIG. 5A. The hinged vertical plane A-A' corresponds to the plane of the vertical cross-sectional view of FIG. 5A.
Figure 5D:
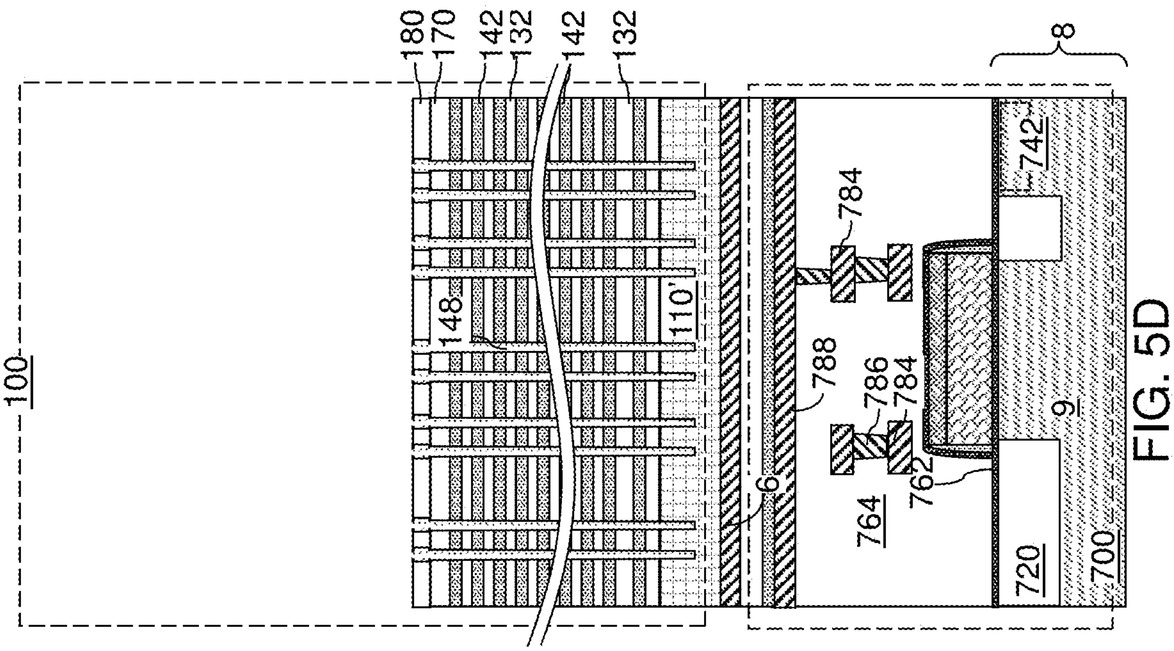
FIG. 5D is a vertical cross-sectional view of the exemplary structure along the vertical plane D-D' of FIG. 5B.
Figure 5C:
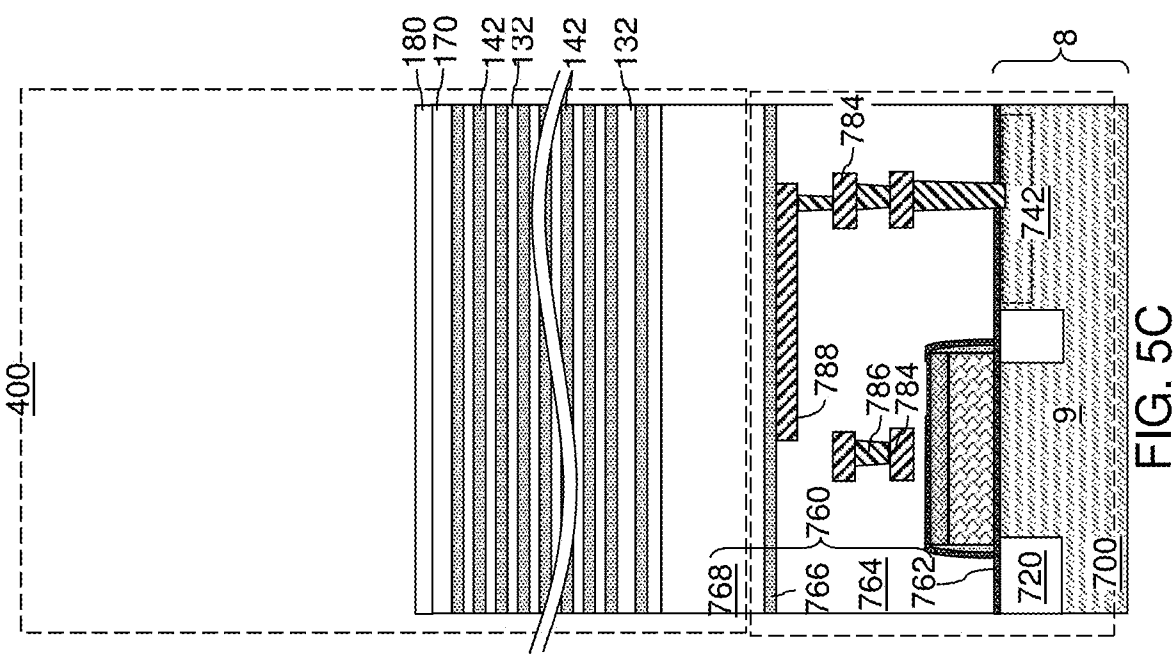
FIG. 5C is a vertical cross-sectional view of the exemplary structure along the vertical plane C-C' of FIG. 5B.

Referring to FIG. 3, the first insulating cap layer 170 and the first-tier vertically alternating sequence (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Referring to FIGS. 4A-4D, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first vertically alternating sequence (132, 142) are illustrated as dotted lines in FIG. 4B. In one embodiment, the staircase region 200 may be laterally spaced from the memory array region 100 along a first horizontal direction hd1 (e.g., word line direction). A horizontal direction that is perpendicular to the first horizontal direction hd1 is herein referred to as a second horizontal direction hd2 (e.g., bit line direction).

The first-tier memory openings 149 are openings that are formed in the memory array region 100 through each layer within the first vertically alternating sequence (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

The connection regions 400 may be free of the first-tier memory openings 149. The connection regions 400 may, or may not, include first-tier support openings 129. While the present disclosure is described employing an embodiment in which the first-tier support openings 129 are absent in the connection region 400, embodiments are expressly contemplated herein in which a subset of the first-tier support openings 129 is formed in the connection regions 400.

In one embodiment, the first anisotropic etch process may include an initial step in which the materials of the first-tier vertically alternating sequence (132, 142) are etched concurrently with the material of the first retro-stepped dielectric material portion 165. The chemistry of the initial etch step may alternate to optimize etching of the first and second materials in the first-tier vertically alternating sequence (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the vertically alternating sequence (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier vertically alternating sequence (to be subsequently formed prior to formation of the second-tier memory openings).

Referring to FIGS. 5A-5D, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first vertically alternating sequence (132, 142).

Portions of the deposited sacrificial material may be removed from above the topmost layer of the first-tier vertically alternating sequence (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
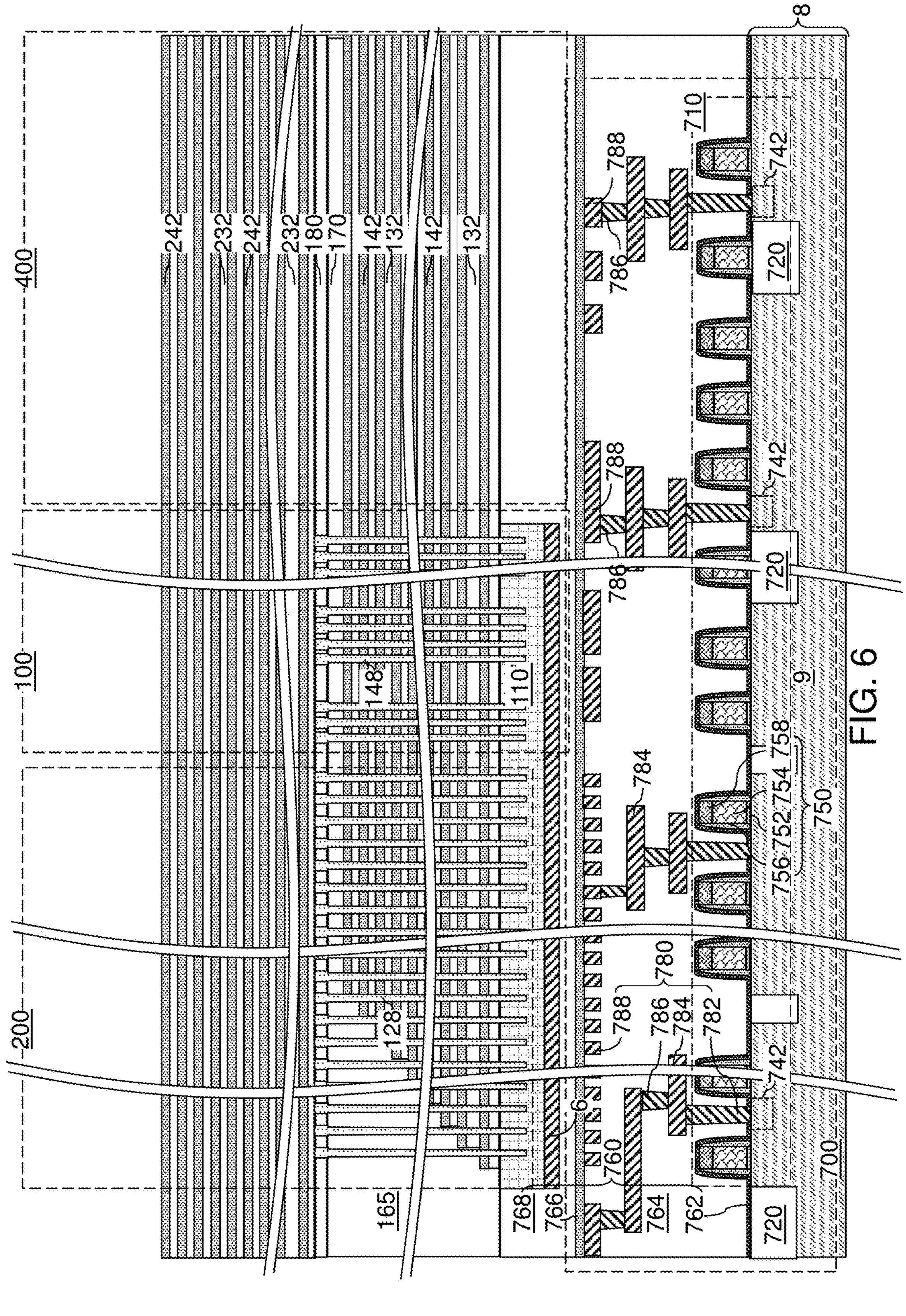
FIG. 6 is a vertical cross-sectional view of the exemplary structure after formation of a second-tier vertically alternating sequence of second insulating layers and second sacrificial material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional vertically alternating sequence of insulating layers and sacrificial material layers, which may be sacrificial material layers. For example, a second vertically alternating sequence (232, 242) of material layers may be subsequently formed on the top surface of the first vertically alternating sequence (132, 142). The second vertically alternating sequence (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second sacrificial material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second vertically alternating sequence (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second vertically alternating sequence (232, 242) may have a uniform thickness that is substantially invariant within each respective second sacrificial material layer 242.

Figure 7:
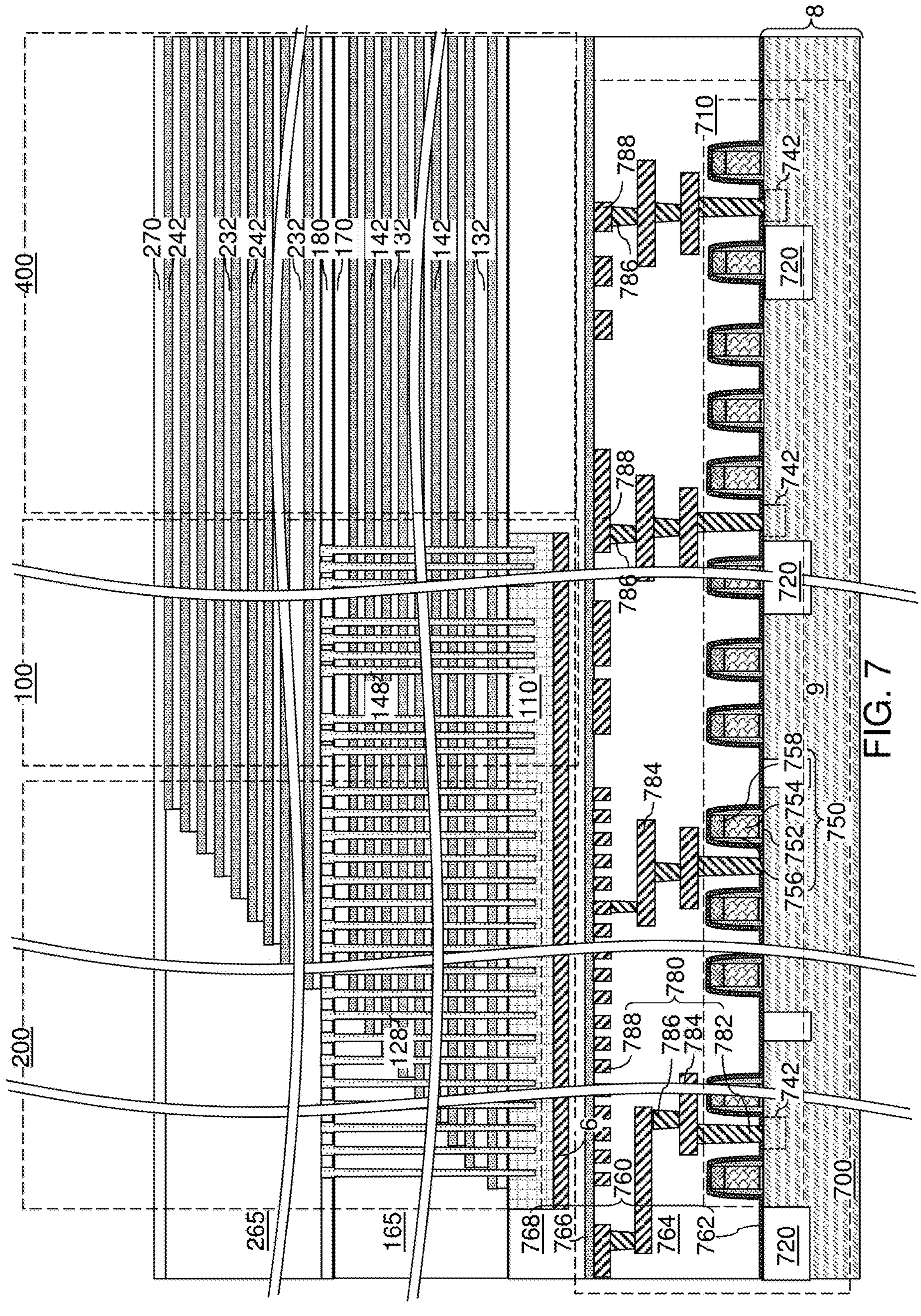
FIG. 7 is a vertical cross-sectional view of the exemplary structure after patterning a second-tier staircase region, a second retro-stepped dielectric material portion, and a second insulating cap layer according to an embodiment of the present disclosure.

Referring to FIG. 7, second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second vertically alternating sequence (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one vertically alternating sequence of continuous insulating layers (132, 232) and continuous spacer material layers (such as sacrificial material layers (142, 242)) may be formed over the in-process source-level material layers 110', and at least one retro-stepped dielectric material portion (165, 265) may be formed over the staircase regions on the at least one vertically alternating sequence {(132, 142), (232, 242)}. Multiple memory array regions 100, multiple staircase regions 200, and multiple connection regions 400 may be formed. Each of the continuous insulating layers (132, 232) and continuous spacer material layers continuously extends over the memory array regions 100, the staircase regions 200, and the connection regions 400.

Figure 8A:
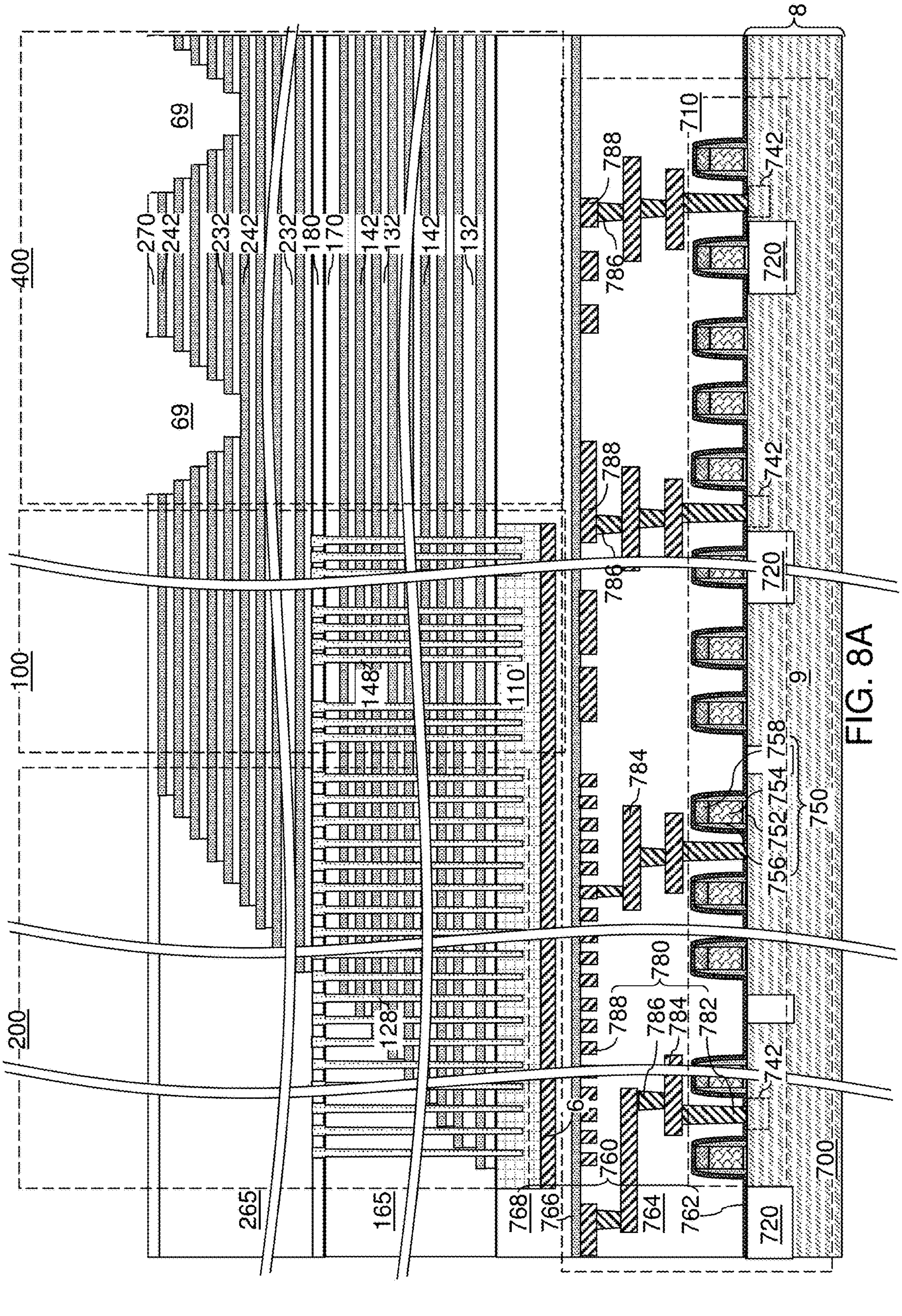
FIG. 8A is a vertical cross-sectional view of the exemplary structure after formation of connection region stepped surfaces according to an embodiment of the present disclosure.
Figure 8B:
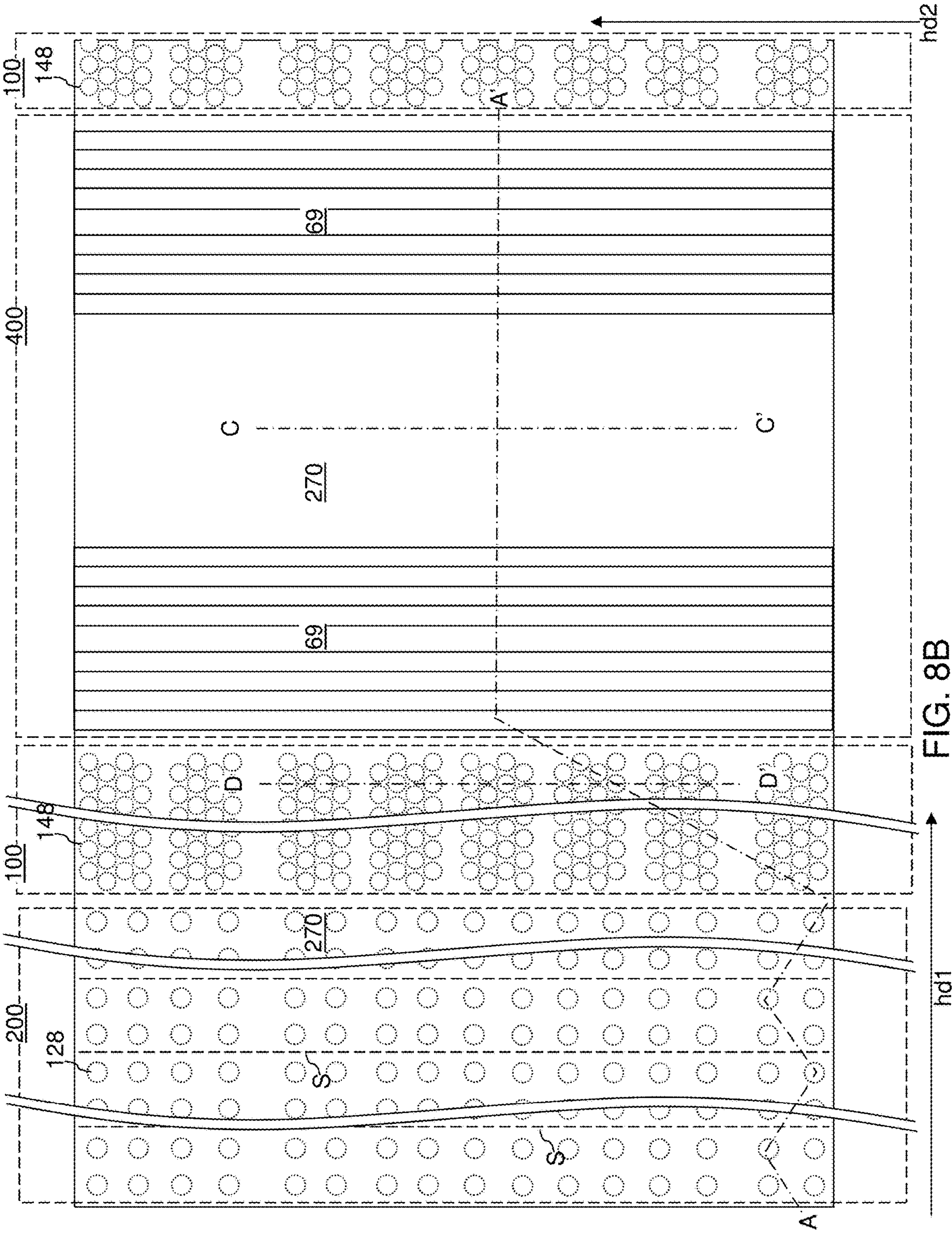
FIG. 8B is a horizontal cross-sectional view of the exemplary structure of FIG. 8A. The hinged vertical plane A-A' corresponds to the plane of the vertical cross-sectional view of FIG. 8A.
Figure 8D:
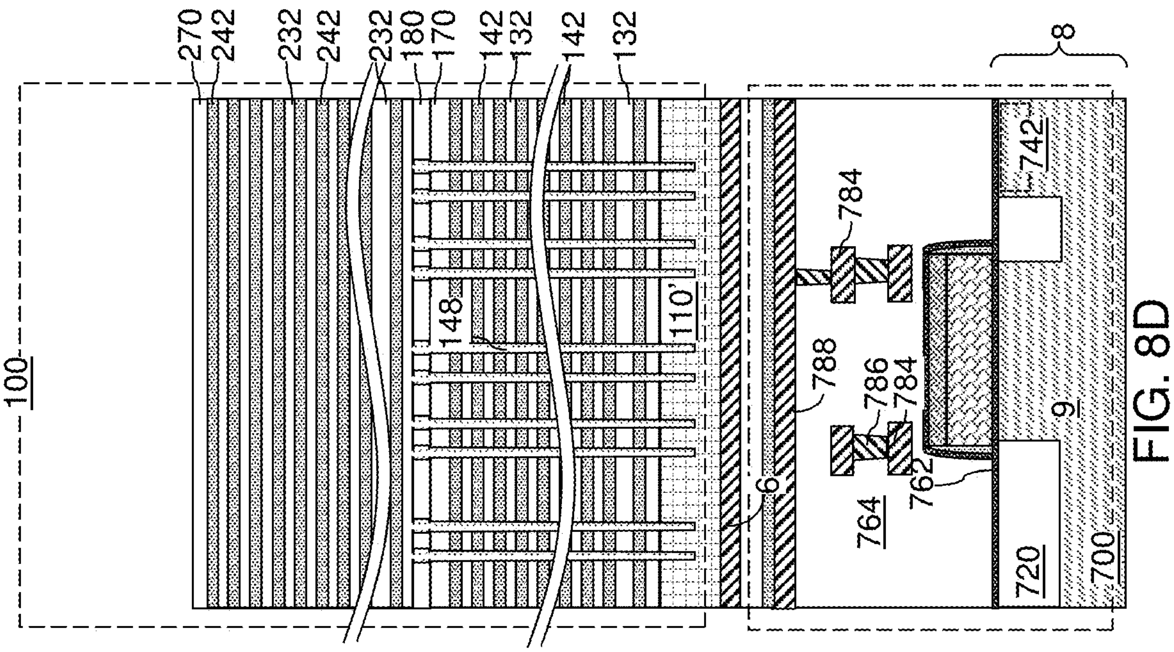
FIG. 8D is a vertical cross-sectional view of the exemplary structure along the vertical plane D-D' of FIG. 8B.
Figure 8C:
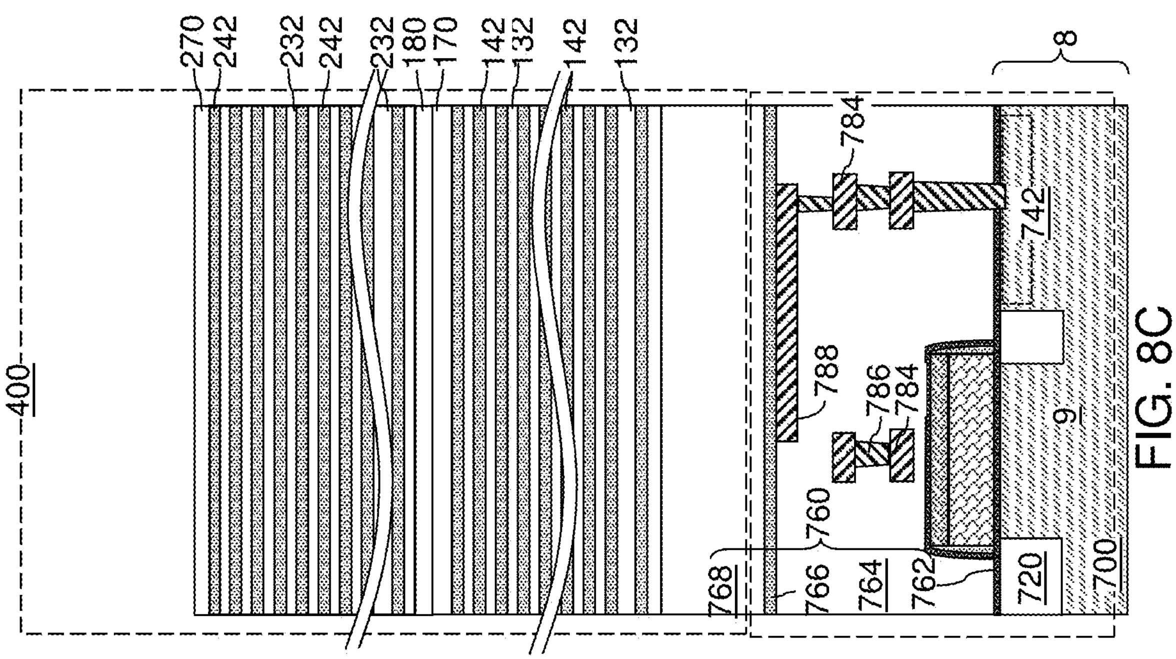
FIG. 8C is a vertical cross-sectional view of the exemplary structure along the vertical plane C-C' of FIG. 8B.
Figure 9A:
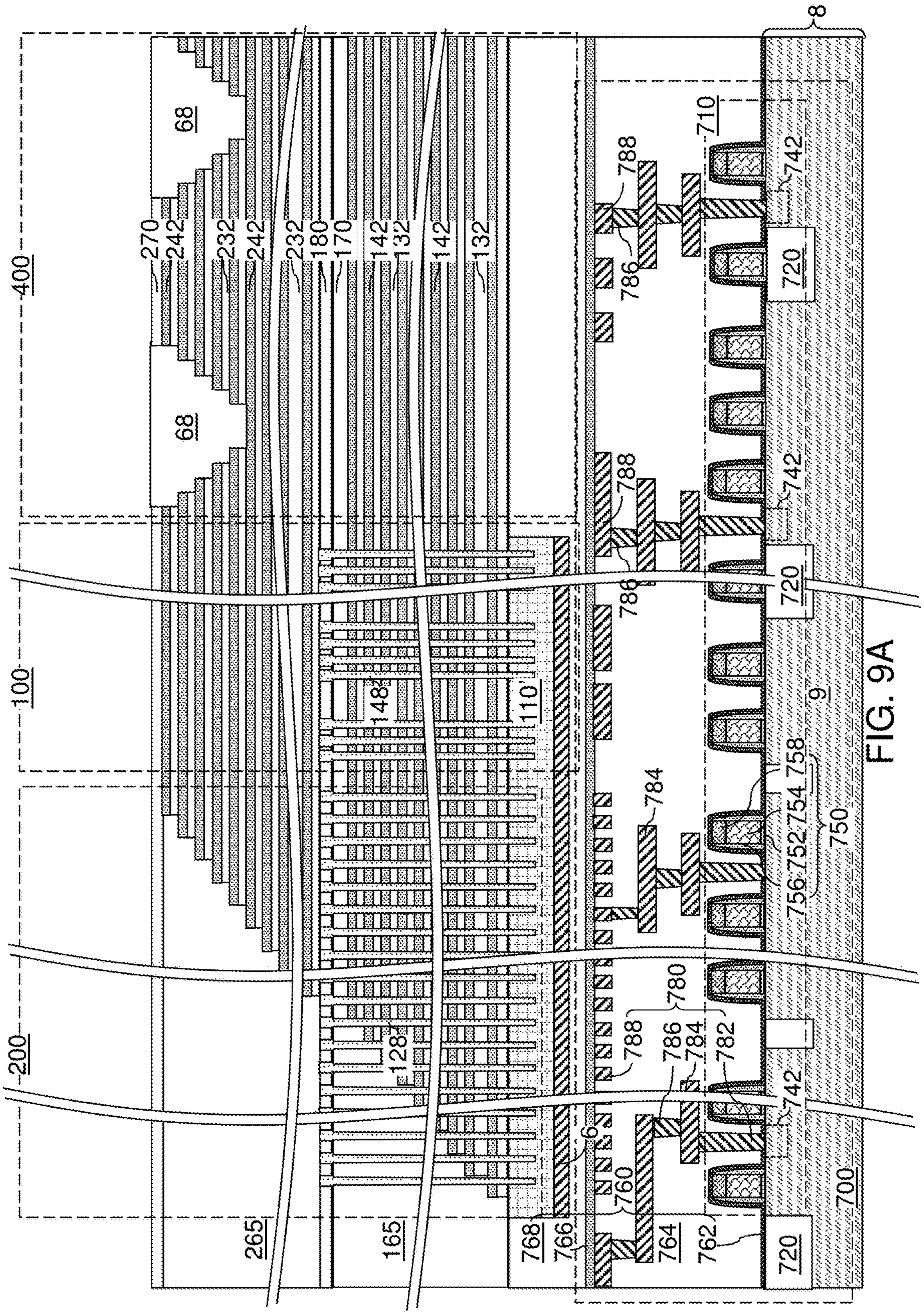
FIG. 9A is a vertical cross-sectional view of the exemplary structure after formation of connection region dielectric rail structures according to an embodiment of the present disclosure.
Figure 9B:
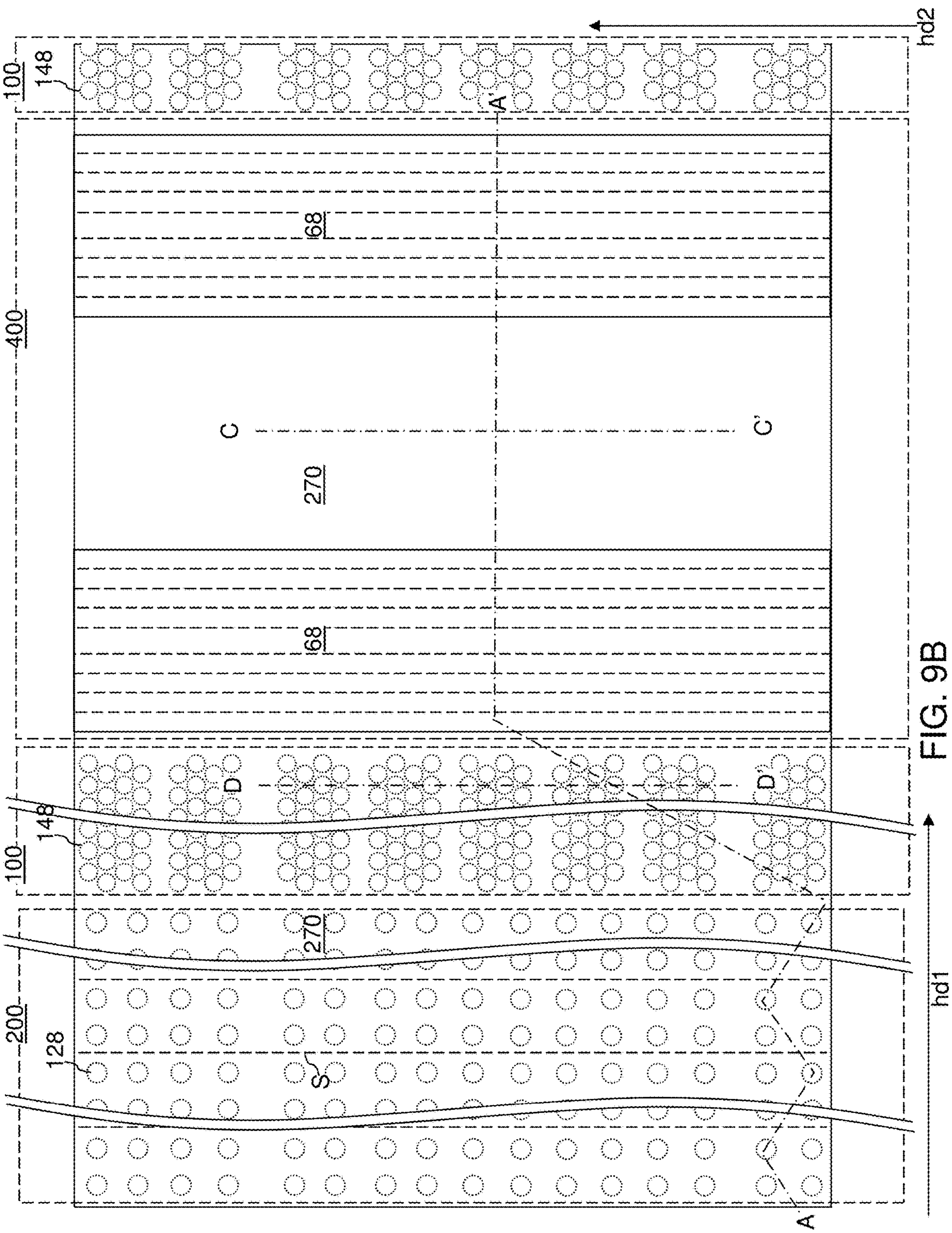
FIG. 9B is a horizontal cross-sectional view of the exemplary structure of FIG. 9A. The hinged vertical plane A-A' corresponds to the plane of the vertical cross-sectional view of FIG. 9A.
Figure 9D:
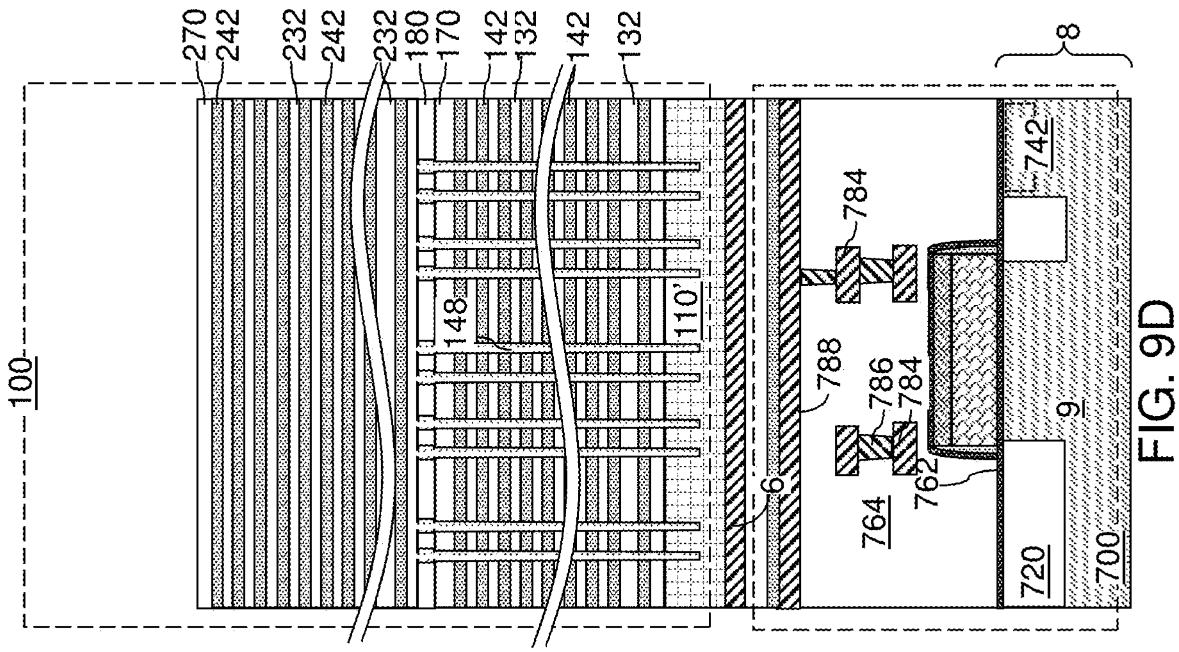
FIG. 9D is a vertical cross-sectional view of the exemplary structure along the vertical plane D-D' of FIG. 9B.
Figure 9C:
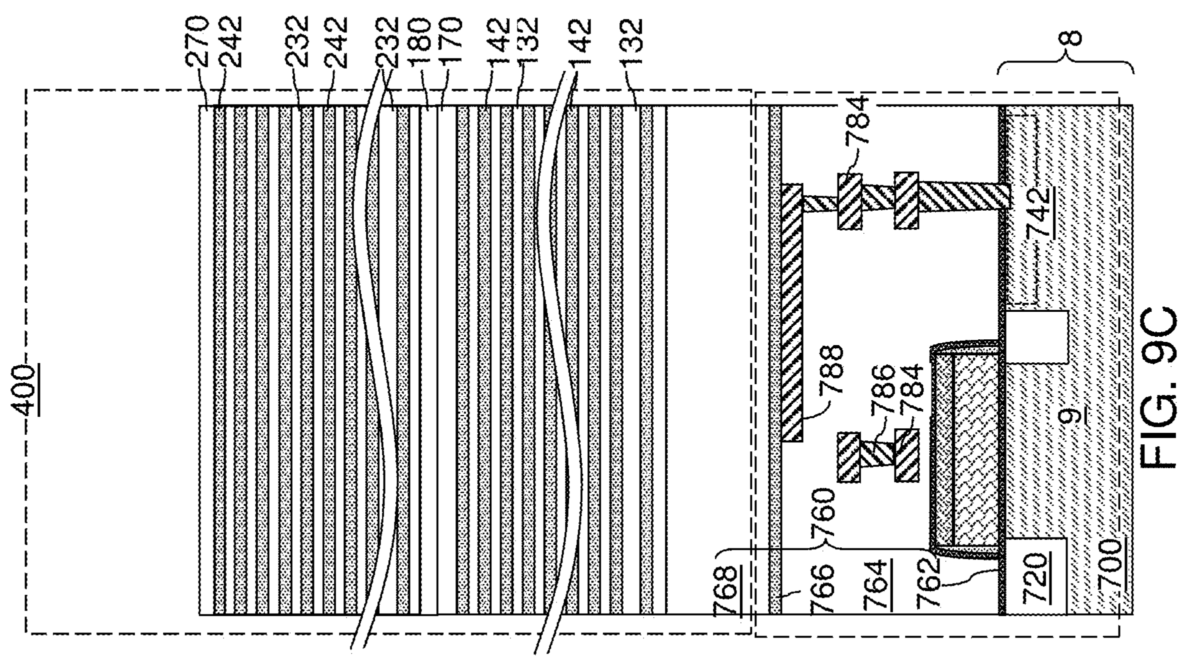
FIG. 9C is a vertical cross-sectional view of the exemplary structure along the vertical plane C-C' of FIG. 9B.

In one embodiment, a pair of rail cavities 69 having stepped sidewalls shown in FIG. 8A may be formed at the same time as the second stepped surfaces formed in the staircase region 200. In an alternative embodiment, described below with regard FIGS. 8A-8D, the pair of rail cavities 69 are formed separately from the second stepped surfaces formed in the staircase region 200. In the alternative embodiment, a trimmable etch mask material layer may be applied over the second insulating cap layer 270. The trimmable etch mask material layer includes a photoresist material that may be controllably trimmed employing a trimming process, which may be a slow ashing process. The trimmable etch mask material layer may include an organic polymer material. The trimmable etch mask layer may be deposited as a blanket (unpatterned) material layer, and may be lithographically patterned to form linear openings in the connection regions 400. Each of the linear openings through the trimmable etch mask layer may include edges that extend along the second horizontal direction hd2. Each of the linear openings in the trimmable etch mask layer may have a uniform width throughout. In one embodiment, each of the linear openings may have a shape of an elongated rectangle. The width of each linear opening in the trimmable etch mask layer may be in a range from 32 nm to 300 nm, although lesser and greater widths may also be employed.

An anisotropic etch process may be performed to transfer the pattern of the linear openings through the second insulating cap layer 270 and the topmost one of the second sacrificial material layers 242. The anisotropic etch process may include a first etch step that etches the material of the second insulating cap layer 270 selective to the material of the second sacrificial material layer 242, and a second etch step that etches the material of the second sacrificial material layer 242 selective to the material of the second insulating layers 232.

Subsequently, an isotropic trimming process may be performed to isotropically trim the material of the trimmable etch mask material layer selective to the materials of the second insulating cap layer 270, the second sacrificial material layers 242, and the second insulating layers 232. Another anisotropic etch process may be performed to transfer the pattern of the linear openings as widened by the isotropic trimming process into unmasked portions of the second insulating cap layer 270, the second sacrificial material layers 242, and the second insulating layers 232. In one embodiment, the second insulating cap layer 270 and the second insulating layers 232 may include the same material, and the anisotropic etch process may include a first etch step that etches the material of the second insulating cap layer

270 and the second insulating layers 232 selective to the material of the second sacrificial material layer 242, and a second etch step that etches the material of the second sacrificial material layer 242 selective to the material of the second insulating layers 232. Stepped surfaces are formed in areas that are not covered by the trimmable etch mask layer. The stepped surfaces formed in the connection regions 400 are herein referred to as connection region stepped surfaces.

A combination of the isotropic trimming process and the anisotropic etch process may be repeatedly performed to widen the linear openings in the trimmable etch mask layer and to etch a combination of a second insulating layer 232 and a second sacrificial material layer 242 or to etch a combination of the second insulating cap layer 270 and the topmost second sacrificial material layer 242. Pre-existing vertical steps within the linear openings in the trimmable etch mask layer are transferred downward by the height of a combination of a second insulating layer 232 and a second sacrificial material layer 242 during each anisotropic etch process. Further, additional vertical steps are formed underneath each edge of the trimmable etch mask layer along the second horizontal direction hd2 during each anisotropic etch process. The combination of the isotropic trimming process and the anisotropic etch process may be repeatedly performed to form a pair of stepped surfaces that face each other within each linear opening in the trimmable etch mask layer. In one embodiment, two linear openings that are laterally spaced from each other along the first horizontal direction hd1 may be formed within each connection region 400, and four stepped surfaces may be subsequently formed within each connection region 400. The trimmable etch mask layer may be subsequently removed, for example, by ashing.

The total number of patterned second sacrificial material layers 242 after formation of the stepped surfaces may be the same as the number of levels of electrically conductive layers to be subsequently employed as drain select electrodes (i.e., drain-select-level electrically conductive layers). The drain select electrodes refer to electrically conductive layers that are used to select (i.e., electrically activate) a subset of the memory stack structures (e.g., memory strings) for a programing operation, a reading operation, or an erasing operation. The total number of patterned second sacrificial material layers 242 after formation of the stepped surfaces may be in a range from 1 to 10, such as from 2 to 5. Generally, the connection region stepped surfaces may be formed within each connection region 400 on a subset of the continuous sacrificial material layers that include the topmost one of the second sacrificial material layers 242 and optionally additional second sacrificial material layers 242 that are proximal to the topmost one of the second sacrificial material layers 242.

A pair of rail cavities 69 may be formed within each connection region 400. Each of the rail cavities 69 laterally extend along the second horizontal direction hd2. The vertical cross-sectional shape of each rail cavity 69 may be an inverted triangle with stepped sides (e.g., the vertical cross-sectional shape of each rail cavity 69 along vertical planes that are parallel to the first horizontal direction hd1 may be invariant with translation along the second horizontal direction hd2). Each rail cavity 69 may have a pair of connection region stepped surfaces that face each other.

Referring to FIGS. 9A-9D, a dielectric fill material such as silicon oxide may be deposited in the rail cavities 69. Excess portions of the dielectric fill material may be removed from above the horizontal plane including the top surface of the second insulating cap layer 270. Each remaining portion of the dielectric fill material in the rail cavities 69 constitutes a dielectric material portion, which is herein referred to as a connection region dielectric rail structure 68. Each connection region dielectric rail structure 68 includes a pair of stepped surfaces that laterally extend along the second horizontal direction hd2. The vertical cross-sectional shape of each connection region dielectric rail structure 68 may be an inverted triangle with stepped sides (e.g., the vertical cross-sectional shape of each structure 68 along vertical planes that are parallel to the first horizontal direction hd1 may be invariant with translation along the second horizontal direction hd2).

While in one embodiment described above the connection region dielectric rail structures 68 are formed after formation of the second retro-stepped dielectric material portions 265, embodiments are expressly contemplated in which the connection region dielectric rail structures 68 are formed prior to formation of the second retro-stepped dielectric material portions 265. In this case, the second stepped surfaces in the staircase region 200 may extend through the second insulating cap layer 270. Alternatively, the second stepped surfaces in the staircase region 200 and the connection region stepped surfaces may be formed first, and a same dielectric fill material may be deposited in the second retro-stepped cavities and in the rail cavities during a same dielectric material deposition process, and excess portions of the dielectric material may be removed by a planarization process to simultaneously form the second retro-stepped dielectric material portions 265 and the connection region dielectric rail structures 68. Each of the connection region dielectric rail structures 68 includes a pair of stepped bottom surfaces that contact a respective one of the connection region stepped surfaces.

Figure 10A:
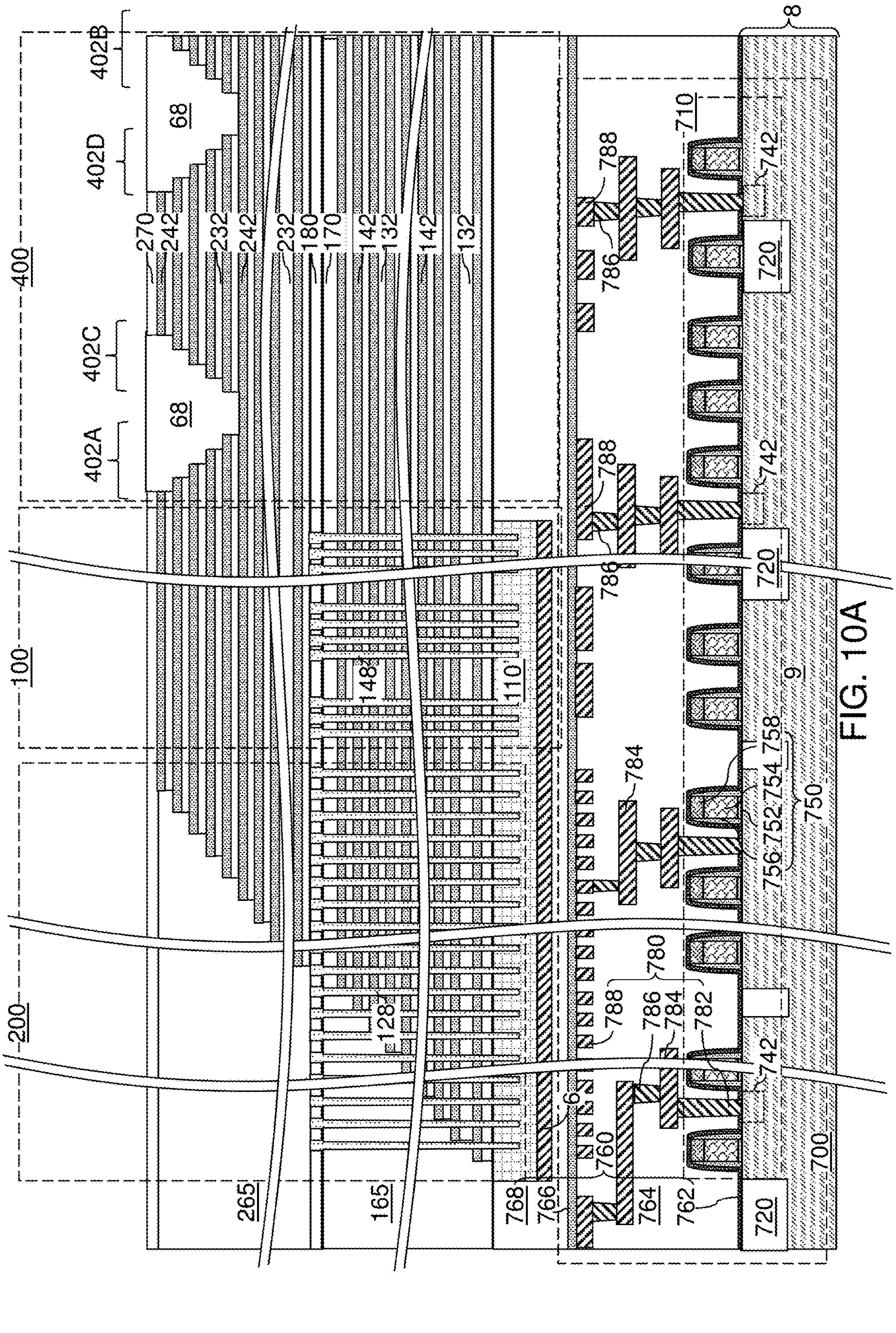
FIG. 10A is a vertical cross-sectional view of the exemplary structure after formation of dielectric wall structures according to an embodiment of the present disclosure.
Figure 10B:
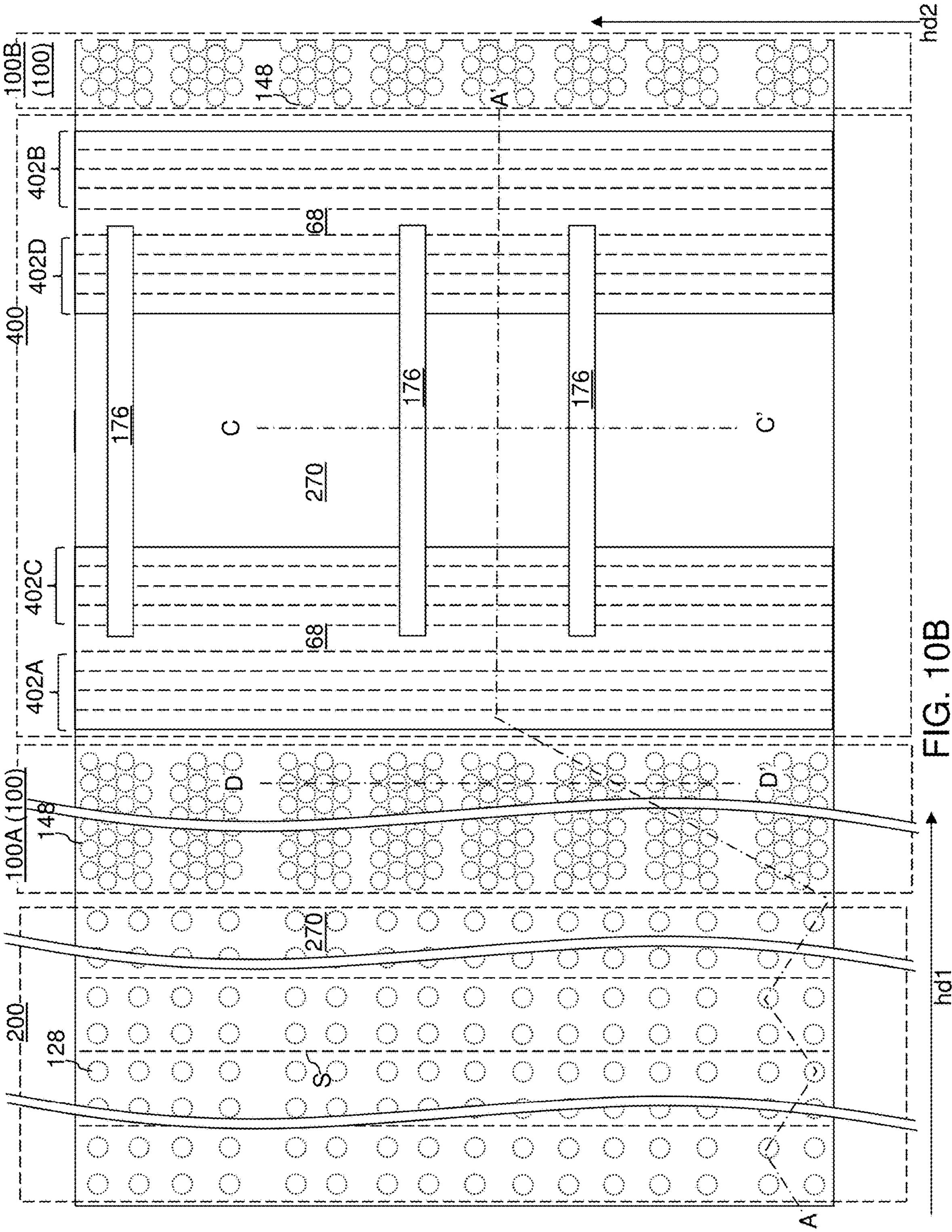
FIG. 10B is a horizontal cross-sectional view of the exemplary structure of FIG. 10A. The hinged vertical plane A-A' corresponds to the plane of the vertical cross-sectional view of FIG. 10A.
Figure 10C:
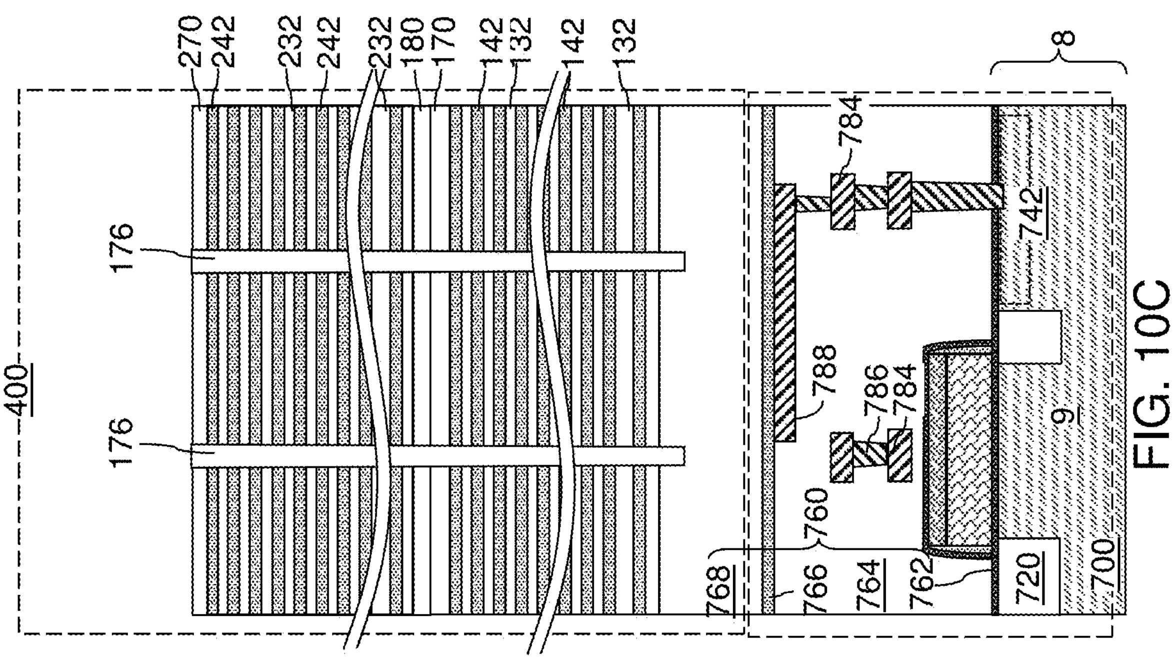
FIG. 10C is a vertical cross-sectional view of the exemplary structure along the vertical plane C-C' of FIG. 10B.
Figure 10D:
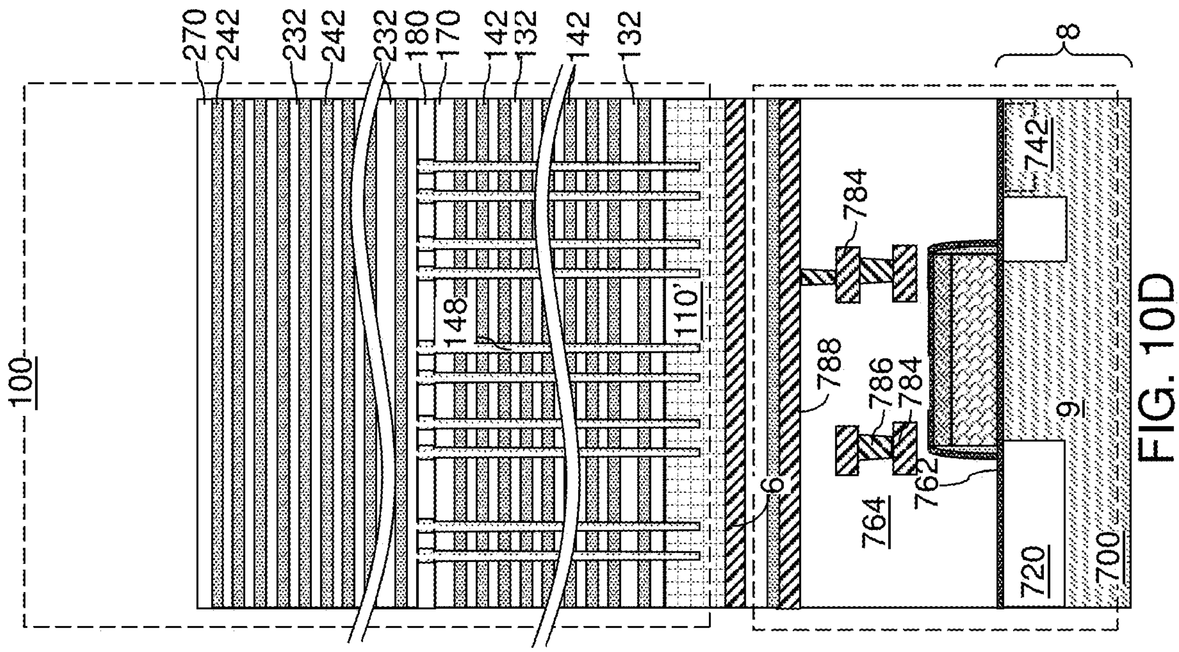
FIG. 10D is a vertical cross-sectional view of the exemplary structure along the vertical plane D-D' of FIG. 10B.
Figure 11A:
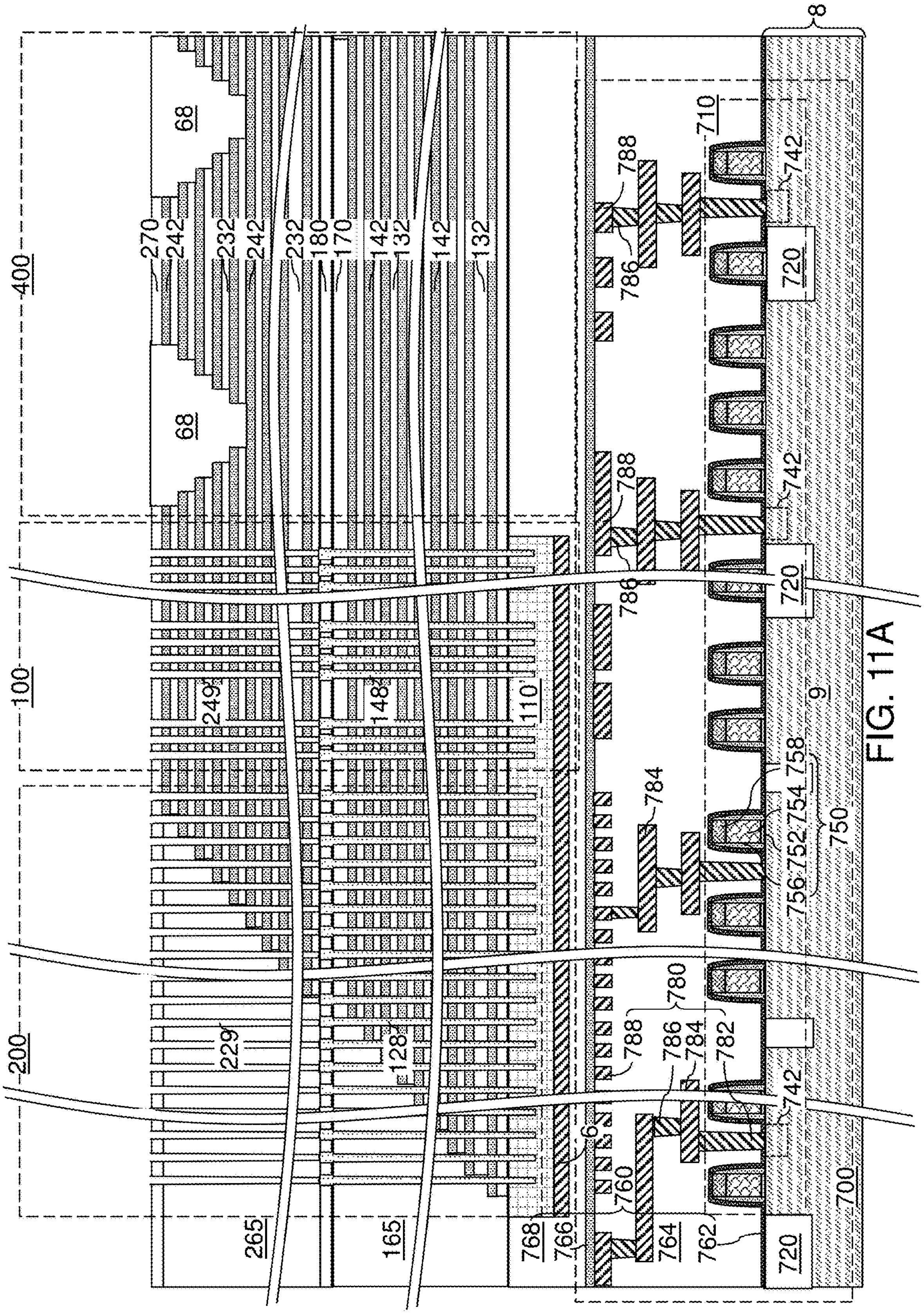
FIG. 11A is a vertical cross-sectional view of the exemplary structure after formation of second-tier memory openings and second-tier support openings according to an embodiment of the present disclosure.
Figure 11B:
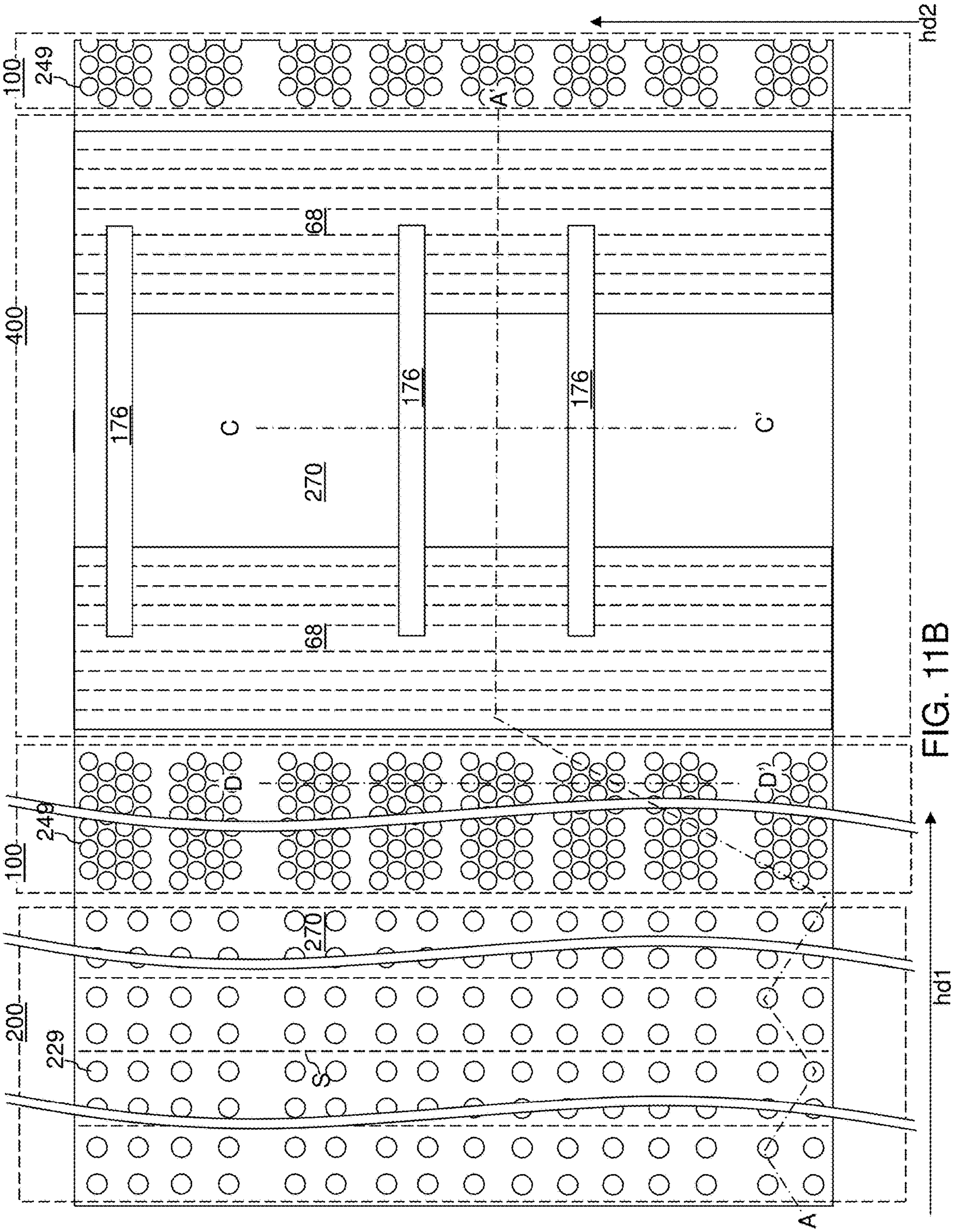
FIG. 11B is a top-down view of the exemplary structure of FIG. 11A. Some covered structures are illustrated in dotted lines. The hinged vertical plane A-A' corresponds to the plane of the vertical cross-sectional view of FIG. 11A.
Figure 11D:
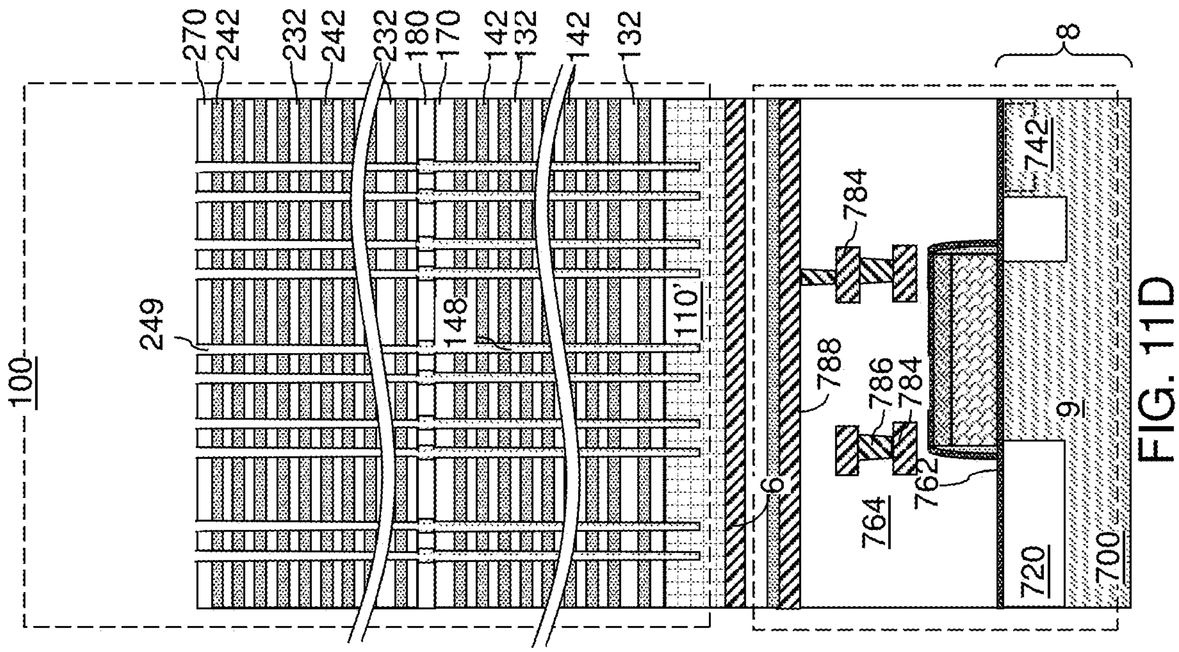
FIG. 11D is a vertical cross-sectional view of the exemplary structure along the vertical plane D-D' of FIG. 11B.
Figure 11C:
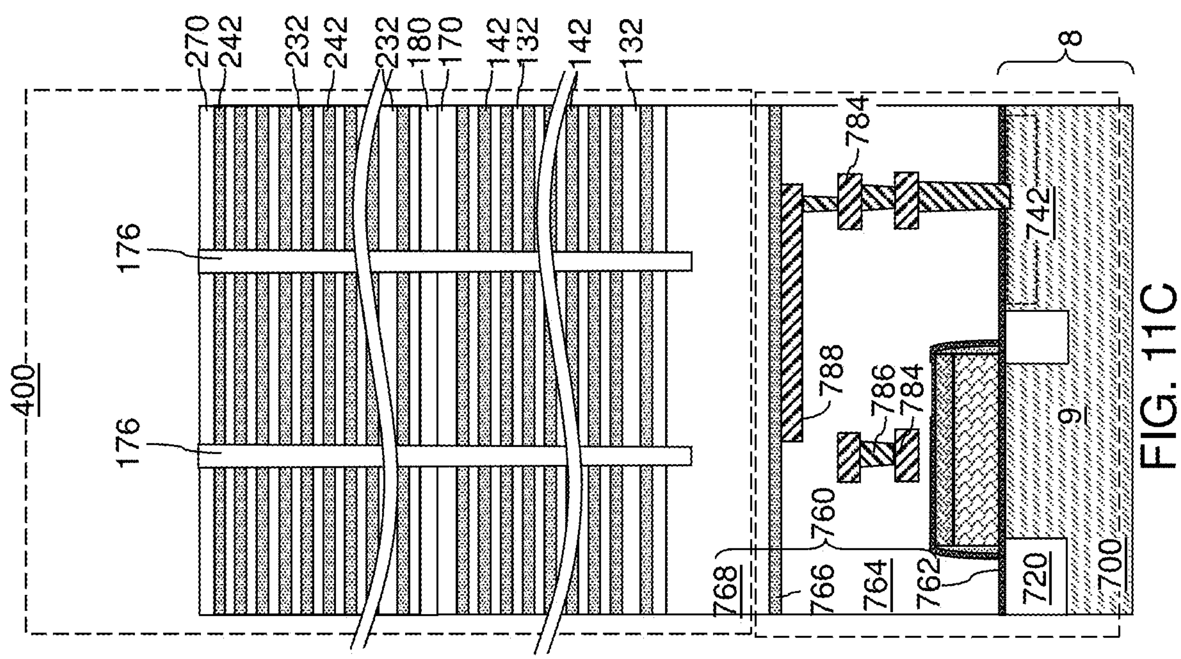
FIG. 11C is a vertical cross-sectional view of the exemplary structure along the vertical plane C-C' of FIG. 11B.

Referring to FIGS. 10A-10D, a photoresist layer (not shown) may be applied over the second insulating cap layer 270, and may be lithographically patterned to form discrete openings within each connection region 400. In one embodiment, the discrete openings are rectangular. However, other elongated shapes may also be used. The discrete rectangular openings in the photoresist layer may laterally extend along the first horizontal direction hd1, and may be laterally spaced apart along the second horizontal direction hd2. In one embodiment, each connection region 400 includes four stepped surfaces that are laterally spaced part along the first horizontal direction hd1. As shown in FIGS. 10A and 10B, the four stepped surfaces may include first stepped surfaces 402A that are proximal to a first memory array region 100A and second stepped surfaces 402B that are proximal to a second memory array region 100B. Further, the four stepped surfaces may include third stepped surfaces 402C that face the first stepped surfaces 402A, and fourth stepped surfaces 402D that face the second stepped surfaces 402B. For example, the four stepped surfaces may include, from one side to another, first stepped surfaces 402A, third stepped surfaces 402C, fourth stepped surfaces 402D, and second stepped surfaces 402B. The lateral extent of the discrete rectangular openings along the first horizontal direction hd1 may be selected such that each of the discrete rectangular openings overlies all vertical steps of the third stepped surfaces 402C and the fourth stepped surfaces 402D, and does not extend over the first stepped surfaces 402A and the second stepped surfaces 402B.

An anisotropic etch may be performed to form wall cavities that vertically extend through the second-tier structure (232, 242, 270, 265) and the first-tier structure (132, 142, 170, 165) underneath the discrete rectangular openings in the photoresist layer. A top surface of the at least one second dielectric layer 768 may be physically exposed at the bottom of each discrete rectangular opening. Each wall cavities may include a pair of substantially vertical lengthwise sidewalls and a pair of substantially vertical widthwise sidewalls. The photoresist layer may be removed, for example, by ashing.

A dielectric material such as silicon oxide may be deposited in the wall cavities by a conformal deposition process (such as low pressure chemical vapor deposition). Excess portions of the deposited dielectric material may be removed from above the top surface of the second insulating cap layer 270 by a planarization process. Remaining portions of the dielectric material in the wall cavities constitute dielectric wall structures 176.

The dielectric wall structures 176 laterally extend along the first horizontal direction hd1, and are laterally spaced apart from each other along the second horizontal direction hd2. The dielectric wall structures 176 vertically extend through each layer of the first vertically alternating sequence of the first insulating layers 132 and the first sacrificial material layers 142, and through each layer of the second vertically alternating sequence of the second insulating layers 232 and the second sacrificial material layers 242.

Referring to FIGS. 11A-11D, various second-tier openings (249, 229) may be formed through the second-tier structure (232, 242, 265, 270). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second vertically alternating sequence (232, 242) and the second retro-stepped dielectric material portion 265.

The connection regions 400 may be free of the second-tier memory openings 249. The connection regions 400 may, or may not, include second-tier support openings 229. While the present disclosure is described employing an embodiment in which the second-tier support openings 229 are absent in the connection region 400, embodiments are expressly contemplated herein in which a subset of the second-tier support openings 229 is formed in the connection regions 400.

The second anisotropic etch process may include an etch step in which the materials of the second-tier vertically alternating sequence (232, 242) are etched concurrently with the material of the second retro-stepped dielectric material portion 265. The chemistry of the etch step may alternate to optimize etching of the materials in the second-tier vertically alternating sequence (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Referring to FIGS. 12A-12D, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 13A-13D provide sequential cross-sectional views of a memory opening 49 during formation of a memory opening fill structure. The same structural change occurs in each of the memory openings 49 and the support openings 19.

Figure 12A:
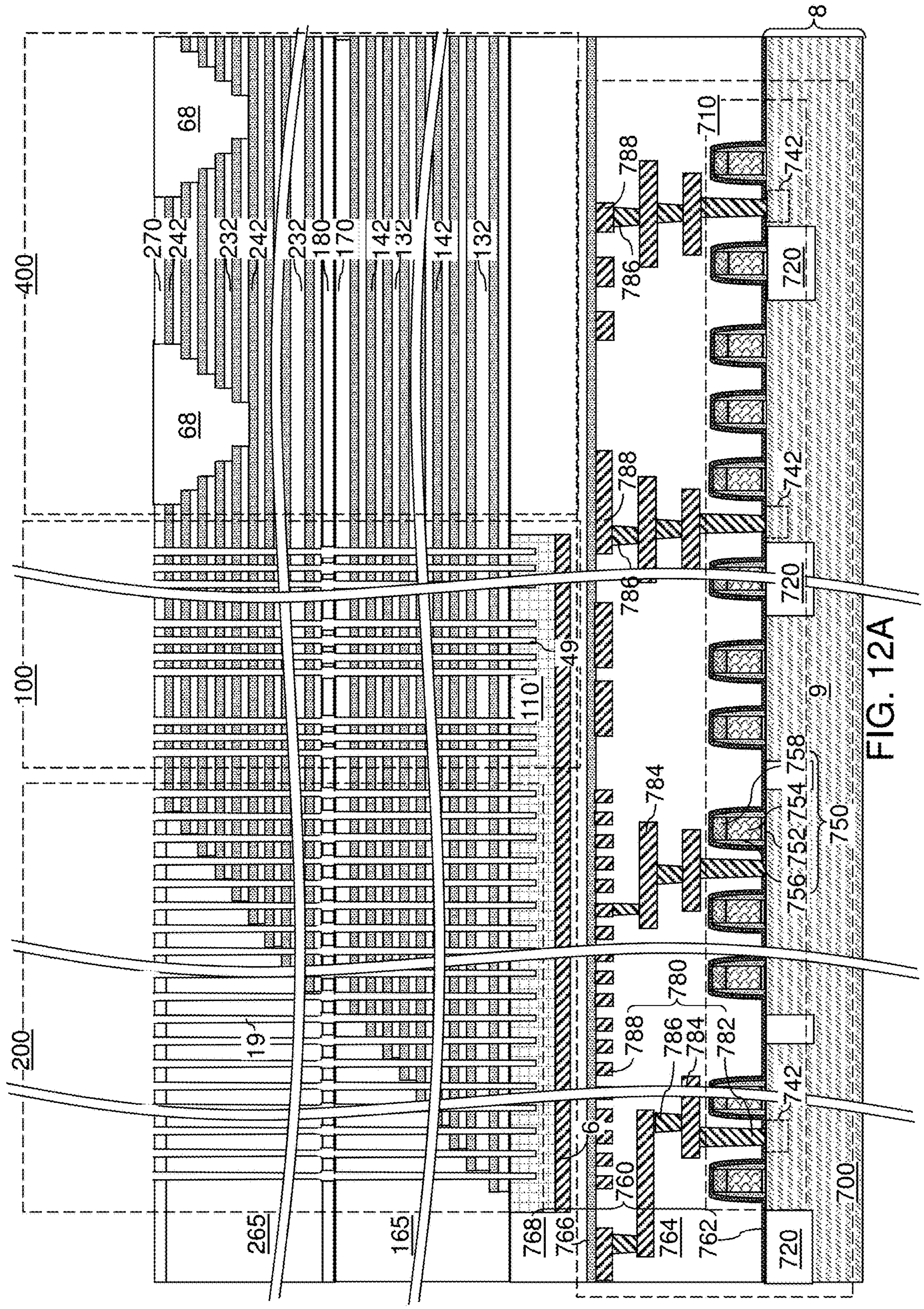
FIG. 12A is a vertical cross-sectional view of the exemplary structure after formation of inter-tier memory openings and inter-tier support openings according to an embodiment of the present disclosure.
Figure 12B:
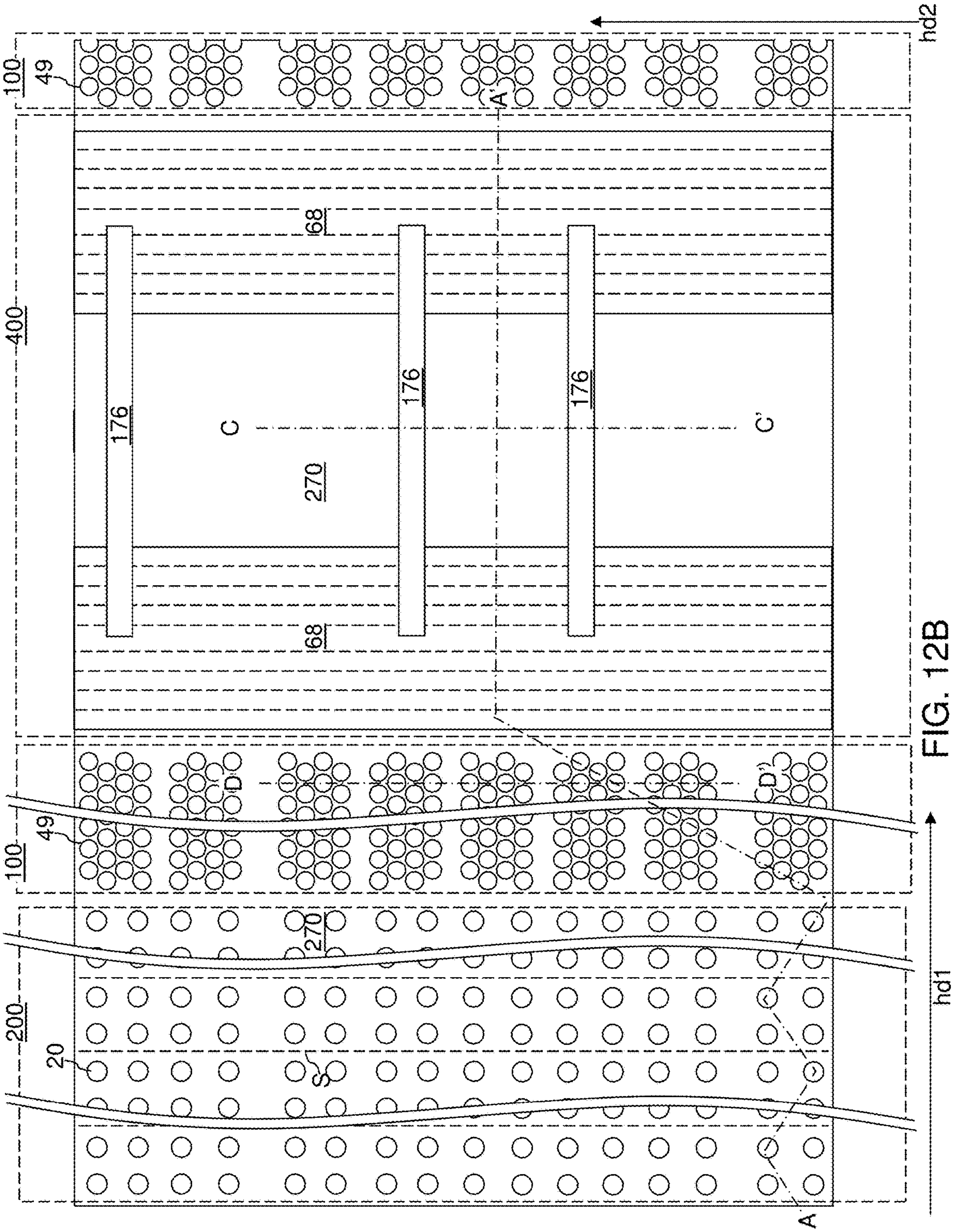
FIG. 12B is a top-down view of the exemplary structure of FIG. 12A. Some covered structures are illustrated in dotted lines. The hinged vertical plane A-A' corresponds to the plane of the vertical cross-sectional view of FIG. 12A.
Figure 12D:
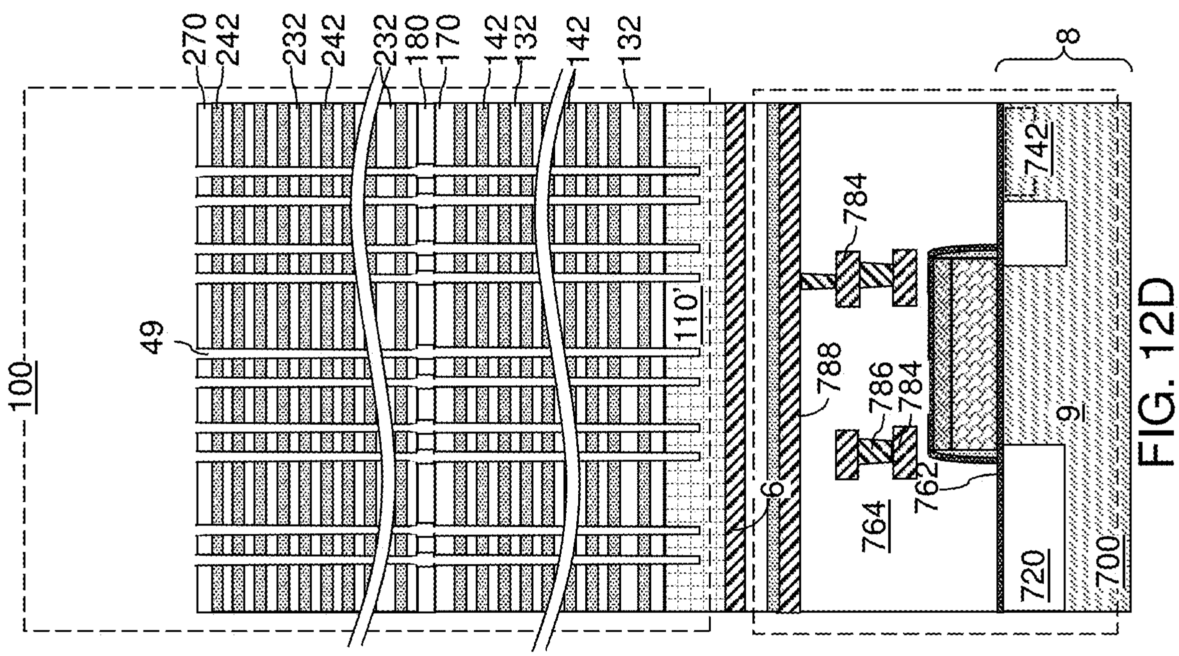
FIG. 12D is a vertical cross-sectional view of the exemplary structure along the vertical plane D-D' of FIG. 12B.
Figure 12C:
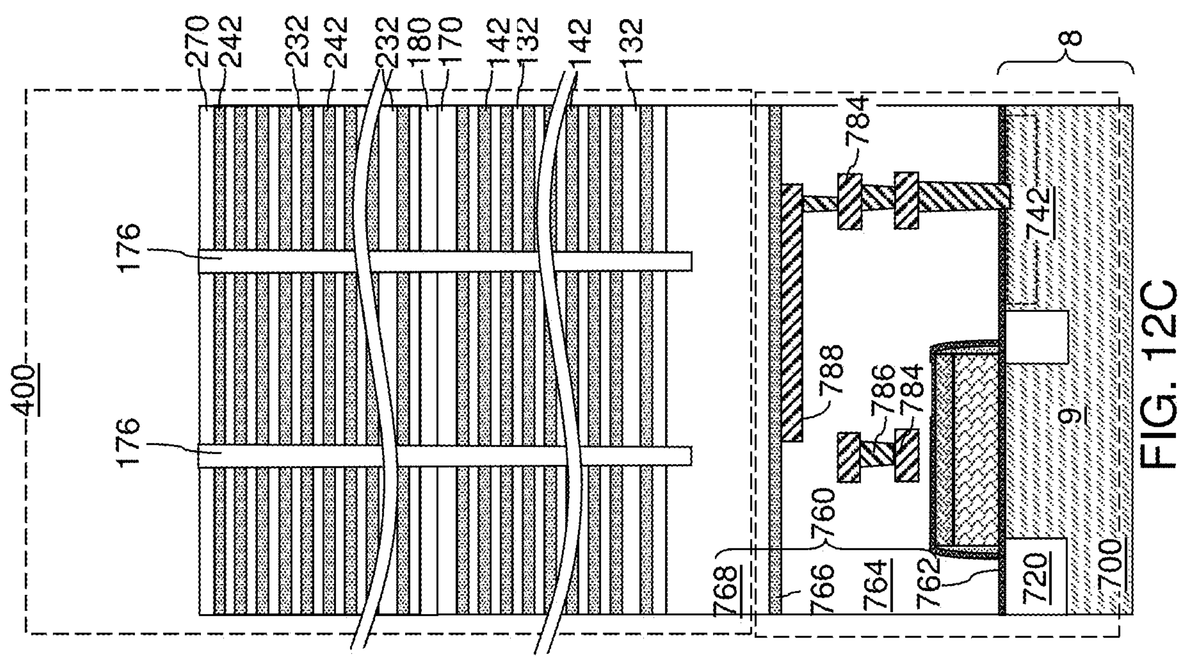
FIG. 12C is a vertical cross-sectional view of the exemplary structure along the vertical plane C-C' of FIG. 12B.
Figure 13B:
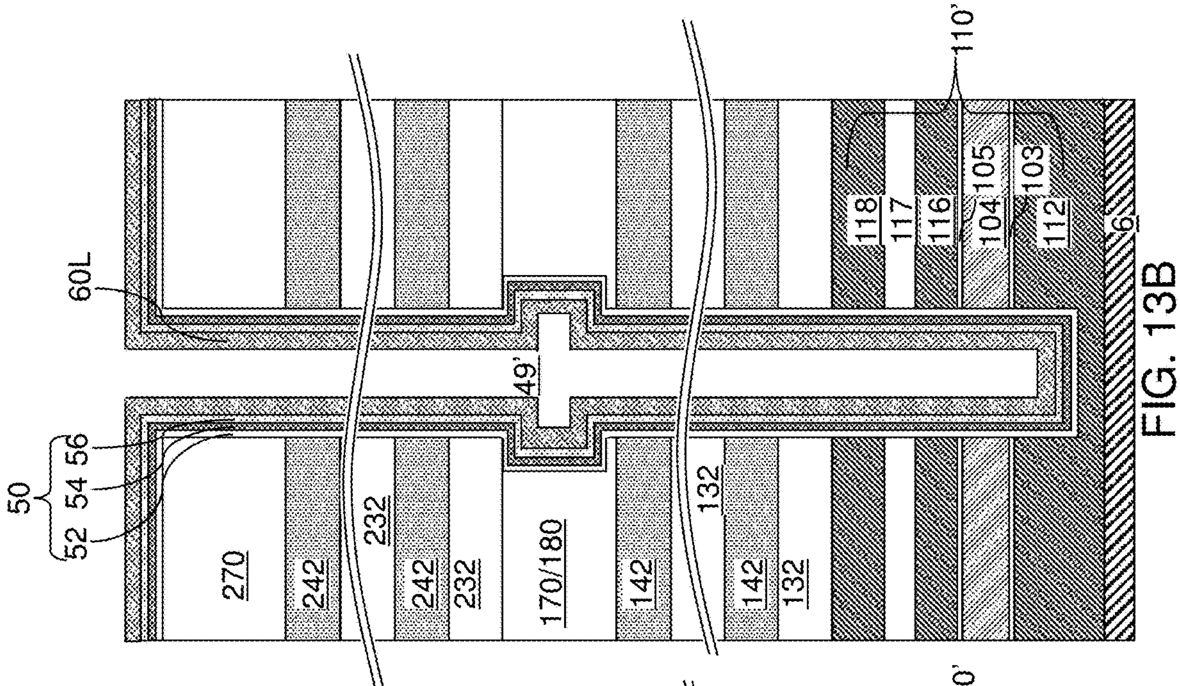
FIGS. 13A-13D illustrate sequential vertical cross-sectional views of a memory opening during formation of a memory opening fill structure according to an embodiment of the present disclosure.
Figure 13A:
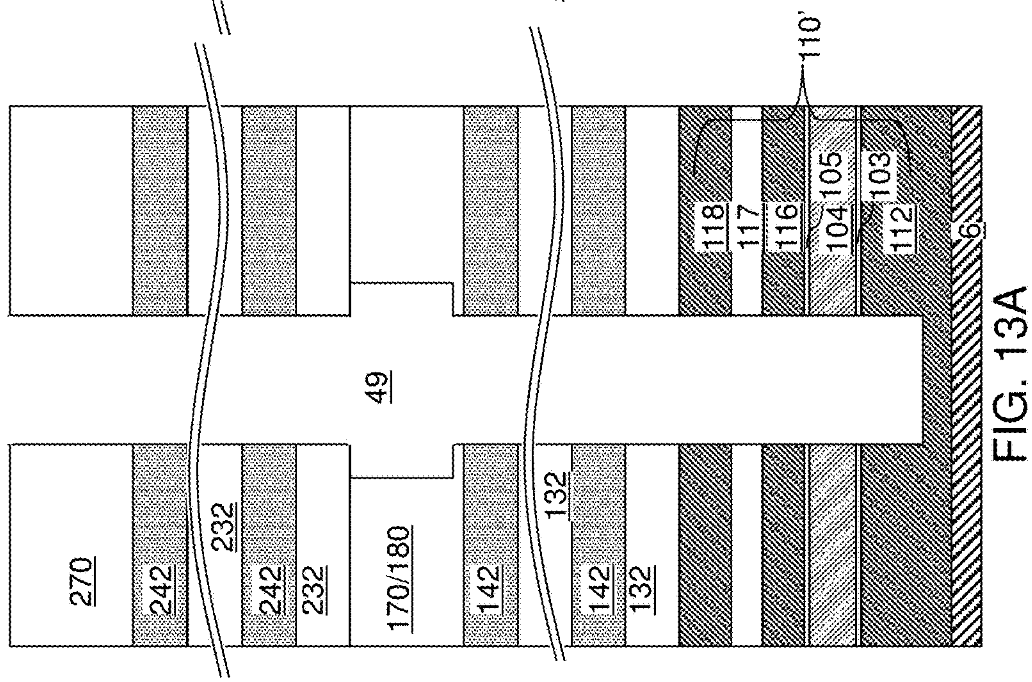

Referring to FIG. 13A, a memory opening 49 in the first exemplary device structure of FIG. 12A is illustrated. The memory opening 49 extends through the first-tier structure and the second-tier structure.

Referring to FIG. 13B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphorus atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figures 13C, 13D:
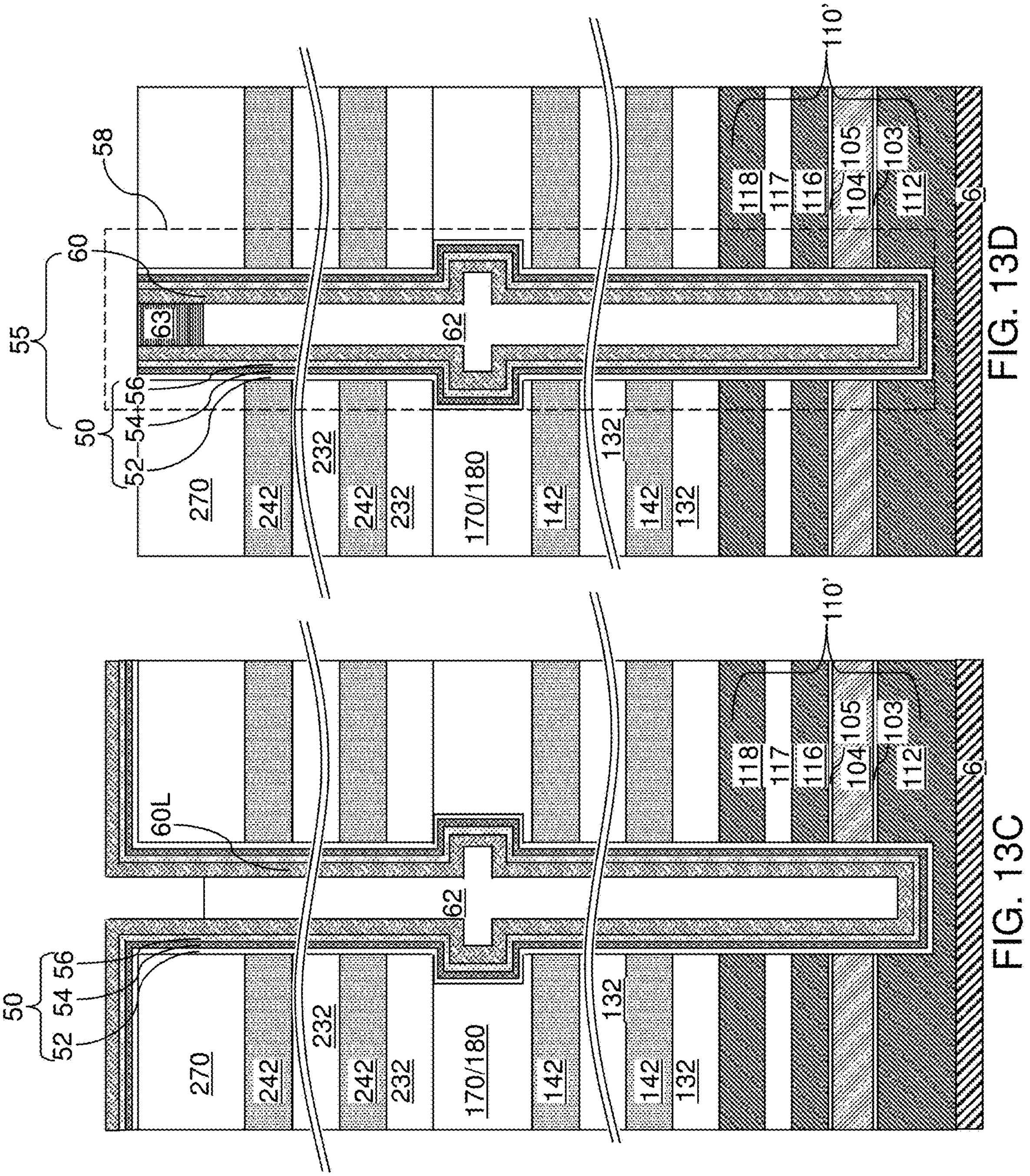
Figure 14A:
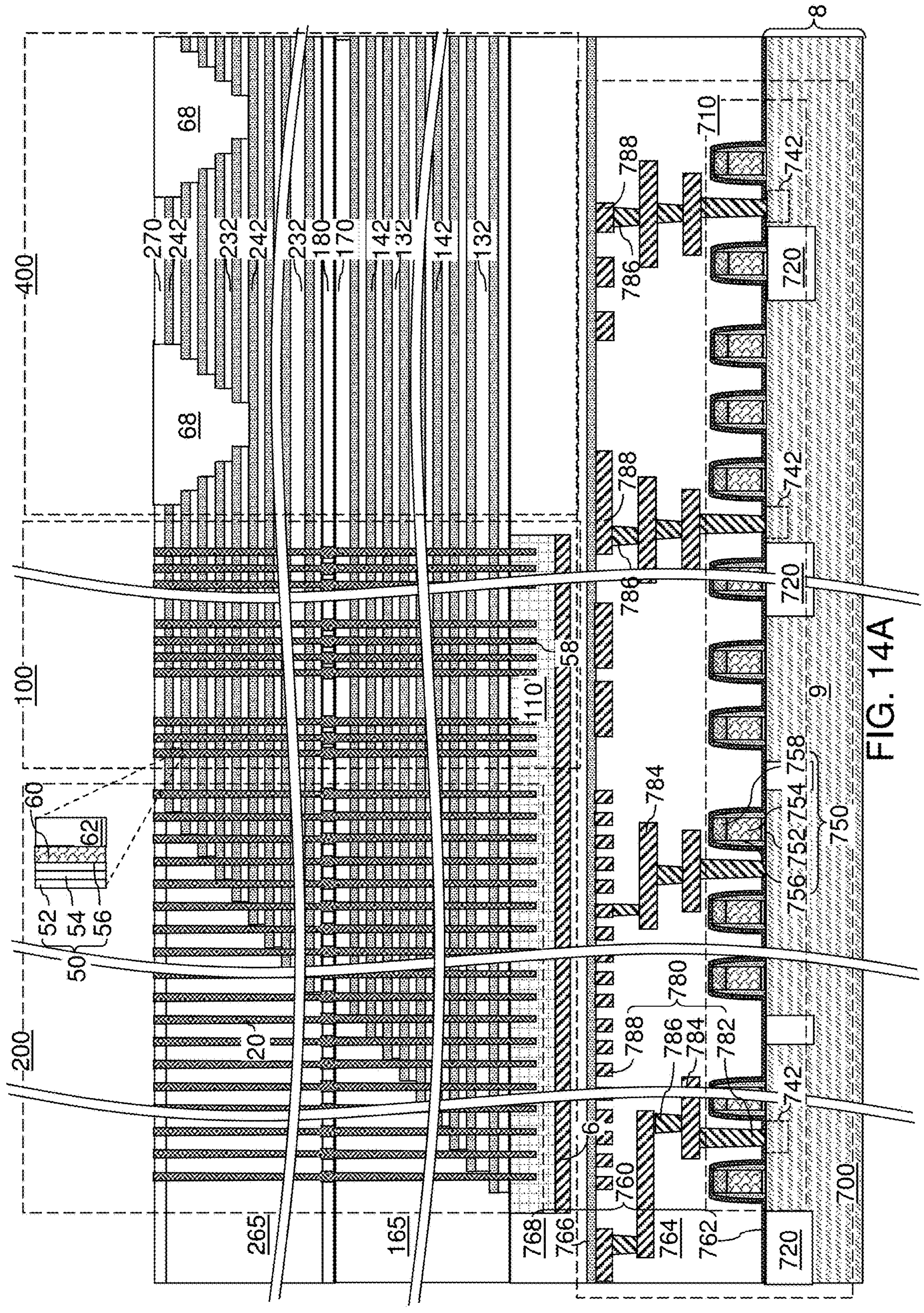
FIG. 14A is a vertical cross-sectional view of the exemplary structure after formation of memory opening fill structures and support pillar structures according to an embodiment of the present disclosure.
Figure 14B:
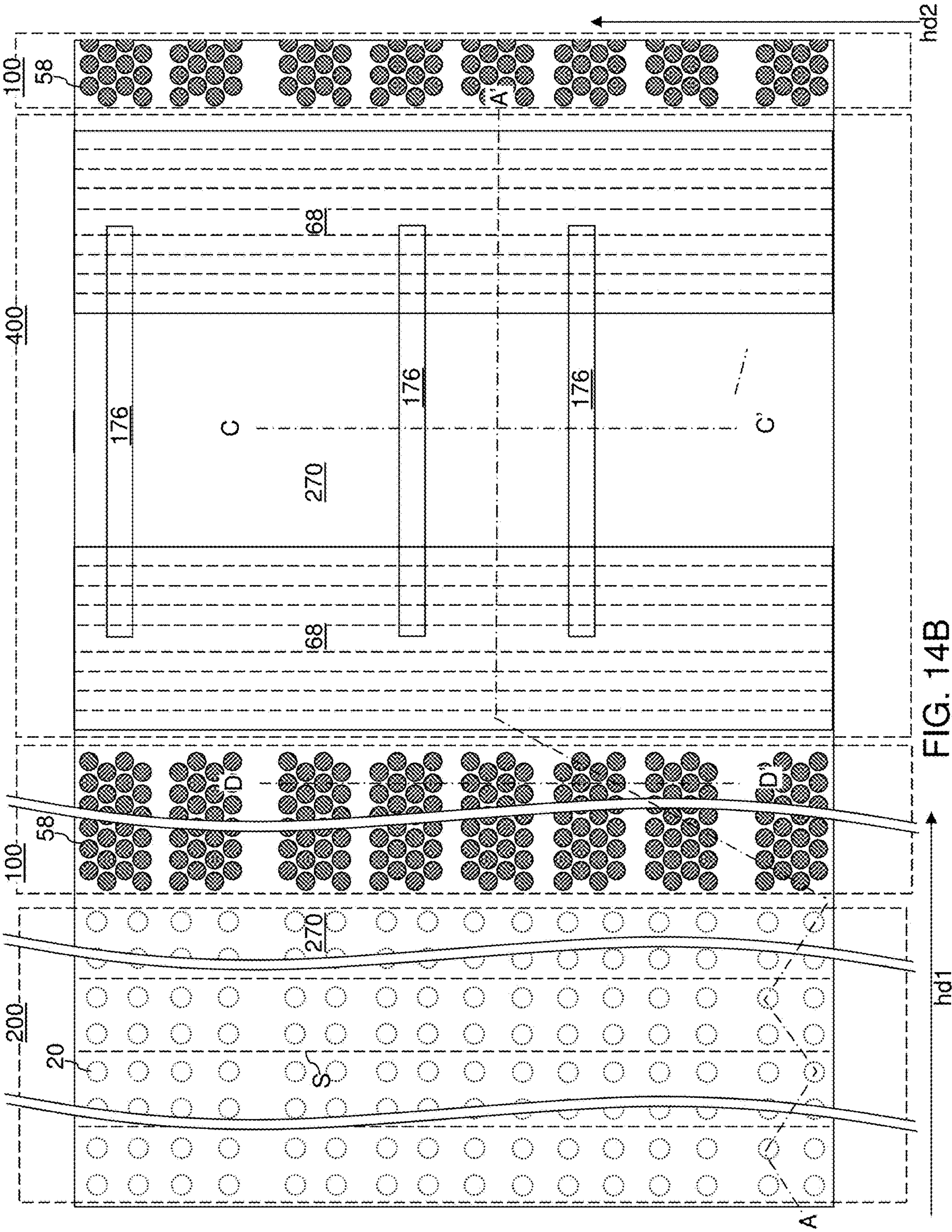
FIG. 14B is a top-down view of the exemplary structure of FIG. 14A. Some covered structures are illustrated in dotted lines. The hinged vertical plane A-A' corresponds to the plane of the vertical cross-sectional view of FIG. 14A.
Figure 14D:
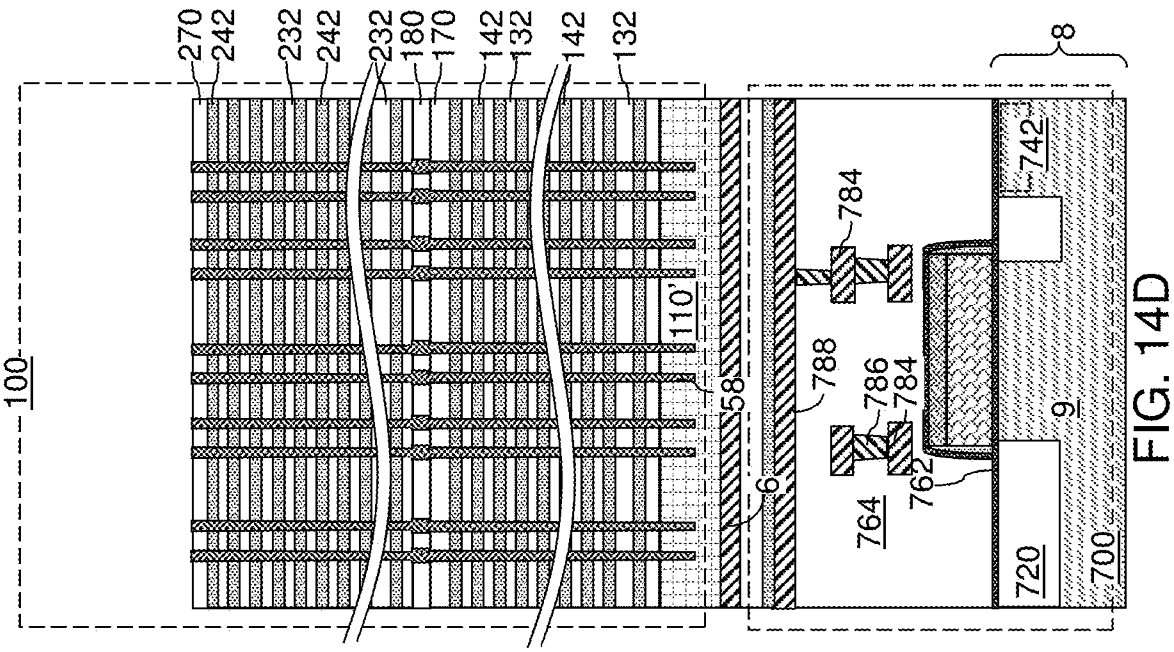
FIG. 14D is a vertical cross-sectional view of the exemplary structure along the vertical plane D-D' of FIG. 14B.
Figure 14C:
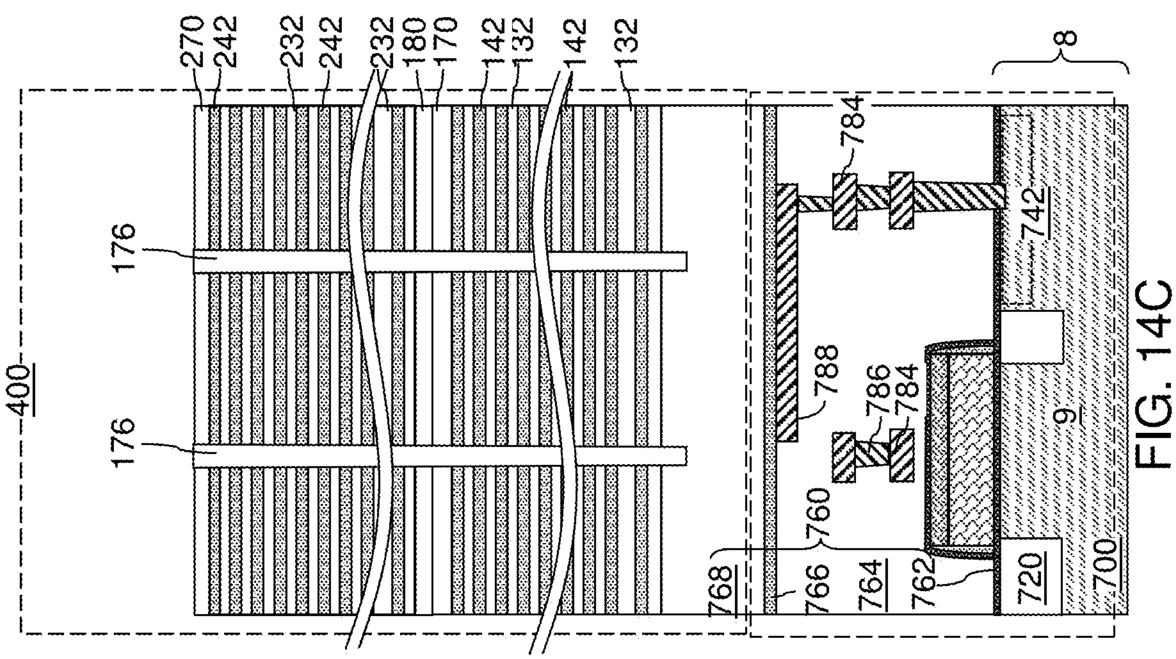
FIG. 14C is a vertical cross-sectional view of the exemplary structure along the vertical plane C-C' of FIG. 14B.

Referring to FIG. 13C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 13D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265), the inter-tier dielectric layer 180, and the memory opening fill structures 58 collectively constitute a memory-level assembly.

Referring to FIGS. 14A-14D, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 15:
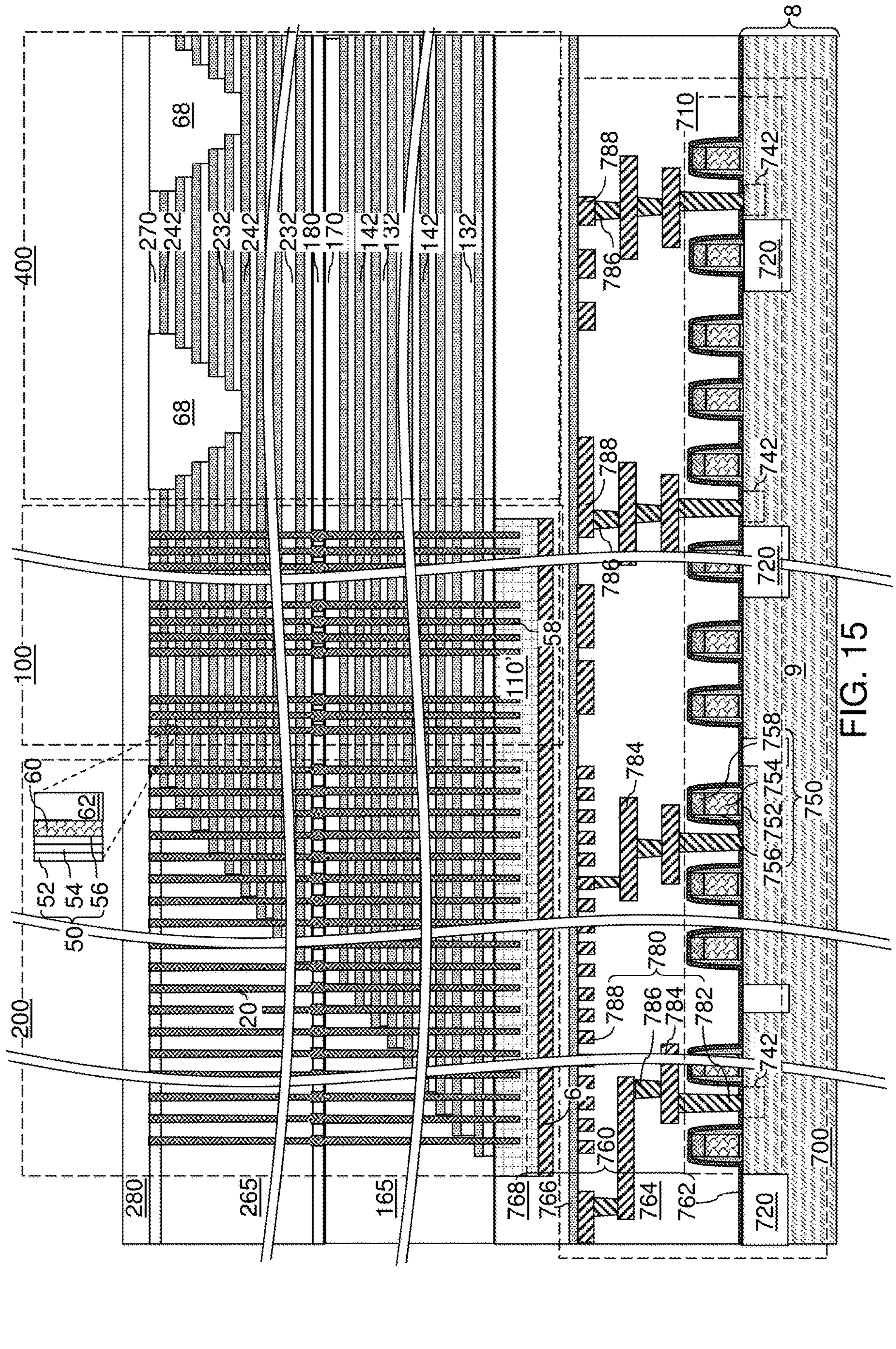
FIG. 15 is a vertical cross-sectional view of the exemplary structure after formation of a contact-level dielectric layer according to an embodiment of the present disclosure.
Figure 16A:
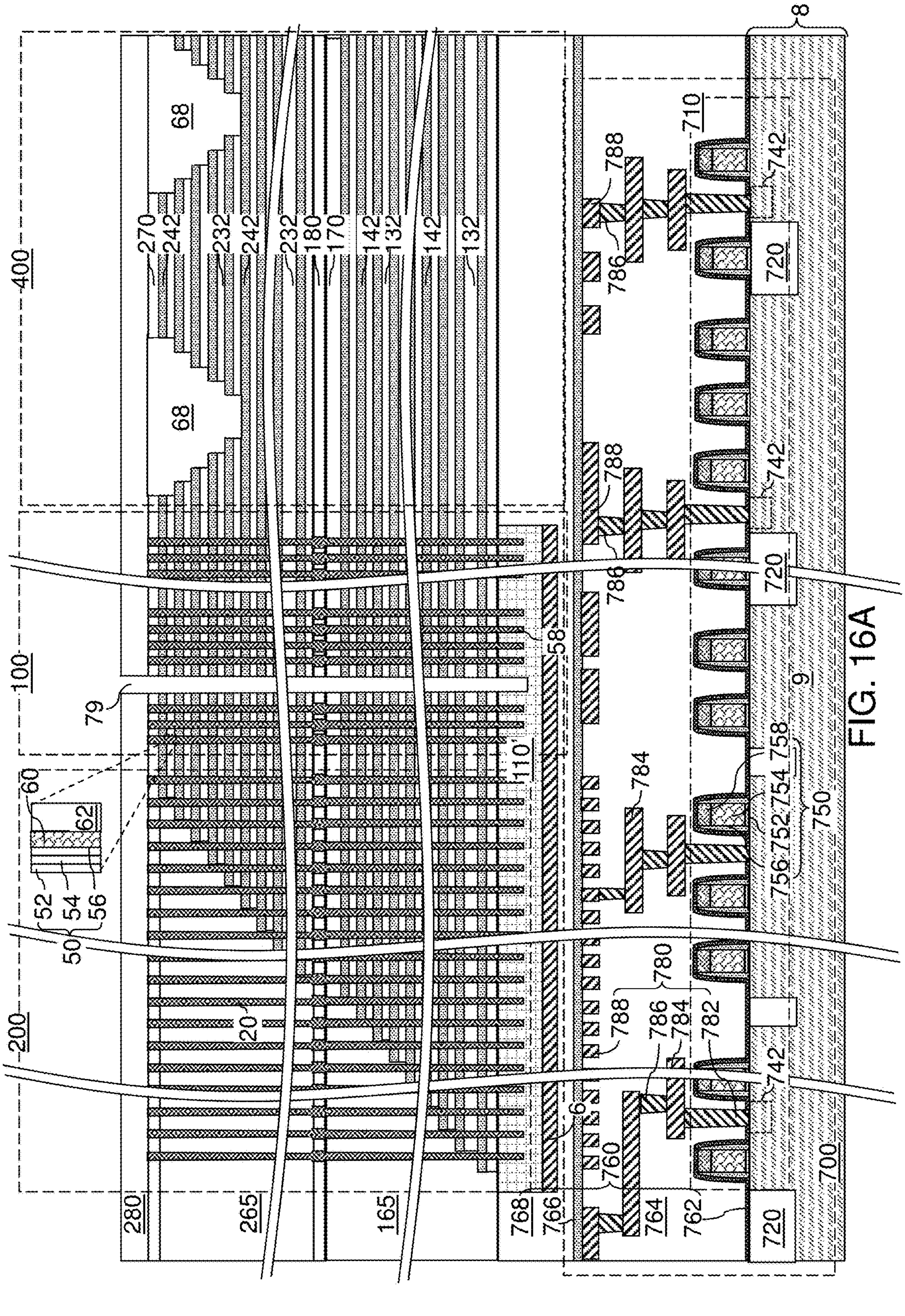
FIG. 16A is a vertical cross-sectional view of the exemplary structure after formation of backside trenches according to an embodiment of the present disclosure.
Figure 16B:
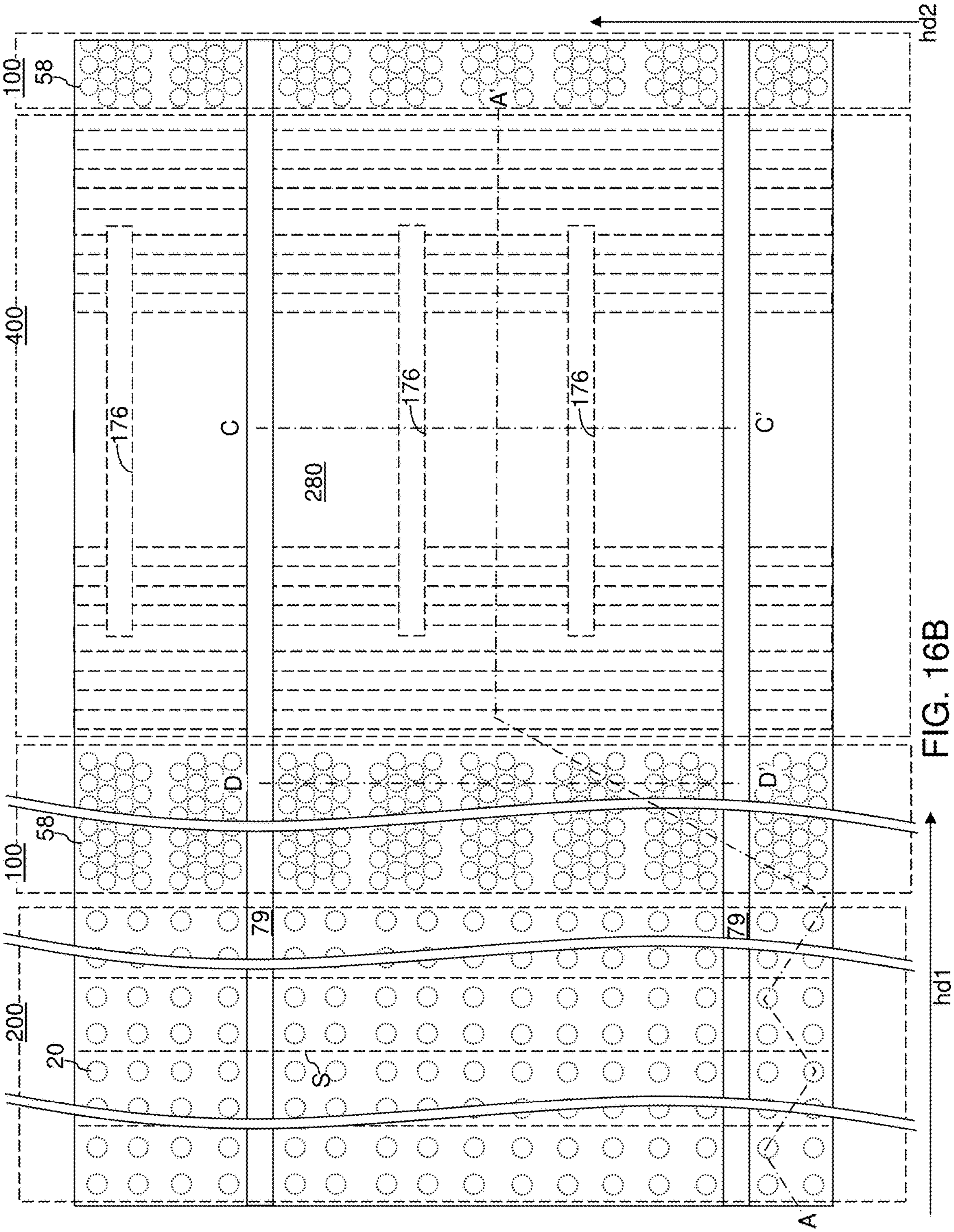
FIG. 16B is a top-down view of the exemplary structure of FIG. 16A. Some covered structures are illustrated in dotted lines. The hinged vertical plane A-A' corresponds to the plane of the vertical cross-sectional view of FIG. 16A.
Figure 16D:
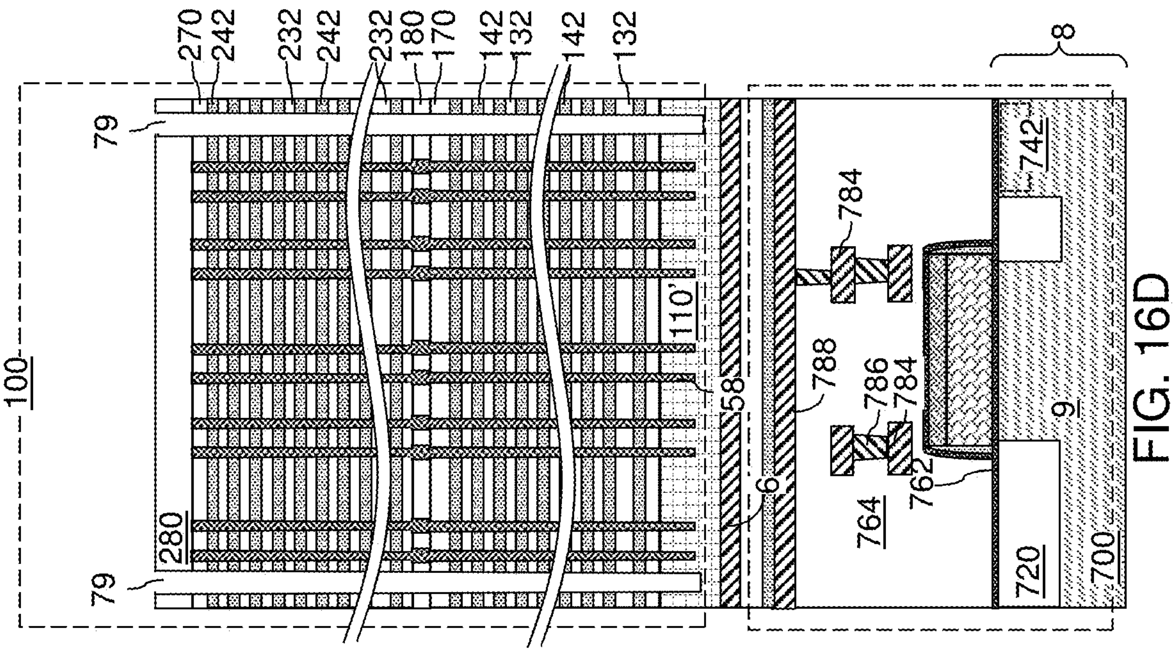
FIG. 16D is a vertical cross-sectional view of the exemplary structure along the vertical plane D-D' of FIG. 16B.
Figure 16C:
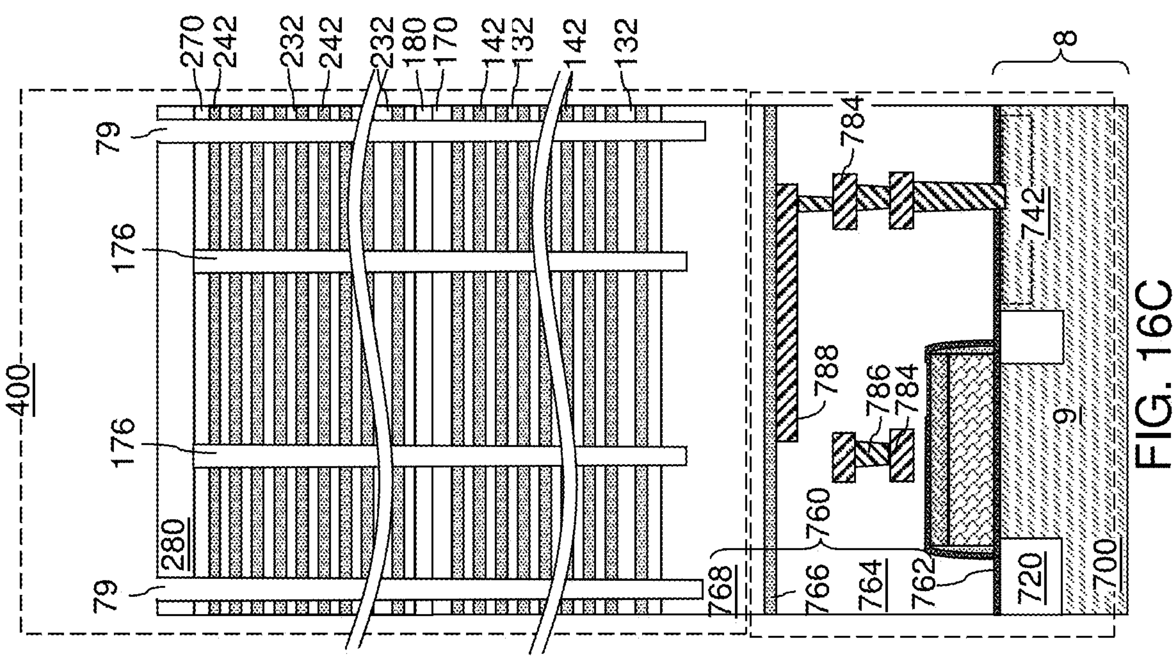
FIG. 16C is a vertical cross-sectional view of the exemplary structure along the vertical plane C-C' of FIG. 16B.

Referring to FIG. 15, a contact-level dielectric layer 280 may be formed over the second-tier structure (232, 242, 270, 265). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

Referring to FIGS. 16A-16D, a photoresist layer may be applied over the contact-level dielectric layer 280 and may be lithographically patterned to form elongated openings that extend along the first horizontal direction hd1 between clusters of memory opening fill structures 58 (e.g., between memory blocks of memory opening fill structures 58). Backside trenches 79 may be formed by transferring the pattern in the photoresist layer (not shown) through the contact-level dielectric layer 280, the second-tier structure (232, 242, 270, 265), and the first-tier structure (132, 142, 170, 165), and into the in-process source-level material layers 110'. Portions of the contact-level dielectric layer 280, the second-tier structure (232, 242, 270, 265), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. Each backside trench 79 may vertically extend through each layer within the vertically alternating sequence of the first insulating layers 132 and the first sacrificial material layers 142 and the vertically alternating sequence of the second insulating layers 232 and the second sacrificial material layers 242. A surface of the at least one second dielectric layer 768 may be physically exposed at the bottom of each backside trench 79 within each connection region 400. The source-level sacrificial layer 104 may be employed as an etch stop layer for the anisotropic etch process that etches the backside trenches 79. In this case, a top surface of the source-level sacrificial layer 104 may be physically exposed at the bottom of each backside trench 79 in each memory array region 100.

The vertically alternating sequence of the first insulating layers 132 and the first sacrificial material layers 142 is divided into first-tier alternating stacks of patterned portions of the first insulating layers 132 and patterned portions of the first sacrificial material layers 142 by the backside trenches 79. The vertically alternating sequence of the second insulating layers 232 and the second sacrificial material layers 242 is divided into second-tier alternating stacks of patterned portions of the second insulating layers 232 and patterned portions of the second sacrificial material layers 242 by the backside trenches 79. Each patterned portion of the first insulating layers 132 is hereafter referred to as a first insulating layer 132. Each patterned portion of the first sacrificial material layers 142 is hereafter referred to as a first sacrificial material layer 142. Each patterned portion of the second insulating layers 232 is hereafter referred to as a second insulating layer 232. Each patterned portion of the second sacrificial material layers 242 is hereafter referred to as a second sacrificial material layer 242. A vertical stack of a first-tier alternating stack (132, 142) and a second-tier alternating stack (232, 242) is provided between a neighboring pair of backside trenches 79. Each vertical stack of a first-tier alternating stack (132, 142) and a second-tier alternating stack (232, 242) between a neighboring pair of backside trenches is herein referred to as an alternating stack {(132, 142), (232, 242)}. The alternating stacks {(132, 142), (232, 242)} separated by the backside trenches 79 may correspond to respective memory blocks, and may be numbered, for example, as first alternating stack {(132, 142), (232, 242)}, a second alternating stack {(132, 142), (232, 242)}, a third alternating stack {(132, 142), (232, 242)}, etc.

According to an aspect of the present disclosure, a pair of dielectric wall structures 176 may be provided within each alternating stack {(132, 142), (232, 242)}. Each dielectric wall structure 176 may be laterally spaced from a most proximal one of the backside trenches 79 by a respective spacing, such as a respective uniform spacing that is invariant along the first horizontal direction hd1. Generally, backside trenches 79 laterally extending along the first horizontal direction hd1 may be formed through a vertically alternating sequence of insulating layers (132, 232) and sacrificial material layers (142, 242). The vertically alternating sequence {(132, 142}, (232, 242)} is divided into multiple alternating stacks {(132, 142}, (232, 242)}, one of which is a first alternating stack {(132, 142}, (232, 242)}. The dielectric wall structures 176 may include a first dielectric wall structure 176 and a second dielectric wall structure 176 that are located in the first alternating stack (e.g., in the same first memory block) and are spaced apart along a second horizontal direction hd2. Each of the first dielectric wall structure 176 and the second dielectric wall structure 176 may vertically extend from a topmost layer within the first alternating stack {(132, 142}, (232, 242)} to a bottommost layer within the first alternating stack {(132, 142}, (232, 242)}. Each of the first dielectric wall structure 176 and the second dielectric wall structure 176 may have a respective pair of lengthwise sidewalls that are parallel to the first horizontal direction hd1. The region between the first dielectric wall structures 176 and the second dielectric wall structure 176 is subsequently used to form through-memory-level metal via structures therethrough.

Figure 17:
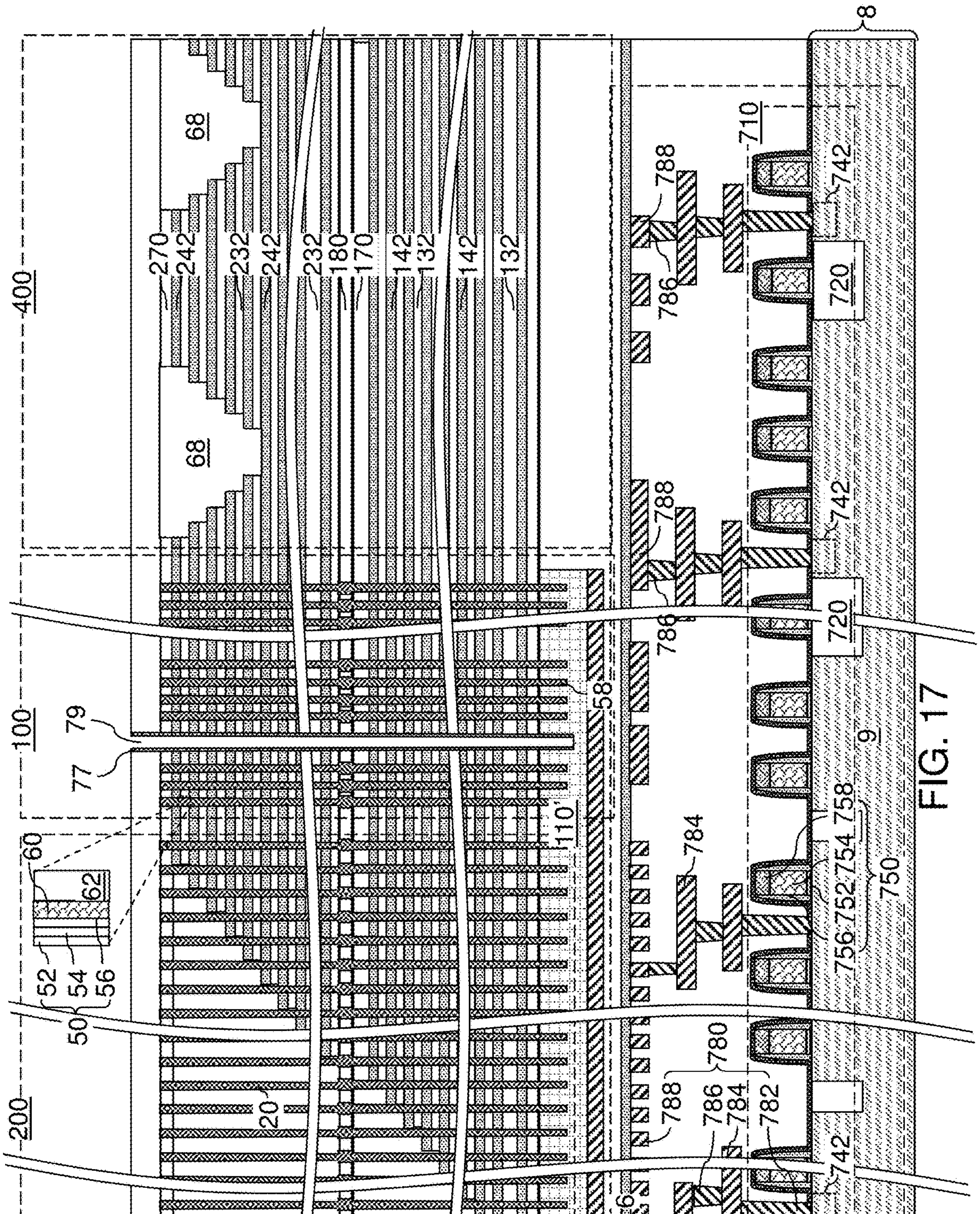
FIG. 17 is a vertical cross-sectional view of the exemplary structure after formation of backside trench spacers according to an embodiment of the present disclosure.
Figure 18A:
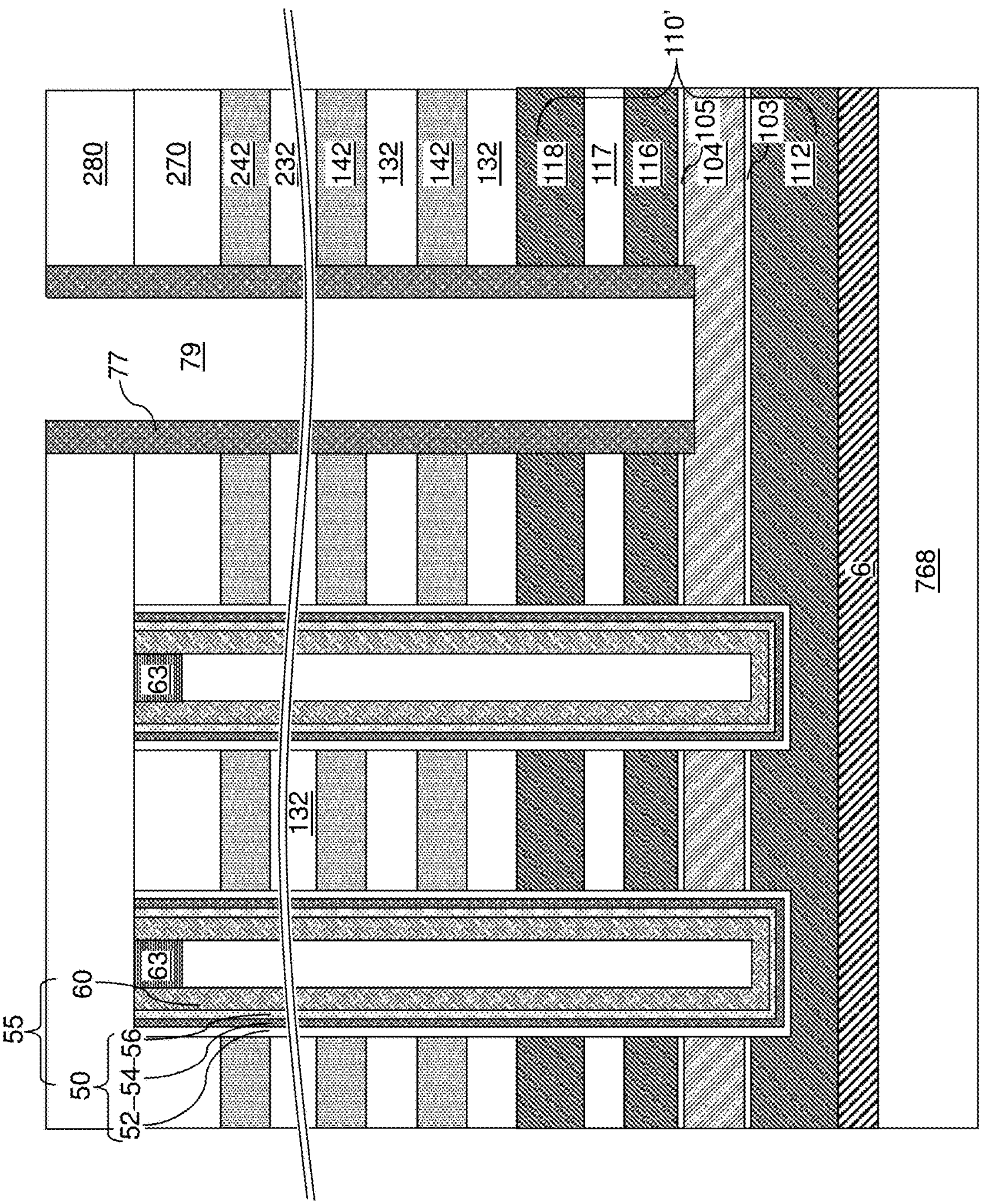
FIGS. 18A-18E illustrate sequential vertical cross-sectional views of memory opening fill structures and a backside trench during formation of source-level material layers according to an embodiment of the present disclosure.

Referring to FIGS. 17 and 18A, a backside trench spacer 77 may be formed on sidewalls of each backside trench 79. For example, a conformal sacrificial material layer may be deposited in the backside trenches 79 and over the contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 18B:
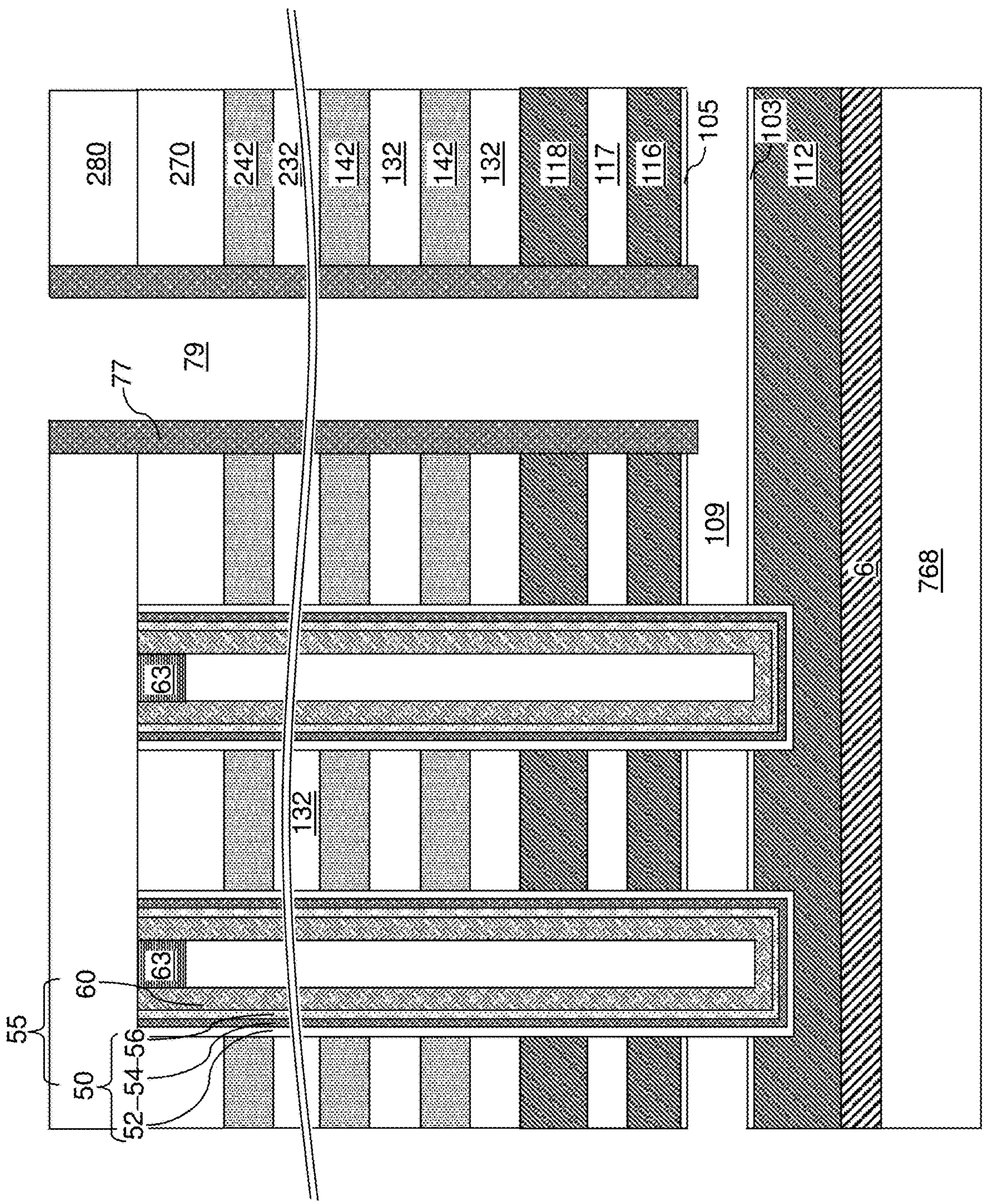

Referring to FIG. 18B, an etchant that etches the material of the source-level sacrificial layer 104 selective to the materials of the first alternating stack (132, 142), the second alternating stack (232, 242), the first and second insulating cap layers (170, 270), the contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selectively etch undoped silicon source-level sacrificial layer 104 selectively to doped silicon upper source-level semiconductor layer 116 and lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 18C:
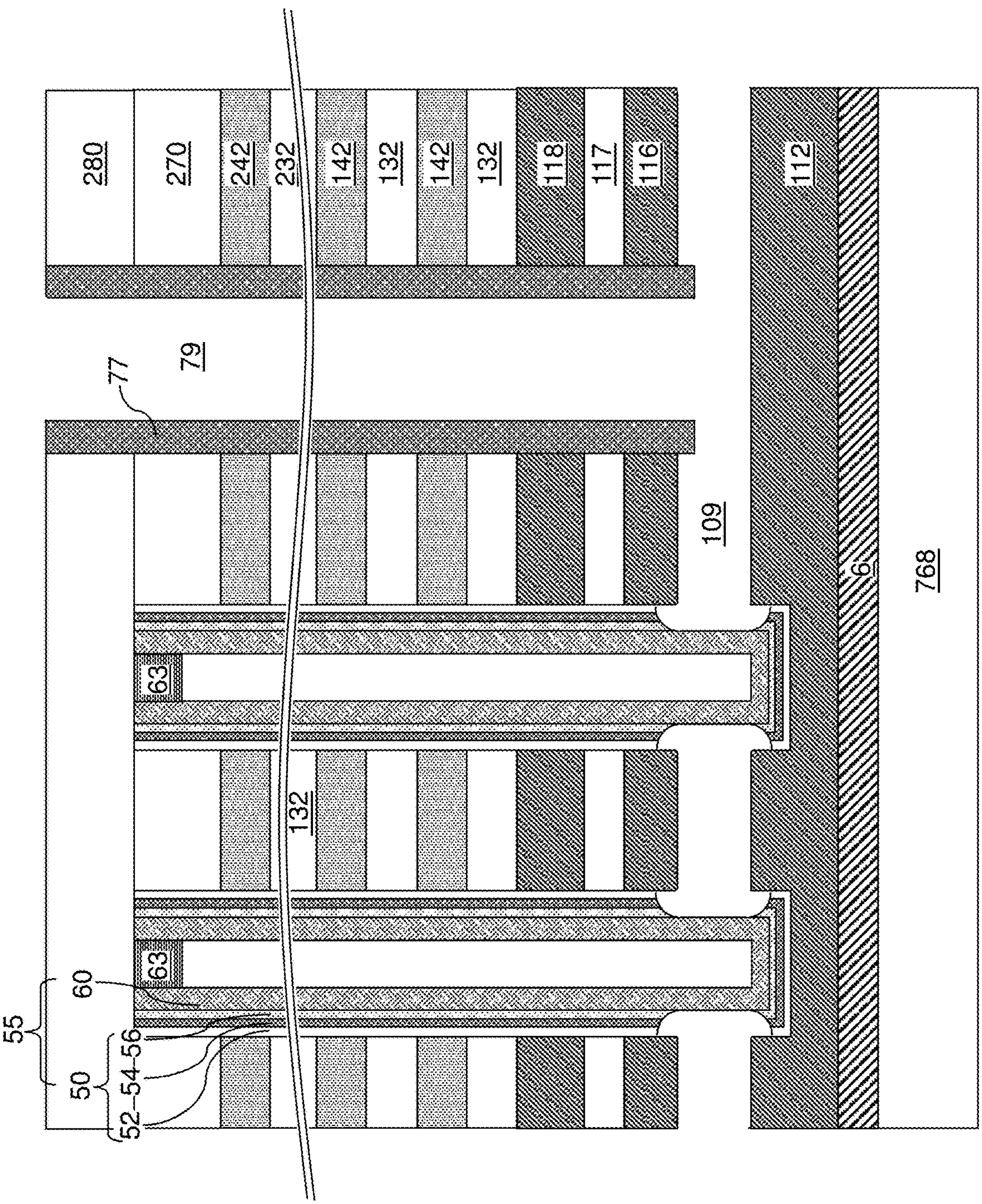

Referring to FIG. 18C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 18D:
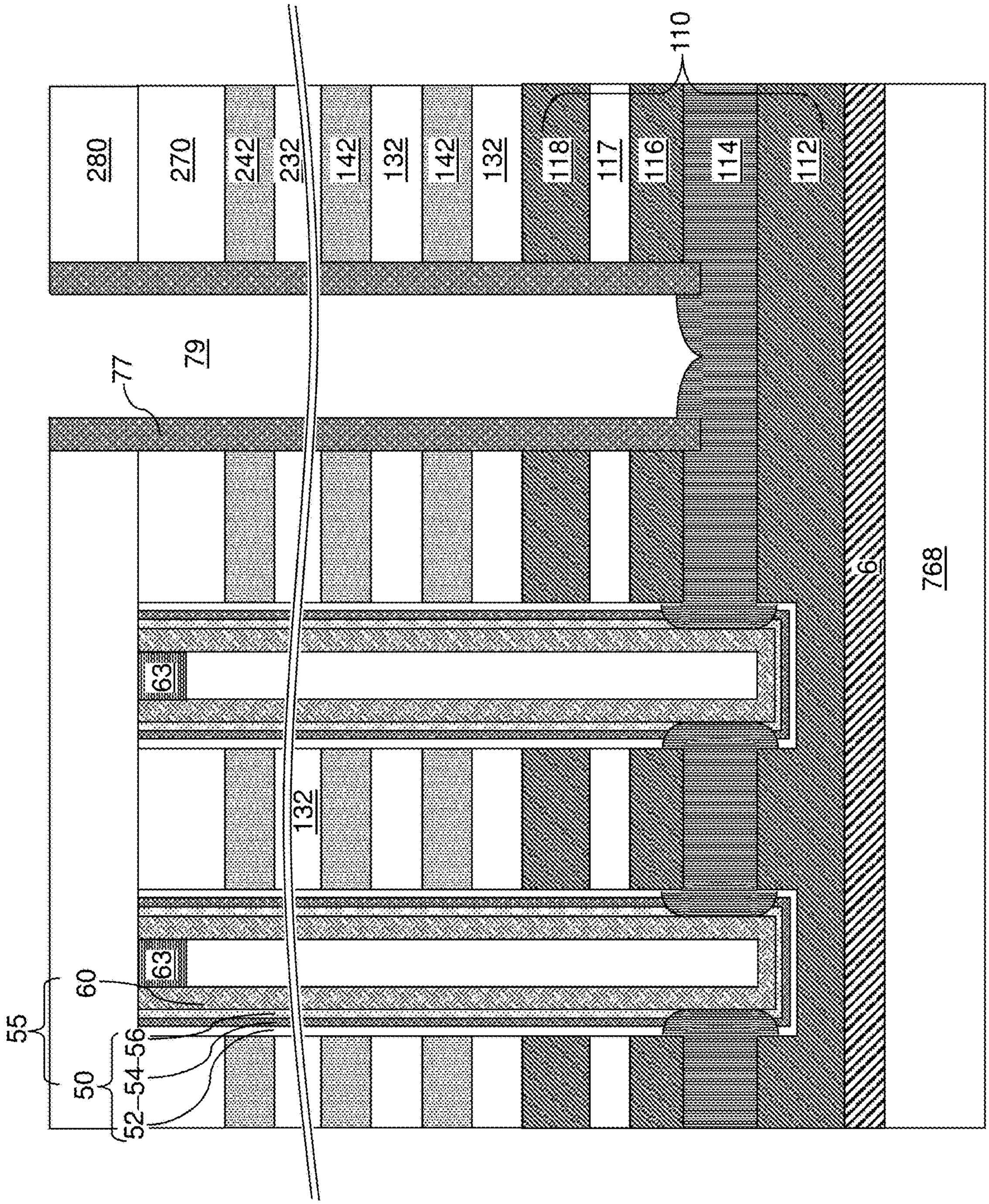

Referring to FIG. 18D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 18E:
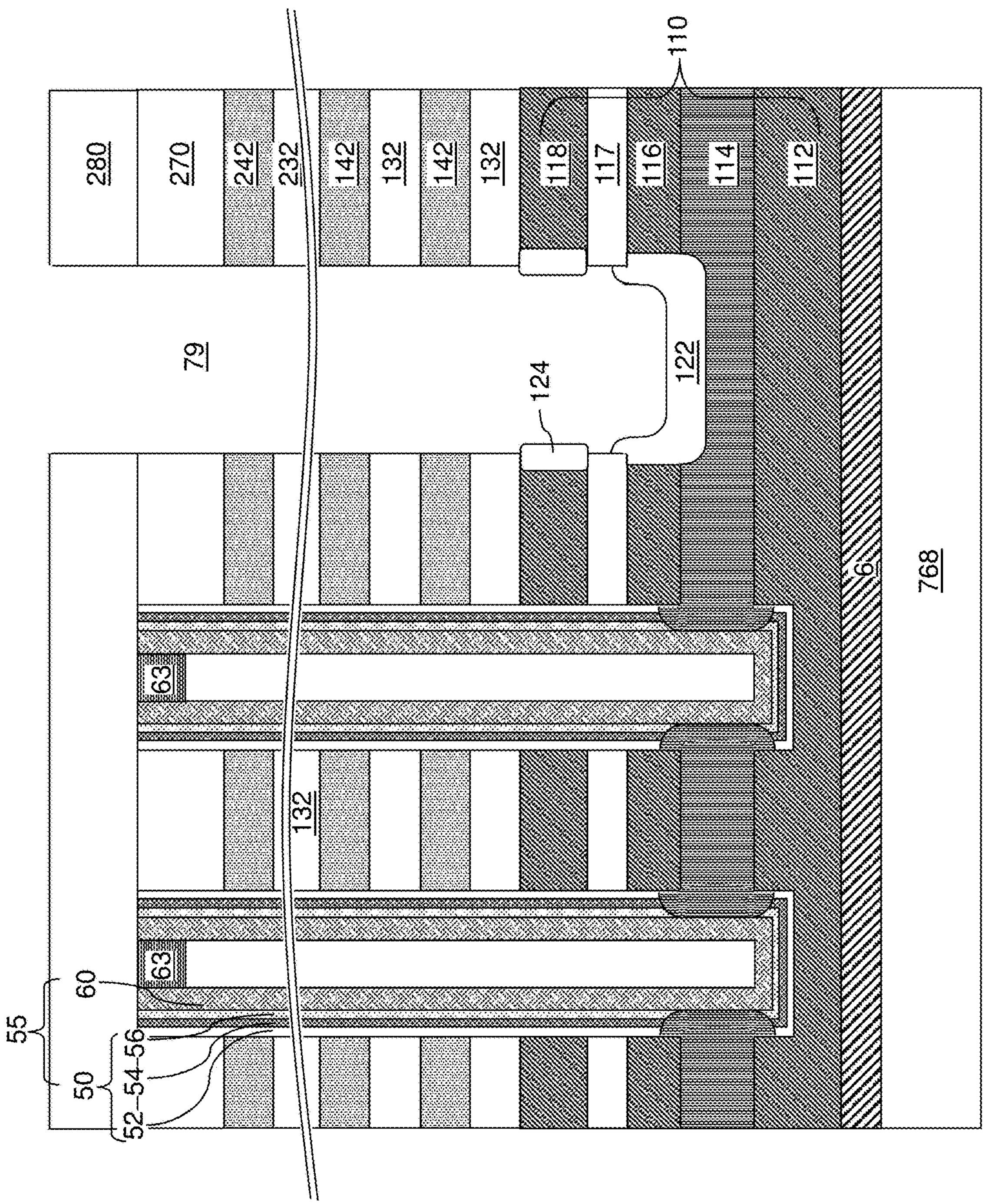

Referring to FIG. 18E, the backside trench spacers 77 may be removed selective to the insulating layers (132, 232), the first and second insulating cap layers (170, 270), the contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Referring to FIGS. 19A-19D, the sacrificial material layers (142, 242) may be removed selective to the insulating layers (132, 232), the first and second insulating cap layers (170, 270), the contact-level dielectric layer 280, the dielectric wall structures 176, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), the dielectric wall structures 176, and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

The duration of the isotropic etch process may be selected such that the sacrificial material layers (142, 242) located between adjacent dielectric wall structures 176 in the same alternating stack (e.g., in the same memory block) are not removed. For example, the etch distance (i.e., the distance by which surfaces of the sacrificial material layers (142, 242) are laterally recessed) is greater than one half of the lateral separation distance along the second horizontal direction hd2 between each neighboring pair of backside trenches 79, and is less than the sum of the lateral separation distance between a distal lengthwise sidewall of a dielectric wall structure 176 and a most proximal one of the backside trenches 79 and one half of the lateral dimension of each dielectric wall structure 176 along the first horizontal direction hd1. The distal lengthwise sidewall of the dielectric wall structure 176 refers to the lengthwise sidewall of the dielectric wall structure 176 that is more distal from the most proximal one of the backside trenches 79 of the two lengthwise sidewalls of the dielectric wall structure 176 that laterally extend along the first horizontal direction hd1. The dielectric wall structures 176 function as barrier structures that block the flow of the isotropic etchant to the sacrificial material layers.

First portions of the sacrificial material layers (142, 242) (which are patterned portions of the continuous sacrificial material layers (142, 242) as originally provided in the vertically alternating sequences of the continuous insulating layers (132, 232) and the continuous sacrificial material layers (142, 242)) located within the etch distance from the backside trenches 79 along paths that the isotropic etchant may flow are removed by the isotropic etch process to form laterally-extending cavities, which are herein referred to as backside recesses (143, 243). Thus, the backside recesses (143, 243) are formed in volumes from which the first portions of the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Second portions of the sacrificial material layers (142, 242) that are located between the dielectric wall cavities 176 in each alternating stack (i.e., at a greater distance than the etch distance from the backside trenches 79 along paths that the isotropic etchant may flow) are not etched by the isotropic etch process. In other words, the isotropic etch process is terminated when the etch distance of the isotropic etch process reaches a target etch distance. The second portions of the sacrificial material layers (142, 242) may remain between a respective pair of dielectric wall structures 176 within each alternating stack {(132, 142), (232, 242)} (e.g., within each memory block). In one embodiment, the sacrificial material layers (142, 242) may include a dielectric material such as silicon nitride, and the second portions of the sacrificial material layers (142, 242) that remain unetched after the isotropic etch process may constitute vertical stacks of dielectric plates (144, 244). The dielectric plates (144, 244) include first dielectric plates 144 that are remaining portions of the first sacrificial material layers 142 and second dielectric plates 244 that are remaining portions of the second sacrificial material layers 242.

Figure 19A:
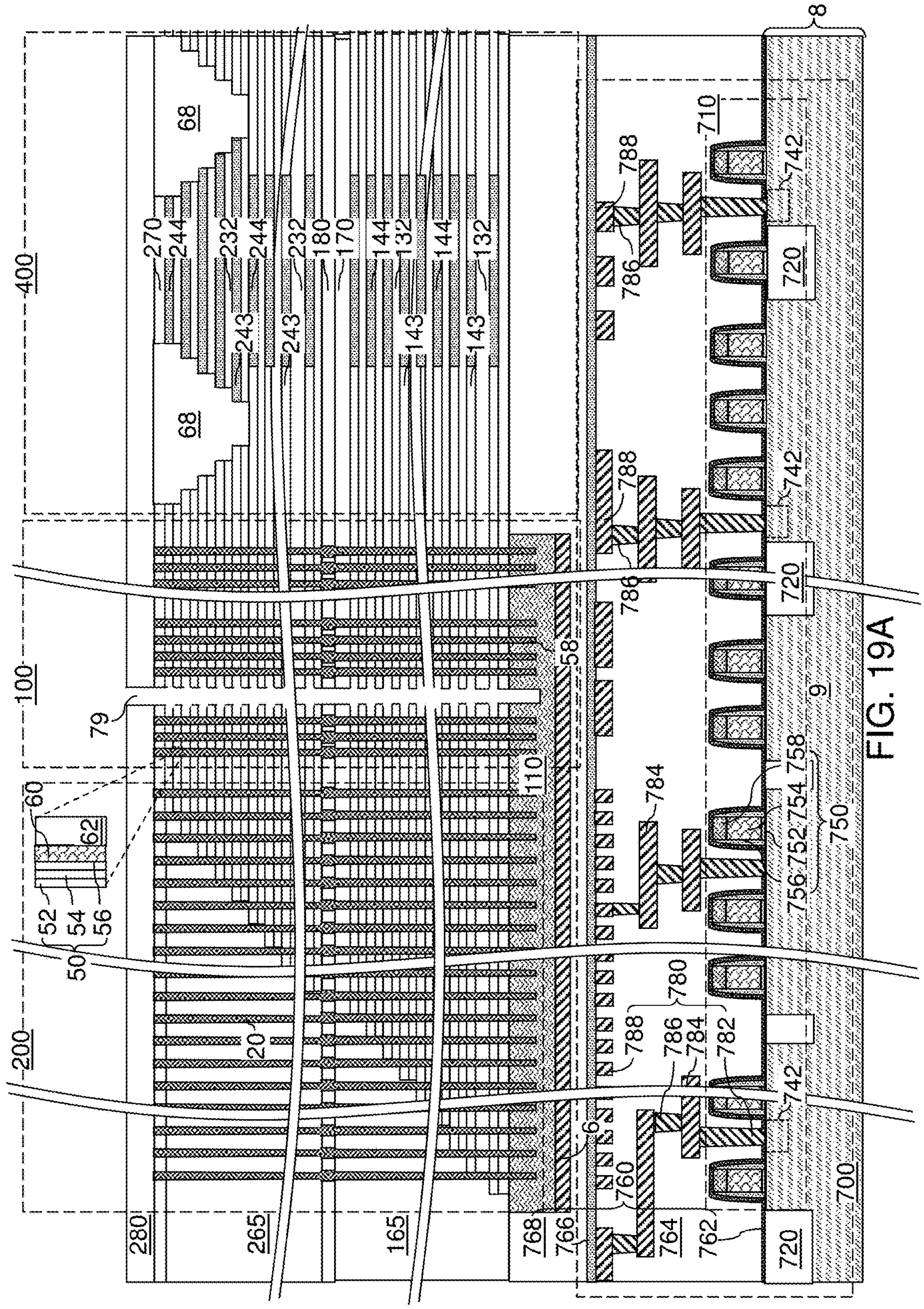
FIG. 19A is a vertical cross-sectional view of the exemplary structure after formation of backside recesses according to an embodiment of the present disclosure.
Figure 19B:
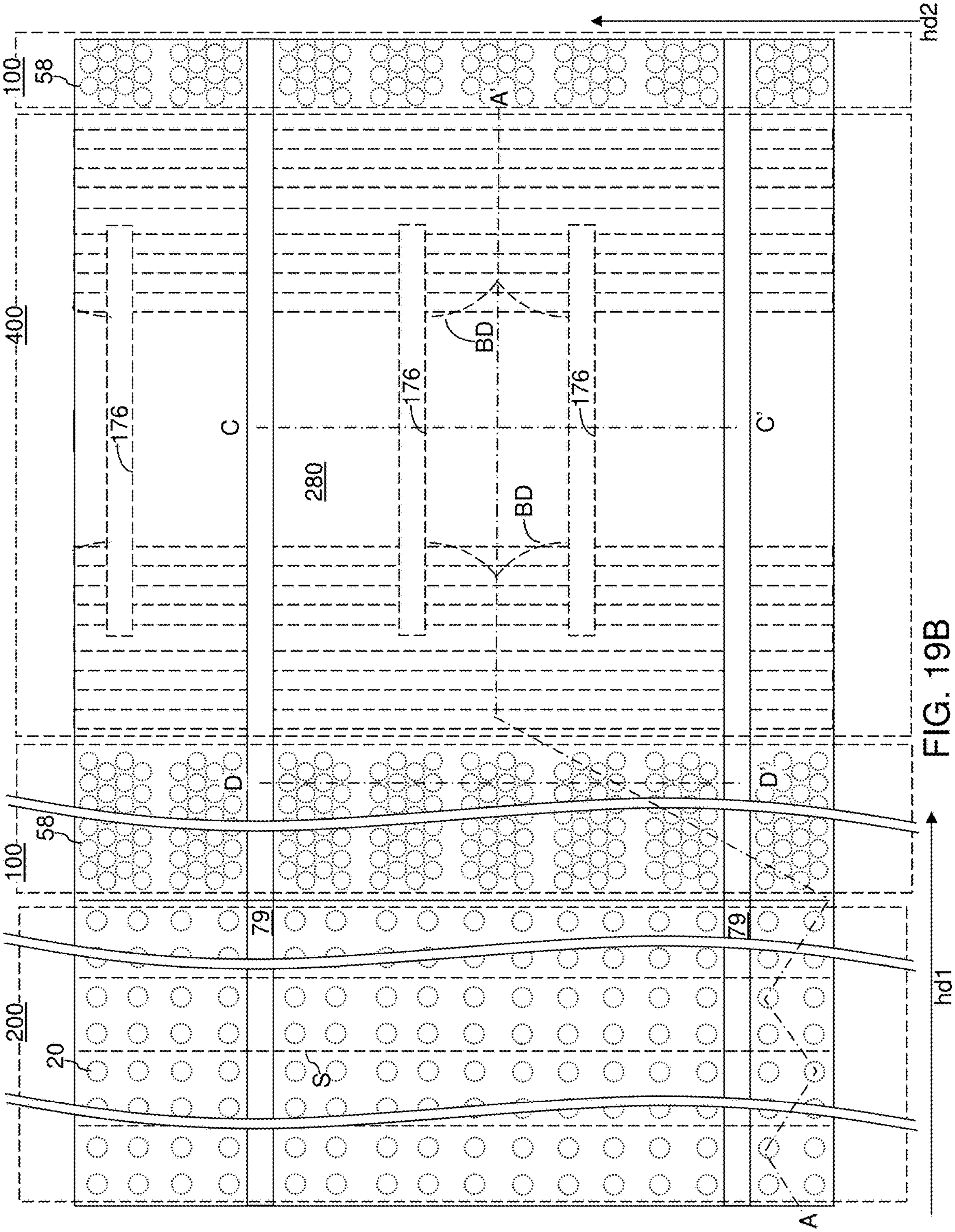
FIG. 19B is a top-down view of the exemplary structure of FIG. 19A. Some covered structures are illustrated in dotted lines. The hinged vertical plane A-A' corresponds to the plane of the vertical cross-sectional view of FIG. 19A.
Figure 19D:
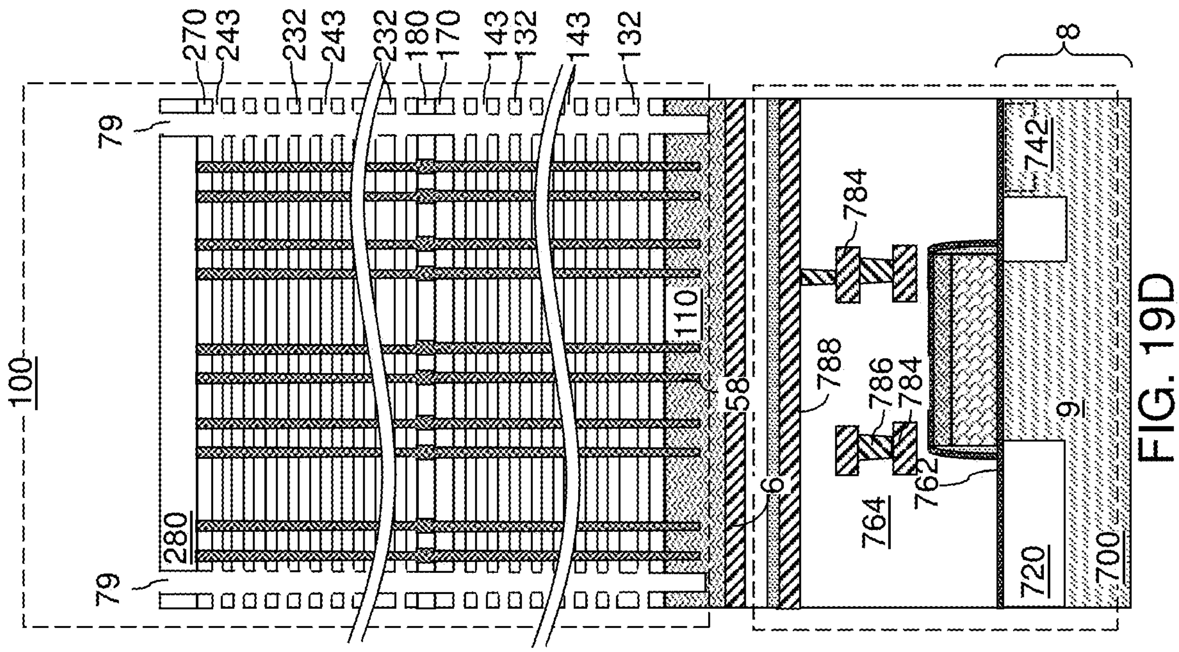
FIG. 19D is a vertical cross-sectional view of the exemplary structure along the vertical plane D-D' of FIG. 19B.
Figure 19C:
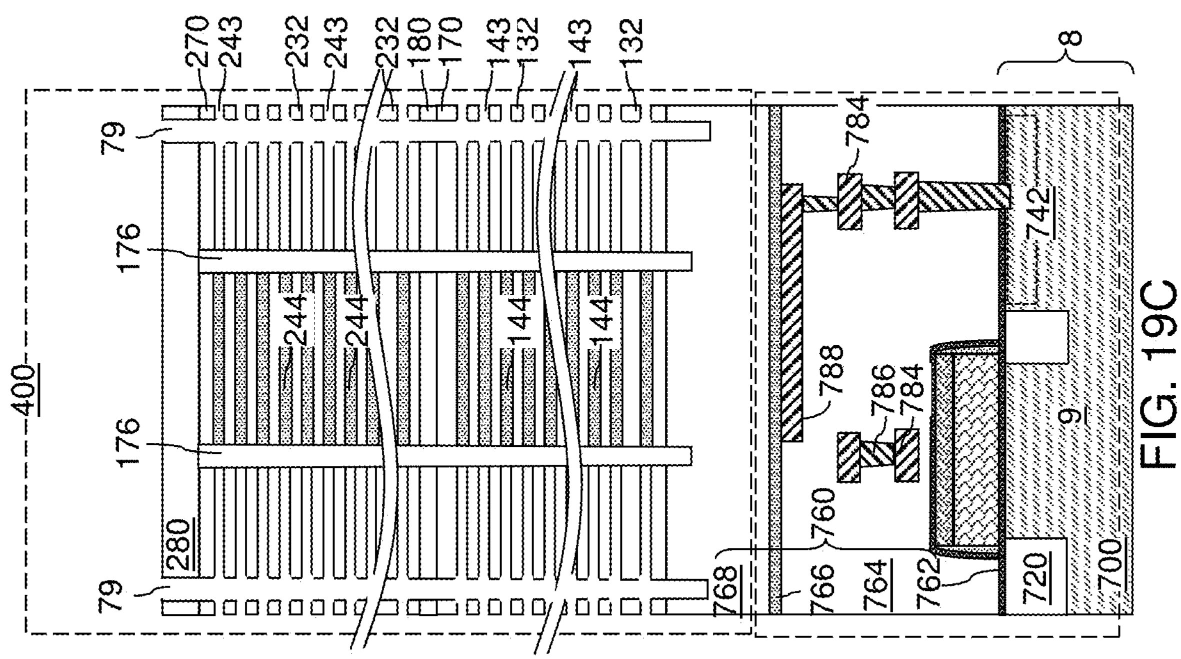
FIG. 19C is a vertical cross-sectional view of the exemplary structure along the vertical plane C-C' of FIG. 19B.

As shown in FIG. 19B, the boundary BD between the backside recesses (143, 243) and the dielectric plates (144, 244) located underneath the horizontal plane including the bottom surfaces of the dielectric rail structures 68 may have curved vertical surfaces. For example, each dielectric plate (144, 244) located underneath the horizontal plane including the bottom surfaces of the dielectric rail structures 68 may have four concave vertical sidewalls that coincide with four convex sidewalls of a respective one of the backside recesses (143, 243). In one embodiment, each dielectric plate (144, 244) located underneath the horizontal plane including the bottom surfaces of the dielectric rail structures 68 may be laterally bounded by a pair of boundaries BD along the first horizontal direction hd1 and by a pair of distal lengthwise sidewalls of two dielectric wall structures 176. Portions of the second sacrificial material layers 242 that are laterally encapsulated by the dielectric wall structures 176 and the dielectric rail structures 68 are protected from the isotropic etch process, and constitute additional dielectric plates 244. The additional dielectric plates 244 that contact, and are laterally encapsulated by, the dielectric wall structures 176 and the dielectric rail structures 68 may have a respective rectangular horizontal cross-sectional shape.

For example, a vertical stack of dielectric plates (144, 244) may be located between a first dielectric wall structure 176 and a second dielectric wall structure 176 that are located between a neighboring pair of backside trenches 79. The dielectric plates (144, 244) within the vertical stack of dielectric plates (144, 244) may be vertically spaced apart from each other by portions of the insulating layers (132, 232) located in the connection region 400. In one embodiment, each dielectric plate (144, 244) within the vertical stack of dielectric plates (144, 244) may have a lateral extend along the first horizontal direction hd1 that is less than the length of the first dielectric wall structure 176 along the first horizontal direction hd1, and is less than the length of the second dielectric wall structure 176 along the first horizontal direction hd1.

In one embodiment, the first dielectric wall structure 176 and the second dielectric wall structure 176 may be symmetric with respect to a vertical plane passing through a midpoint between a neighboring pair of backside trenches 79. Once the etch front of the isotropic etch process reaches the vertical edges of the proximal lengthwise sidewalls of the dielectric wall structures 176, the etch front of the isotropic etch process proceeds isotropically from the vertical edges of the proximal lengthwise sidewalls of the dielectric wall structures 176. The radius of curvature of the etch front may be the same as the lateral distance from the vertical edges of the proximal lengthwise sidewalls of the dielectric wall structures 176. When the radius of curvature of the etch front equals one half of the separation distance between the pair of dielectric wall structures 176, the two etch fronts meet to form backside recesses (143, 243) that continuously extend from one of the neighboring pair of backside trenches 79 to the other of the neighboring pair of backside trenches. The isotropic etch process may include an overetch step to ensure that the backside recesses (143, 243) continuously extend between the neighboring pair of backside trenches 79. In one embodiment, each dielectric plate (144, 244) may have four concave sidewalls with a respective radius of curvature that is greater than one half of a lateral separation distance between the first dielectric wall structure 176 and the second dielectric wall structure 176.

Referring to FIGS. 20A-20F, a backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used. At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Figure 20A:
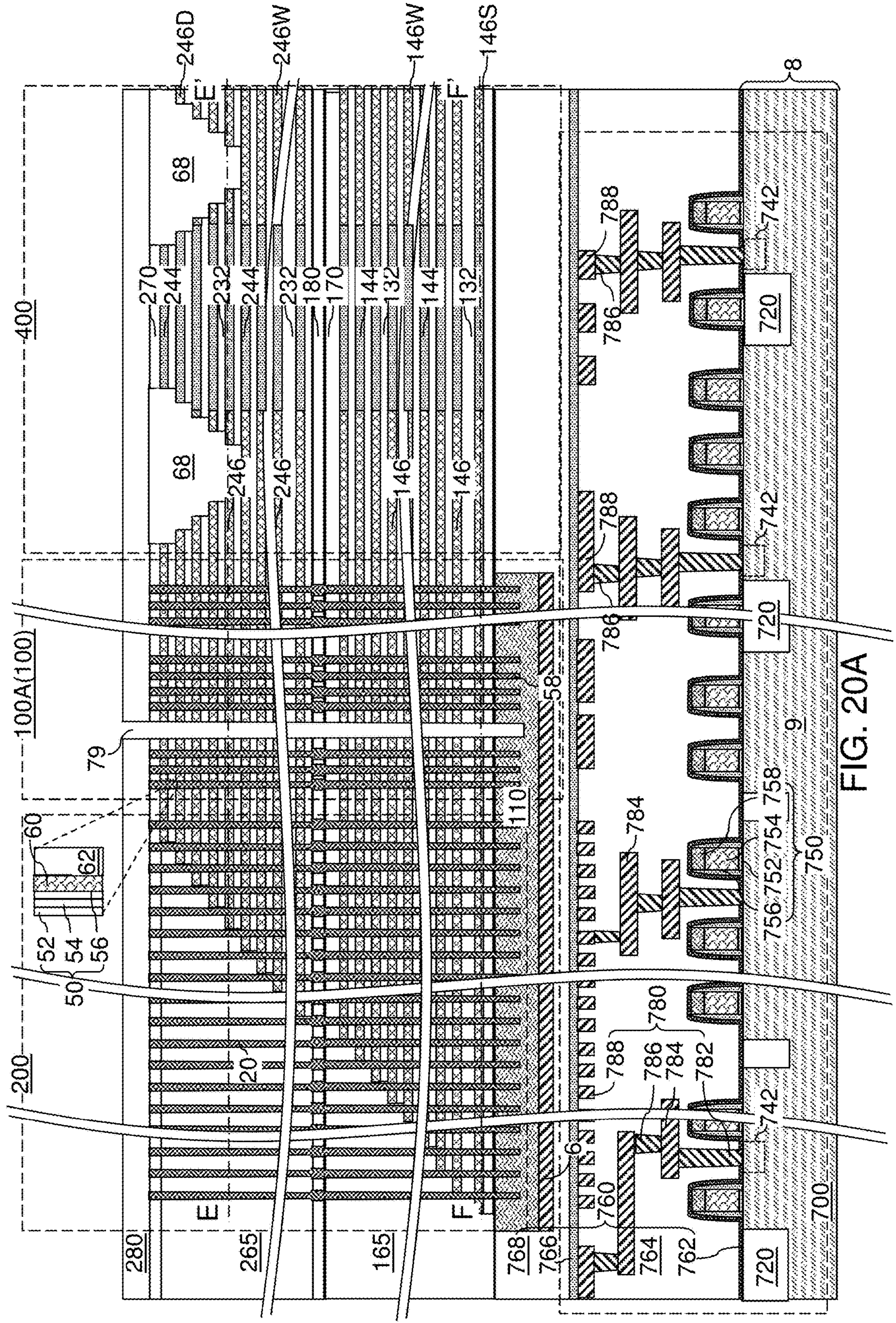
FIG. 20A is a vertical cross-sectional view of the exemplary structure after formation of electrically conductive layers according to an embodiment of the present disclosure.
Figure 20B:
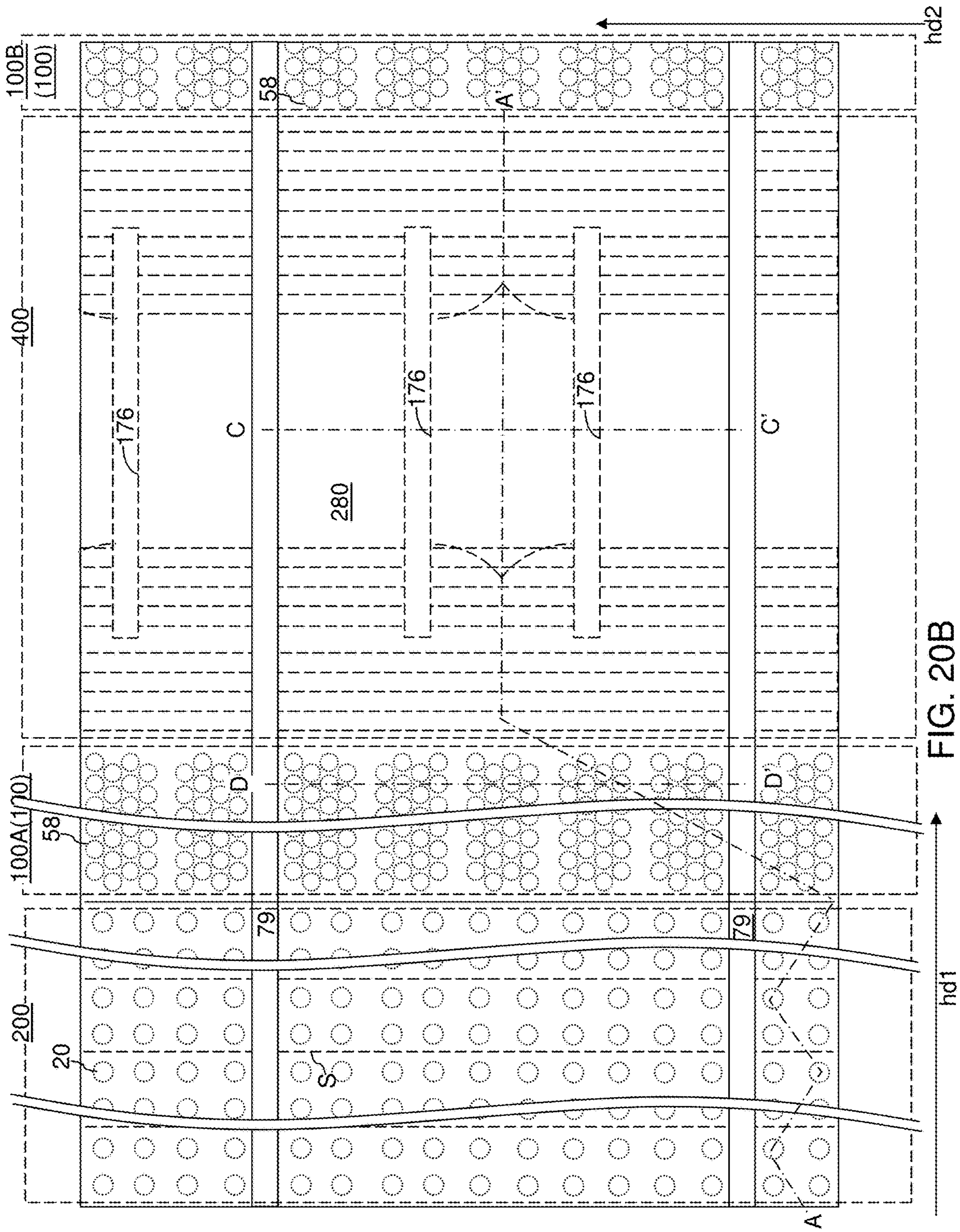
FIG. 20B is a top-down view of the exemplary structure of FIG. 20A. Some covered structures are illustrated in dotted lines. The hinged vertical plane A-A' corresponds to the plane of the vertical cross-sectional view of FIG. 20A.
Figures 20C, 20D:
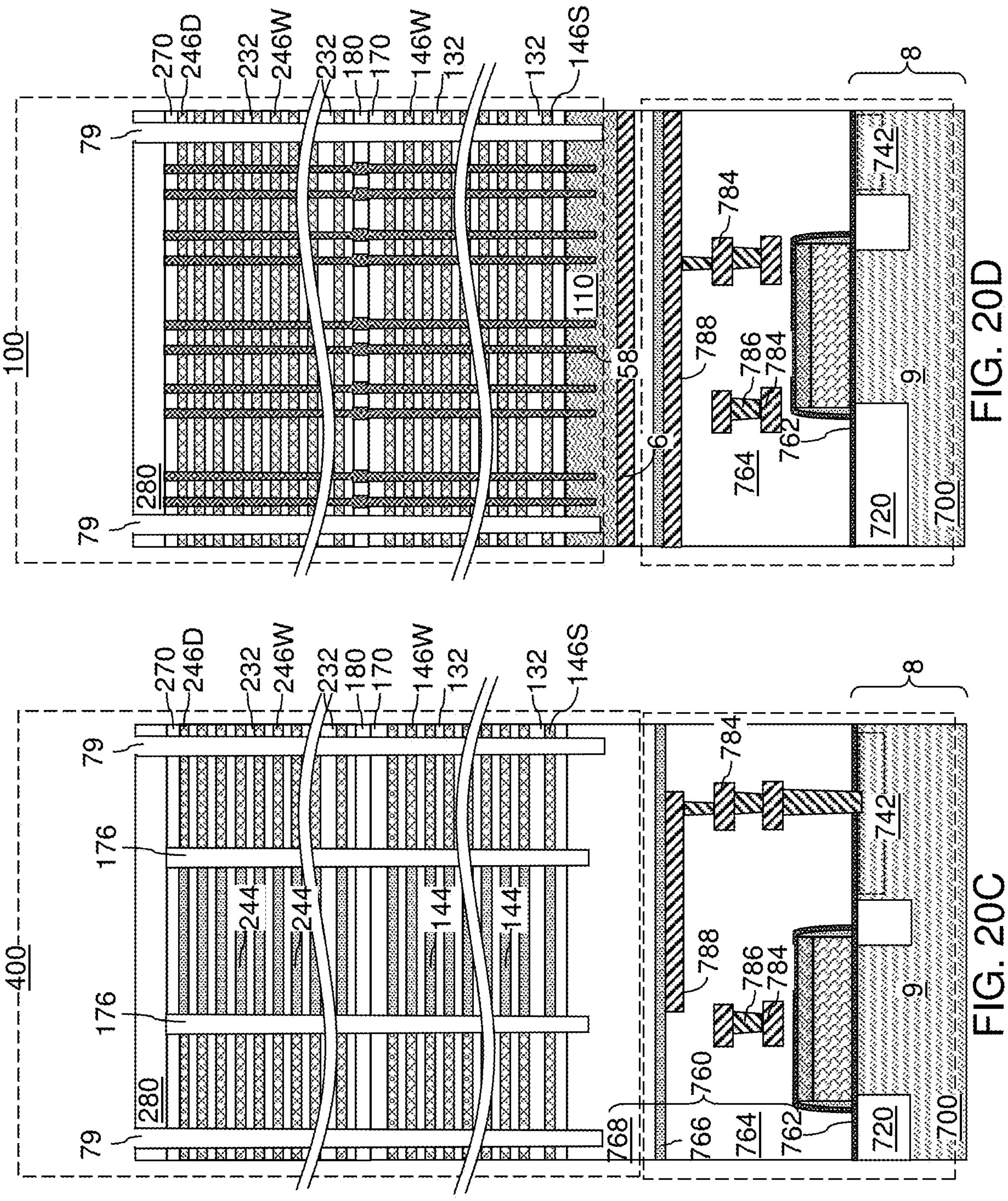
FIG. 20C is a vertical cross-sectional view of the exemplary structure along the vertical plane C-C' of FIG. 20B.
FIG. 20D is a vertical cross-sectional view of the exemplary structure along the vertical plane D-D' of FIG. 20B.
Figure 20E:
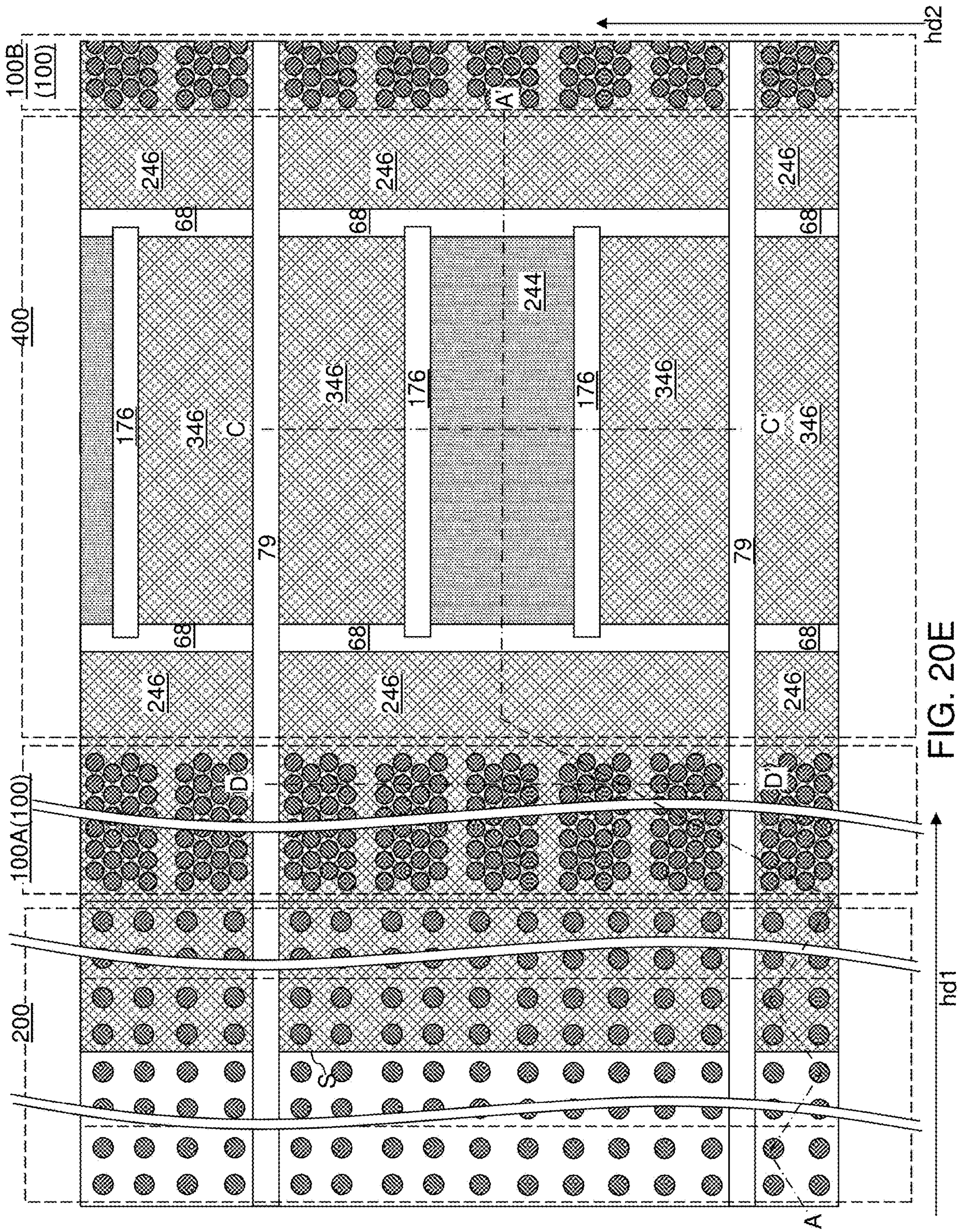
FIG. 20E is a horizontal cross-sectional view of the exemplary structure along the horizontal plane E-E' of FIG. 20A.
Figure 20F:
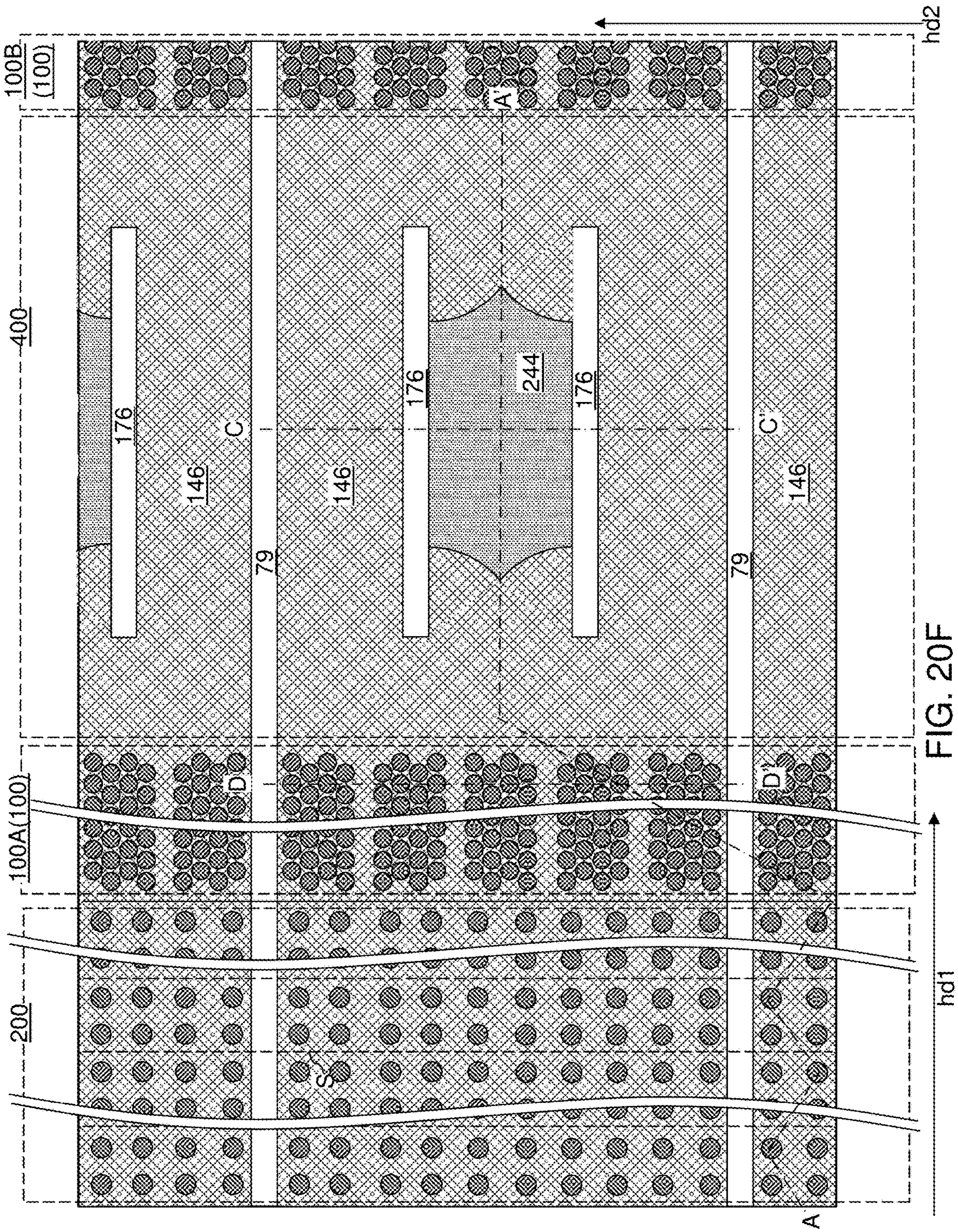
FIG. 20F is a horizontal cross-sectional view of the exemplary structure along the horizontal plane F-F' of FIG. 20A.
Figure 21A:
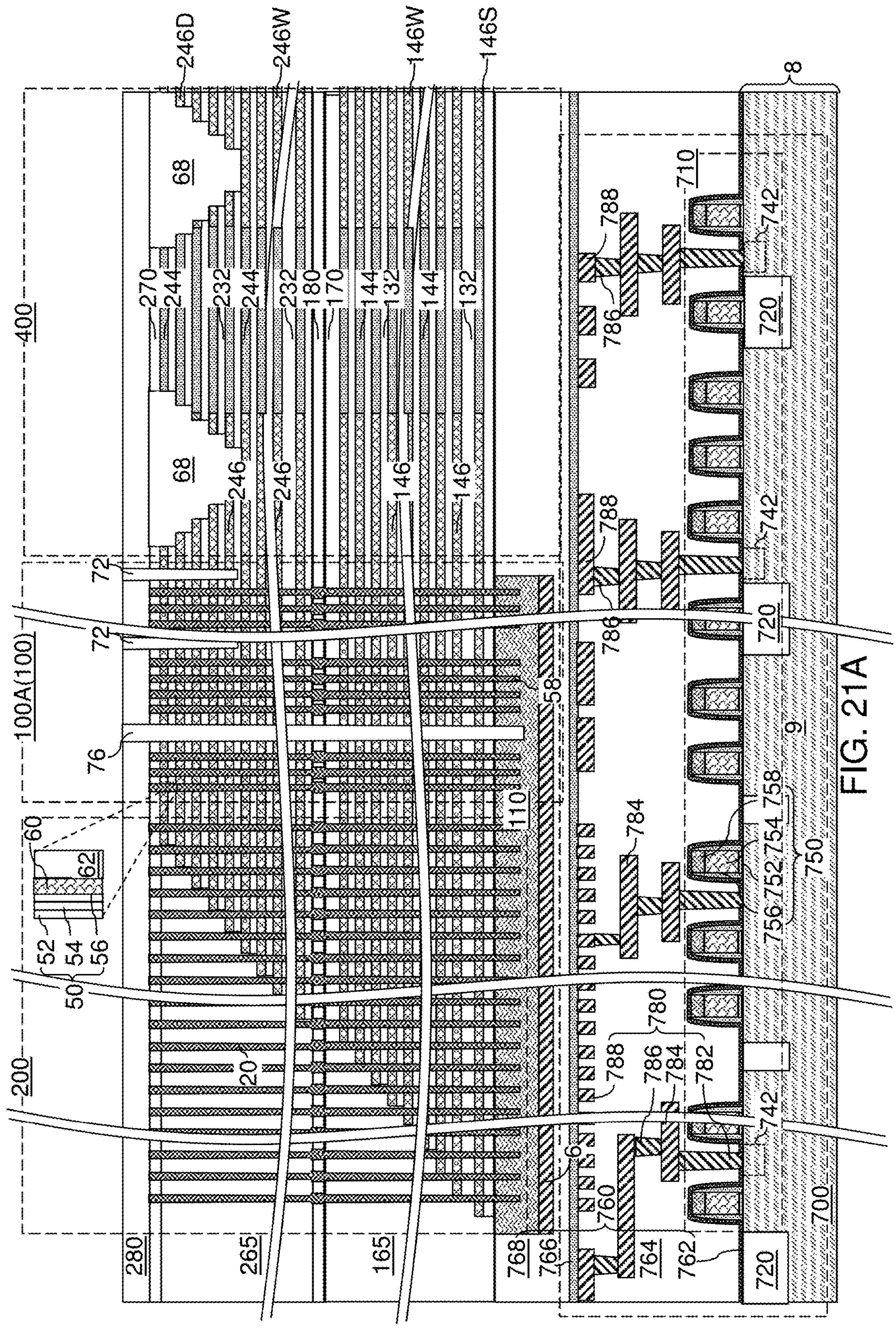
FIG. 21A is a vertical cross-sectional view of the exemplary structure after formation of backside trench fill structures and drain-select-level isolation structures according to an embodiment of the present disclosure.
Figure 21B:
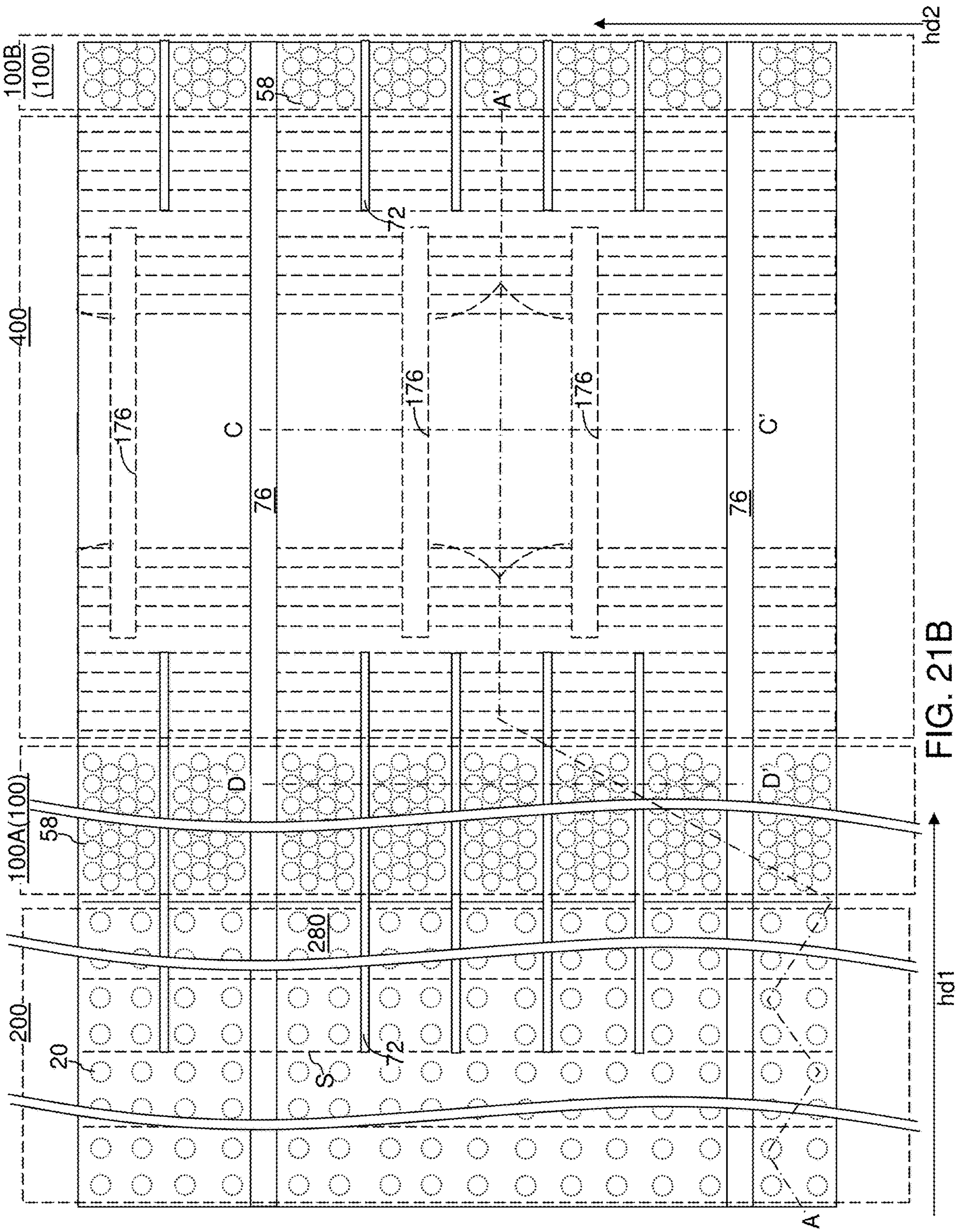
FIG. 21B is a top-down view of the exemplary structure of FIG. 21A. Some covered structures are illustrated in dotted lines. The hinged vertical plane A-A' corresponds to the plane of the vertical cross-sectional view of FIG. 21A.
Figure 21D:
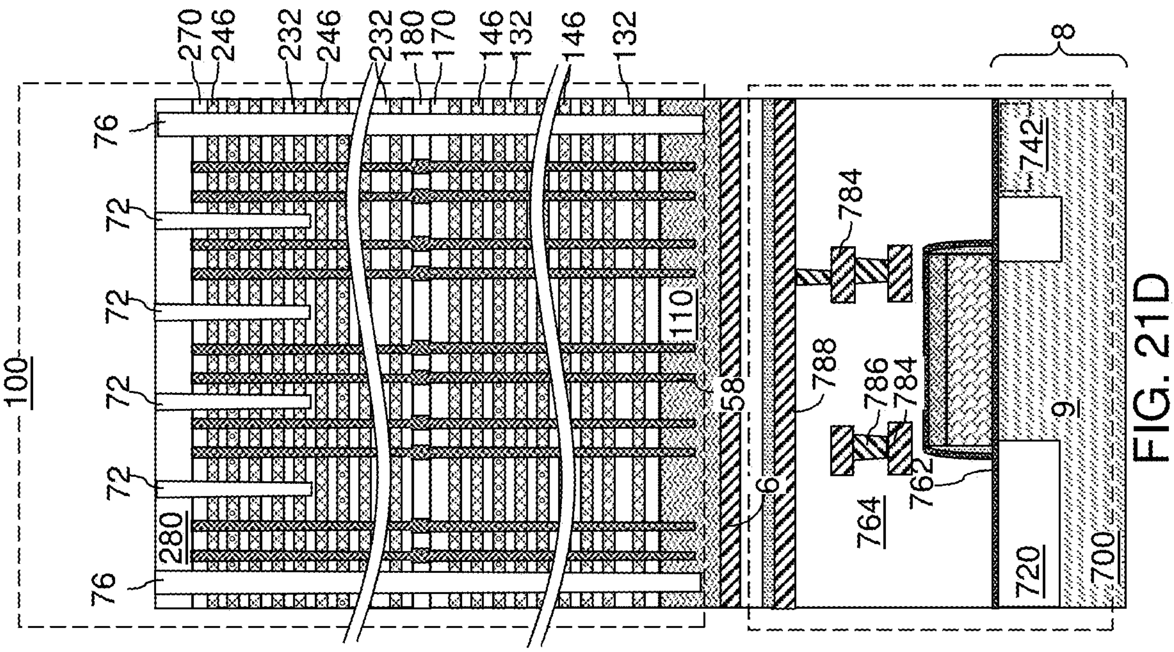
FIG. 21D is a vertical cross-sectional view of the exemplary structure along the vertical plane D-D' of FIG. 21B.
Figure 21C:
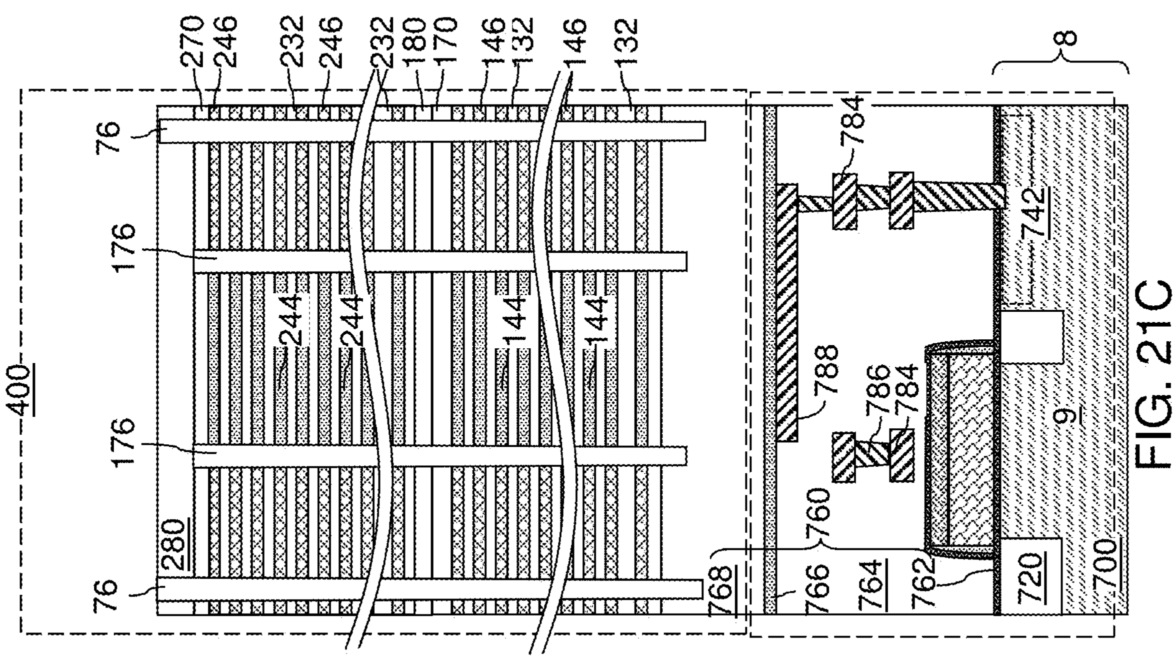
FIG. 21C is a vertical cross-sectional view of the exemplary structure along the vertical plane C-C' of FIG. 21B.

Electrically conductive material portions (146, 246, 346) may be formed in the backside recesses (143, 243) by deposition of the at least one conductive material. A plurality of first electrically conductive layers 146 may be formed in the plurality of first backside recesses 143, and a plurality of second electrically conductive layers 246 may be formed in the plurality of second backside recesses 243 that laterally extend continuously into any of the memory array regions 100. As shown in FIG. 20E, connection plates 346 are formed within volumes that are laterally bounded by a respective dielectric wall structure 176, a respective pair of dielectric rail structures 68, and a respective backside trench 79. A continuous metallic material layer (not shown) may be formed on the sidewalls of each backside trench 79 and over the contact-level dielectric layer 280 as a continuous material layer. Each of the first electrically conductive layers 146, the second electrically conductive layers 246, and the connection plates 346 may include a respective conductive metallic nitride liner and a respective conductive fill material.

Each cavity that occupies volumes of removed portions of first and second sacrificial material layers (142, 242) may be filled with a first electrically conductive layer 146, a second electrically conductive layer 246, or a connection plate 346. Specifically, each removed portion of the first sacrificial material layer 142 may be replaced with an optional portion of the backside blocking dielectric layer and a first electrically conductive layer 146. Each removed portion of the second sacrificial material layer 242 that extends into one of the memory array regions 100 may be replaced with an optional portion of the backside blocking dielectric layer and a second electrically conductive layer 246. Each removed portion of the second sacrificial material layer 242 located in a connection region 400 and laterally bounded by a pair of dielectric rail structures 68 may be replaced with an optional portion of the backside blocking dielectric layer and a connection plate 346. A vertical stack of connection plates 346 may be formed between each neighboring pair of a backside trench 79 and a dielectric wall structure 176. The connection plates 346 within each vertical stack of connection plates 346 may have a variable lateral extent along the first horizontal direction hd1 that decreases stepwise with a vertical distance from the substrate 8. All connection plates 346 within a vertical stack of connection plates 346 may have a same width along the second horizontal direction hd2. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses 143 constitutes a first electrically conductive layer 146. Each remaining portion of the deposited metallic material in the second backside recesses 143 that extend into one of the memory array regions 100 constitutes a second electrically conductive layer 246. Each remaining portion of the deposited metallic material in the second backside recesses 243 located in a connection region 400 and laterally bounded by a pair of dielectric rail structures 68, a dielectric wall structure 176, and a backside trench 79 constitutes a connection plate 346. Sidewalls of the first electrically conductive material layers 146 and the second electrically conductive layers 246 may be physically exposed to a respective backside trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

Each of the connection plates 346 may have a uniform width along the second horizontal direction hd2, which is the lateral separation distance between a backside trench 79 and a proximal lengthwise sidewall of a dielectric wall structure 176, i.e., one of the two lengthwise sidewalls of the dielectric wall structure 176 that is more proximal to the backside trench 79. An alternating stack of insulating layers (132, 232) and electrically conductive layers (146, 246) may be formed between each neighboring pair of backside trenches 79. Each alternating stack {(132, 146), (232, 246)} may embed a respective first dielectric wall structure 176 and a respective second dielectric wall structure 176 that laterally extend along the first horizontal direction hd1 and are laterally spaced apart along the second horizontal direction hd2. Each connection plate 346 may be laterally bounded by a combination of a first dielectric wall structure 176 and a first backside trench 79 within the neighboring pair of backside trenches 79, or by a combination of a second dielectric wall structure 176 and the second backside trench 79 within the neighboring pair of backside trenches 79.

Generally, first portions of the continuous sacrificial material layers (142, 242) as formed in vertically alternating sequences may be replaced with electrically conductive layers (146, 246). A first alternating stack of insulating layers (132, 232) and electrically conducive layers (146, 46) may be formed between a first backside trench 79 and a second backside trench 79. A pair of dielectric wall structures 176 may be located in the connection region 400, which vertically extends through the first alternating stack {(132, 146), (232, 246)}. Additional alternating stacks of additional insulating layers (132, 232) and additional electrically conductive layers (146, 246) may be formed adjacent to the first backside trench 79 and the second backside trench 79. The first alternating stack of insulating layers (132, 232) and electrically conductive layers (146, 246) may be laterally spaced apart from neighboring alternating stacks of respective insulating layers (132, 232) and respective electrically conductive layers (146, 246) by the first backside trench 79 and the second backside trench 79 that laterally extend along the first horizontal direction hd1. The first alternating stack comprises a first memory array region 100A including a first subset of the memory stack structures 55, a second memory array region 100B including a second subset of the memory stack structures, 55 and a connection region 400 including a pair of dielectric wall structures 176 among the dielectric wall structures 176. The second memory array region 100B may be laterally spaced from the first memory array region 100A along the first horizontal direction hd1 by the connection region 400. The connection region 400 may adjoin the first memory array region 100A and the second memory array region 100B.

The electrically conductive layers (146, 246) within the first alternating stack (include a first subset, which is a lower subset, that includes all electrically conductive layers (146, 246) that continuously extend from the first memory array region 100A, through the connection region 400, and into the second memory array region 100B. The first subset includes word lines (146W, 246W) and one or more source select gate electrodes (146S). The electrically conductive layers (146, 246) within the first subset are located underneath a horizontal plane including the bottommost surfaces of the dielectric rail structures 68. Further, the electrically conductive layers (146, 246) within the first alternating stack include a second subset, which is an upper subset, that includes all electrically conductive layers 246 that do not continuously extend from the first memory array region 100A to the second memory array region 100B. The electrically conductive layers 246 within the second subset are located above the horizontal plane including the bottommost surfaces of the dielectric rail structures 68 and are thus separated into separate portions by the dielectric rail structures 68. The electrically conductive layers 246 within the second subset comprise drain select gate electrodes 246D.

Referring to FIGS. 21A-21D, a photoresist layer (not shown) may be applied over the contact-level dielectric layer 280, and may be lithographically patterned to form elongated openings that extend along the first horizontal direction hd1. In one embodiment, the backside trenches 79 may be filled with the photoresist material of the photoresist layer without optional voids therein. The locations of the elongated openings may be selected such that the elongated openings overlie spaces between neighboring groups of rows of memory opening fill structures 58 that laterally extend along the first horizontal direction hd1. Each elongated opening may laterally extend from a peripheral region of a staircase region 200, through a memory array region 100 that adjoins the staircase region 200, and to a portion of a dielectric rail structure 68 having a maximum thickness and located in a connection region 400 that adjoins the memory array region 100. At least one elongated openings may be formed between each neighboring pair of backside trenches 79 in each memory array region 100. In one embodiment, a plurality of elongated openings may be formed between each neighboring pair of backside trenches 79 in each memory array region 100. While the present disclosure is described employing an embodiment in which four elongated openings are formed between each neighboring pair of backside trenches 79 in each memory array region 100, embodiments are expressly contemplated herein in which one, two, three, or five or more elongated openings are formed between each neighboring pair of backside trenches 79 in each memory array region 100.

An anisotropic etch process may be performed to transfer the pattern of the elongated openings in the photoresist layer through each layer of the alternating stacks {(132, 146), (232, 246) located above the horizontal plane including the bottommost surfaces of the dielectric rail structures 68. Line trenches are formed through each second electrically conductive layer 246 within the second subset (i.e., the upper subset) of the electrically conductive layers (146, 246) (which is located above the horizontal plane including the bottommost surfaces of the dielectric rail structures 68). Each second electrically conductive layer 246 within the second subset of the electrically conductive layers (146, 246) is laterally divided by line trenches that laterally extend along the first horizontal direction hd1. Each line trench may be located between groups of rows of memory opening fill structures 58, and may extend from the stepped surfaces of a staircase region 200 to connection region stepped surfaces in a connection region 400. The photoresist layer may be removed, for example, by ashing.

A dielectric material such as silicon oxide may be deposited in the backside trenches 79 and in the line trenches that extend through the second subset of the electrically conductive layers (146, 246). Excess portions of the dielectric material may be removed from above the top surface of the contact-level dielectric layer 280 by a planarization process. Alternatively, a horizontal portion of the dielectric material overlying the contact-level dielectric layer 280 may be employed to form another interconnect-level dielectric layer that may be incorporated into the contact-level dielectric layer 280.

Each remaining portion of the dielectric material in the backside trenches 79 constitutes a backside trench fill structures 76. Each remaining portion of the dielectric material in the line trenches constitutes drain-select-level isolation structures 72. Each drain-select-level isolation structure 72 may have a uniform width in a respective memory array region 100. Each patterned portion of the second subset of the electrically conductive layers (which includes a subset of the second electrically conductive layers 246 located above the horizontal plane including the bottommost surfaces of the dielectric rail structures 68) is a drain select gate electrode 246D which is herein referred to as a drain-select-level electrically conductive layer. Generally, the second (upper) subset of the electrically conductive layers (146, 246) is patterned by forming the drain-select-level isolation structures 72 therethrough. The first (lower) subset of the electrically conductive layers (146, 246) is not patterned by the drain-select-level isolation structures 72. The connection plates 346 are located at the same level as, and include the same set of materials as, the second (upper) subset of the electrically conductive layers (146, 246). A set of connection plates 346 may be formed between each dielectric wall structure 176 and a most proximal one of the backside trench fill structures 76. In one embodiment, the backside trench fill structures 76 and the drain-select-level isolation structures 72 may include the same dielectric material throughout. The drain-select-level isolation structures 72 separate the drain select gate electrodes 246D in the same memory block between adjacent backside trench fill structures 76 into separate string sets, as will be described in more detail below with respect to FIGS. 23F to 23H.

Referring to FIGS. 22A-22E, various via cavities may be formed through the contact-level dielectric layer 280 and any underlying dielectric material portion underneath, if present, down to a top surface of a respective conductive structure. The various via cavities may be formed by applying and lithographically patterning at least one photoresist layer over the contact-level dielectric layer 280 to form a respective set of openings, and by transferring the pattern of the openings in a respective photoresist layer through the contact-level dielectric layer 280 and any underlying dielectric material portion underneath. In one embodiment, all of the via cavities may be formed simultaneously employing a single lithographic patterning process and a single anisotropic etch process. In another embodiment, the via cavities may be formed employing multiple lithographic patterning processes and multiple anisotropic etch processes. Each photoresist layer may be removed after a respective anisotropic etch process, for example, by ashing.

The various via cavities may include connection via cavities that are formed on a respective one of the second subset of the electrically conductive layers (i.e., the second electrically conductive layers 246 that overlie the horizontal plane including the bottommost surfaces of the dielectric rail structures 68) within the connection regions 400, plate contact via cavities that are formed on a respective one of the connection plates 346 within the connection regions 400, drain contact via cavities that are formed on a respective one of the drain regions 63 in the memory array regions 100, gate contact via cavities that are formed on each of the electrically conductive layers (146, 246) in the staircase regions 200, and through-memory-level via cavities that are formed through a respective vertical stack of dielectric plates (144, 244) in the connection regions 400.

In one embodiment, the connection via cavities, the plate contact via cavities, and the gate contact via cavities may be concurrently formed employing a sane anisotropic etch process that etches dielectric materials selective to the materials of the electrically conductive layers (146, 246) and the connection plates 346. The through-memory-level metal via cavities may be formed concurrently with, before, or after formation of the connection via cavities, the plate contact via cavities, and the gate contact via cavities. The anisotropic etch process that forms the through-memory-level metal via cavities may be selective to the material of the landing-pad-level metal line structures 788. The anisotropic etch process that forms the drain contact via cavities may be selective to the material of the drain regions 63.

At least one conductive material may be deposited in each of the via cavities employing a respective conformal deposition process. For example, a metallic liner layer including a conductive metallic nitride (such as TiN, TaN, and/or WN) and a metallic fill material (such as W, Cu, Co, Ru, Mo, another metal, alloys thereof, and/or layer stacks thereof) may be deposited in each of the via cavities. Excess portions of the at least one conductive material overlying the top surface of the contact-level dielectric layer 280 may be removed by a planarization process such as a chemical mechanical planarization process.

Each remaining portion of the at least one conductive material in the drain contact via cavities constitutes a drain contact via structure 88 that contacts a top surface of a respective drain region 63. Each remaining portion of the at least one conductive material in the gate contact via structures constitutes a gate contact via structure 86 that contacts a top surface of a respective electrically conductive layer (146, 246) in a respective staircase region 200. Each remaining portion of the at least one conductive material in the connection via cavities constitutes a connection metal via structure 82 that contacts a respective strip of the second (upper) subset of the electrically conductive layers (146, 246). Each remaining portion of the at least one conductive material in the plate contact via structures constitutes a plate contact via structure 84 that contacts a respective connection plate 346. Each remaining portion of the at least one conductive material in the through-memory-level via cavities constitutes a through-memory-level metal via structure 888 that contacts a respective landing-pad-level metal line structure 788. The second subset of the electrically conductive layers (146, 246) include discrete patterned portions of the second electrically conductive layers 246 contacting at least one drain-select-level isolation structure 72 and overlies a horizontal plane including the bottom surfaces of the dielectric rail structures 68.

The through-memory-level metal via structures 888 are formed though a respective vertical stack of dielectric plates (144, 244) and each of the insulating layers (132, 232) in a respective alternating stack {(132, 146), (232, 246)}. Generally, the through-memory-level metal via structure 888 may be formed directly on a respective one of the lower-level metal interconnect structures 780. In one embodiment, each connection metal via structure 82 contacts a respective discrete portion of the second subset of the electrically conductive layers (146, 246) in the first memory array region 100A or in the second memory array region 100B.

Referring to FIGS. 23A-23E, a bit-line-level dielectric layer 290 may be formed over the contact-level dielectric layer 290. The bit-line-level dielectric layer 290 includes a dielectric material such as silicon oxide, and may have a thickness in a range from 100 nm to 300 nm, although lesser and greater thicknesses may also be employed. Line cavities may be formed in the bit-lie-level dielectric layer 290 over a respective subset of the metal via structures (82, 84, 86, 88, 888) by a combination of lithographic patterning and an anisotropic etch process.

Upper-level metal line structures (98, 96, 94, 898) may be formed in the line cavities. The upper-level metal line structures (98, 96, 94, 898) may include bit lines 98, gate-connection metal lines 96, connection metal line structures 94, and bus metal lines 898. The bit lines 98 laterally extend along the second horizontal direction hd2 and contact a respective subset of the drain contact via structures 88. The gate-connection metal lines 96 are located in the staircase regions 200 and contact a respective one of the gate contact via structures 86. The connection metal line structures 94 are located in the connection region 400. Each connection metal line structure 94 may contact a respective one of the connection metal via structures 82 and a respective one of the plate contact via structures 84. The bus metal lines 898 may contact a respective one of the through-memory-level metal via structures 888, and may laterally extend along the second horizontal direction hd2. The bus metal lines 898 may be employed as a power distribution path, as electrical ground, or as a signal path for common control signals that are applied to each memory block located between adjacent backside trenches 79. Each contiguous combination of a connection metal line structure 94, at least one connection metal via structure 82, and at least one plate contact via structure 84 constitutes a set of connection metal interconnect structures (94, 82, 84).

The connection plates 346 may be electrically connected to a respective drain select gate electrode 246D which is a patterned portion of the second (upper) subset of the electrically conductive layers (146, 246) in the first memory array region 100A and to a respective drain select gate electrode which is a patterned portion of the second (upper) subset of the electrically conductive layers (146, 246) in the second memory array region 100B through connection metal interconnect structures (94, 82, 84).

Figure 22A:
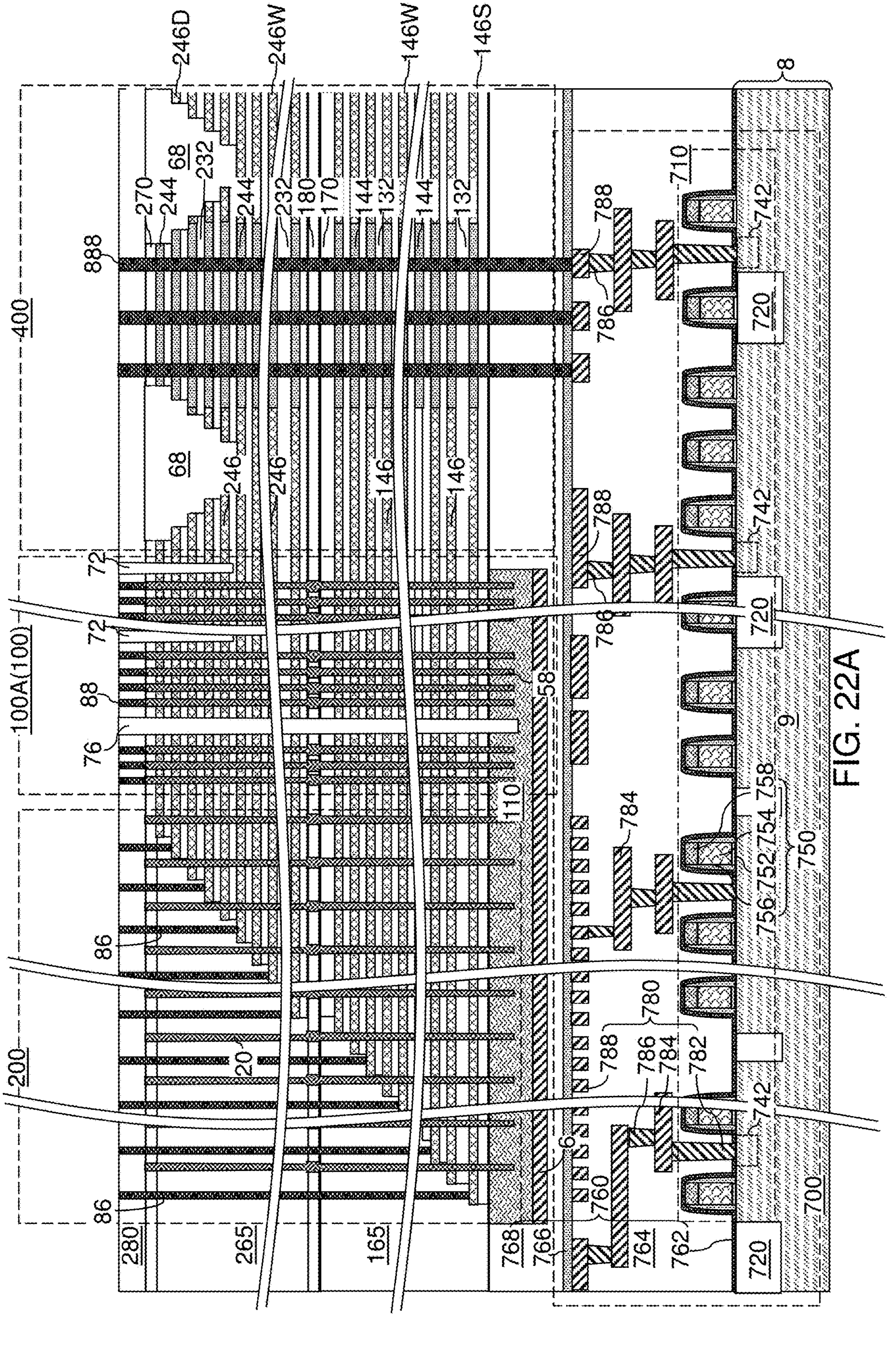
FIG. 22A is a vertical cross-sectional view of the exemplary structure after formation of connection metal via structures, plate contact via structures, drain contact via structures, gate contact via structures, and through-memory-level metal via structures according to an embodiment of the present disclosure.
Figure 22B:
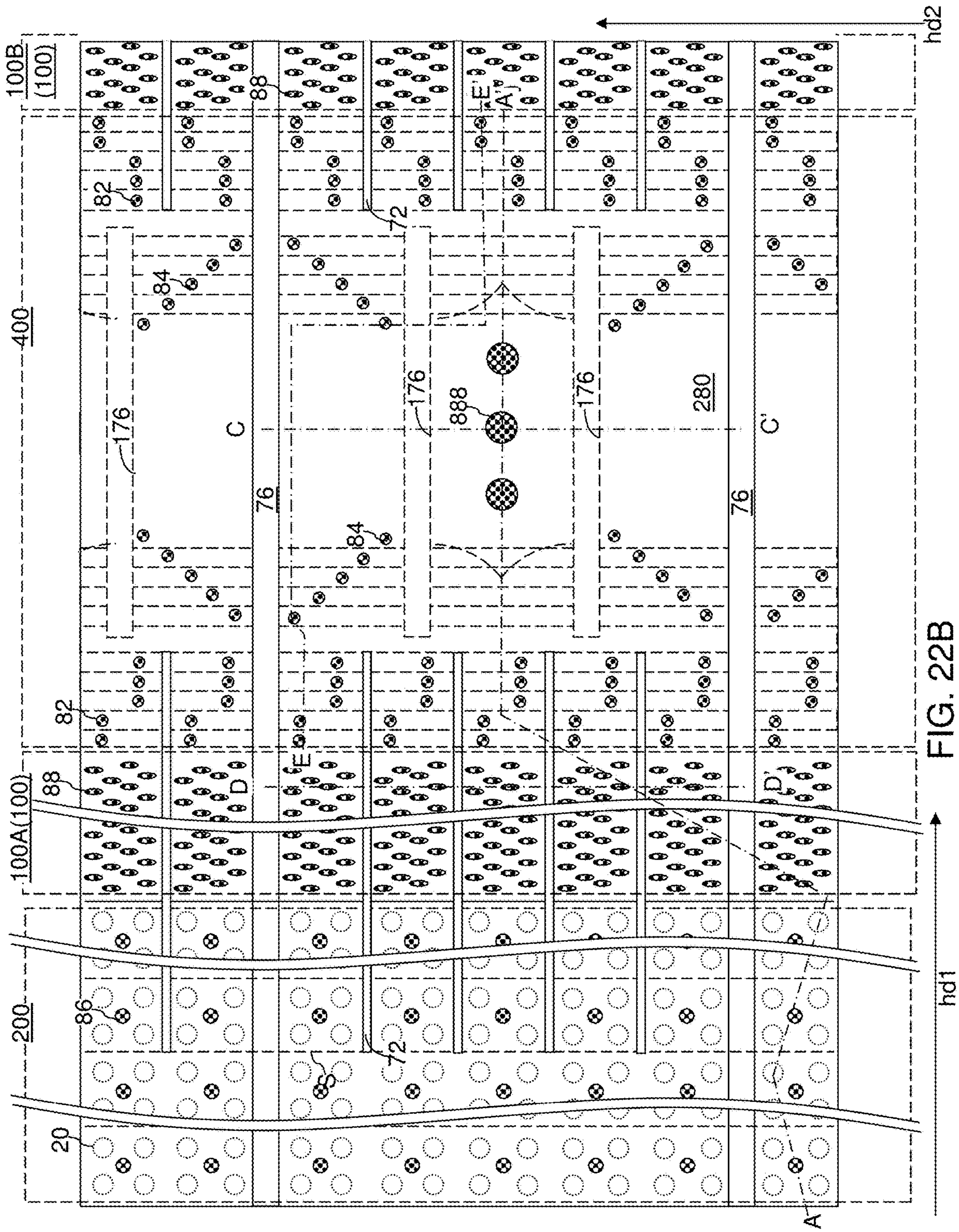
FIG. 22B is a top-down view of the exemplary structure of FIG. 22A. Some covered structures are illustrated in dotted lines. The hinged vertical plane A-A' corresponds to the plane of the vertical cross-sectional view of FIG. 22A.
Figure 22C:
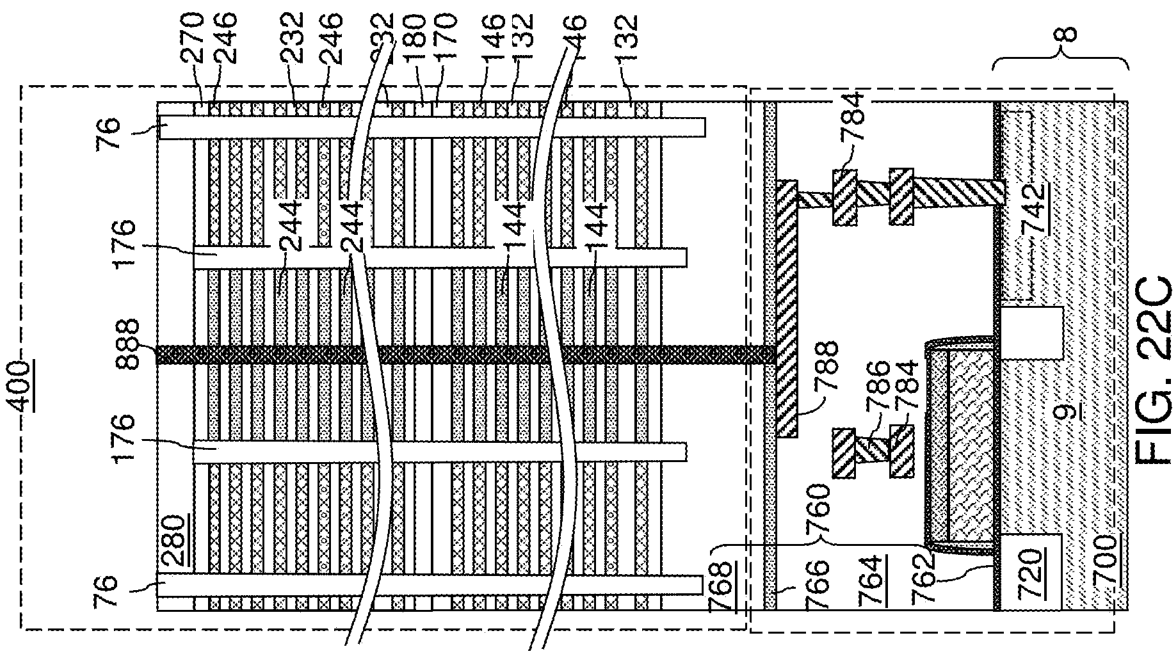
FIG. 22C is a vertical cross-sectional view of the exemplary structure along the vertical plane C-C' of FIG. 22B.
Figure 22D:
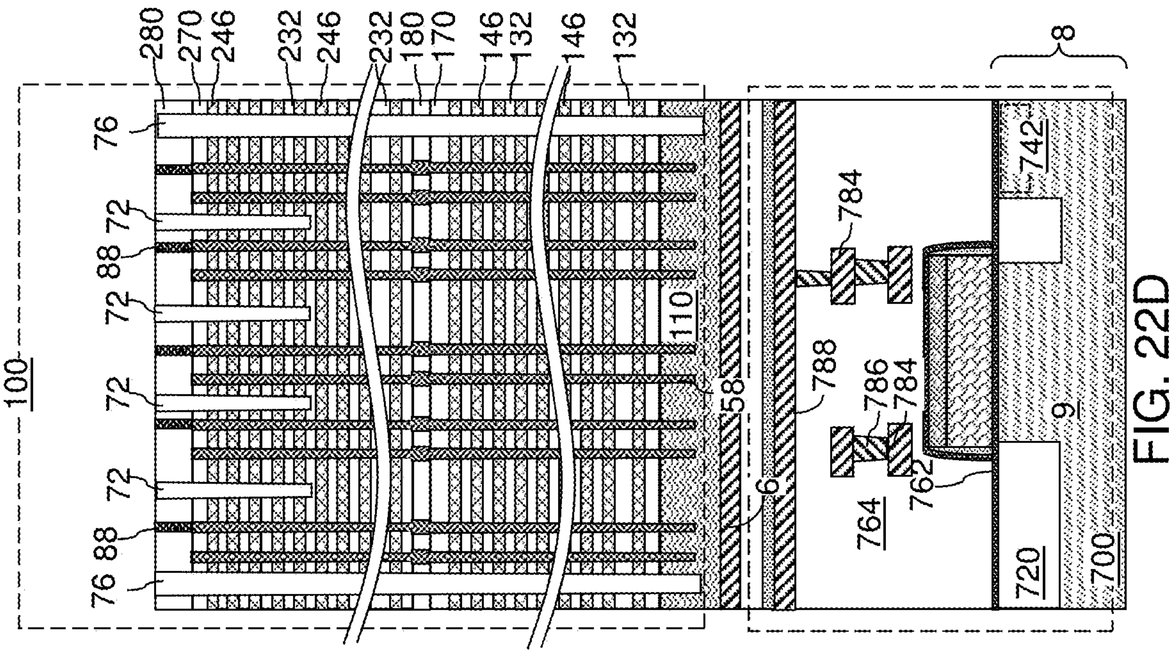
FIG. 22D is a vertical cross-sectional view of the exemplary structure along the vertical plane D-D' of FIG. 22B.
Figure 22E:
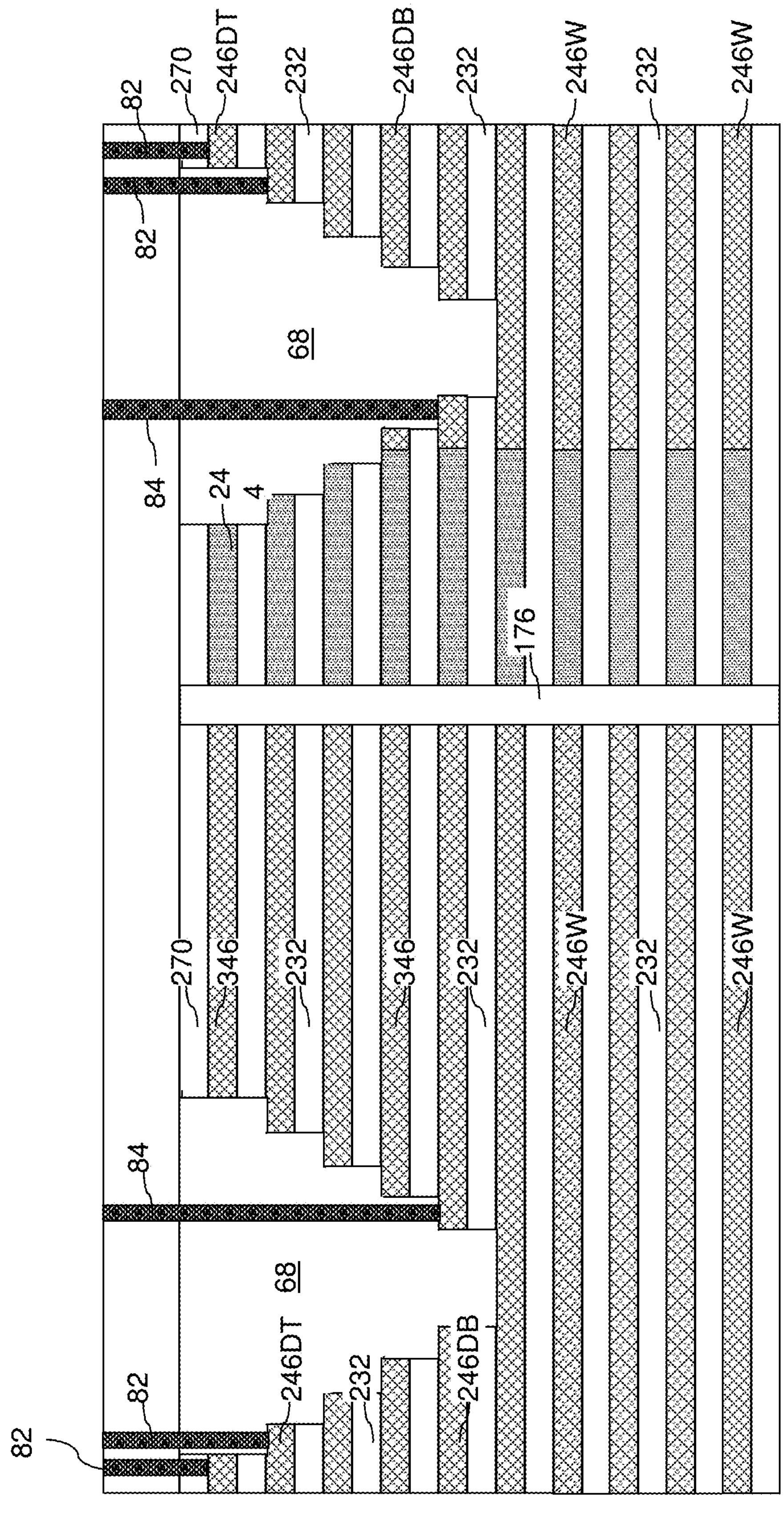
FIG. 22E is a vertical cross-sectional view of an upper region of the exemplary structure along the hinged vertical plane E-E' of FIG. 22B.
Figure 23A:
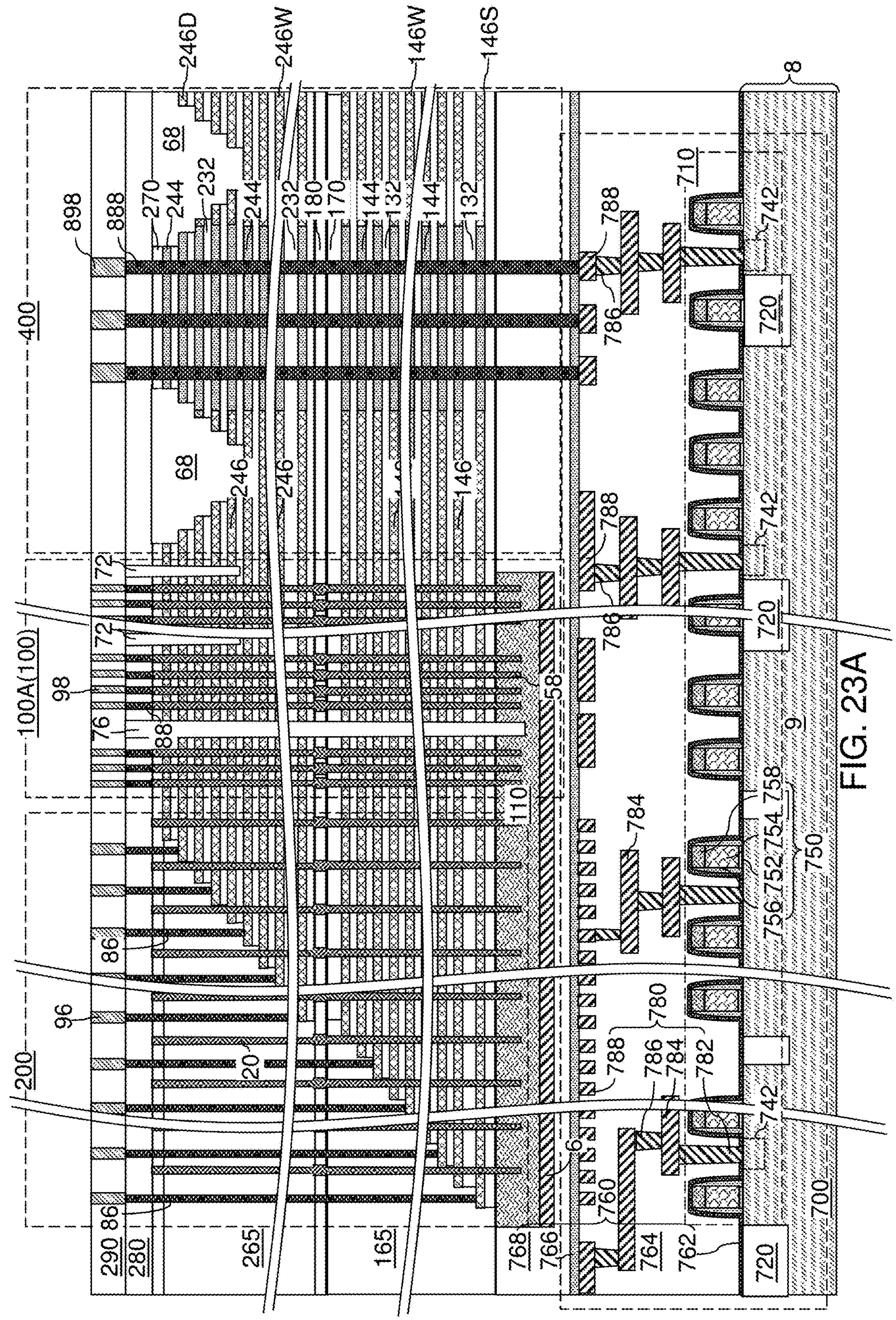
FIG. 23A is a vertical cross-sectional view of the exemplary structure after formation of upper-level metal line structures according to an embodiment of the present disclosure.
Figure 23B:
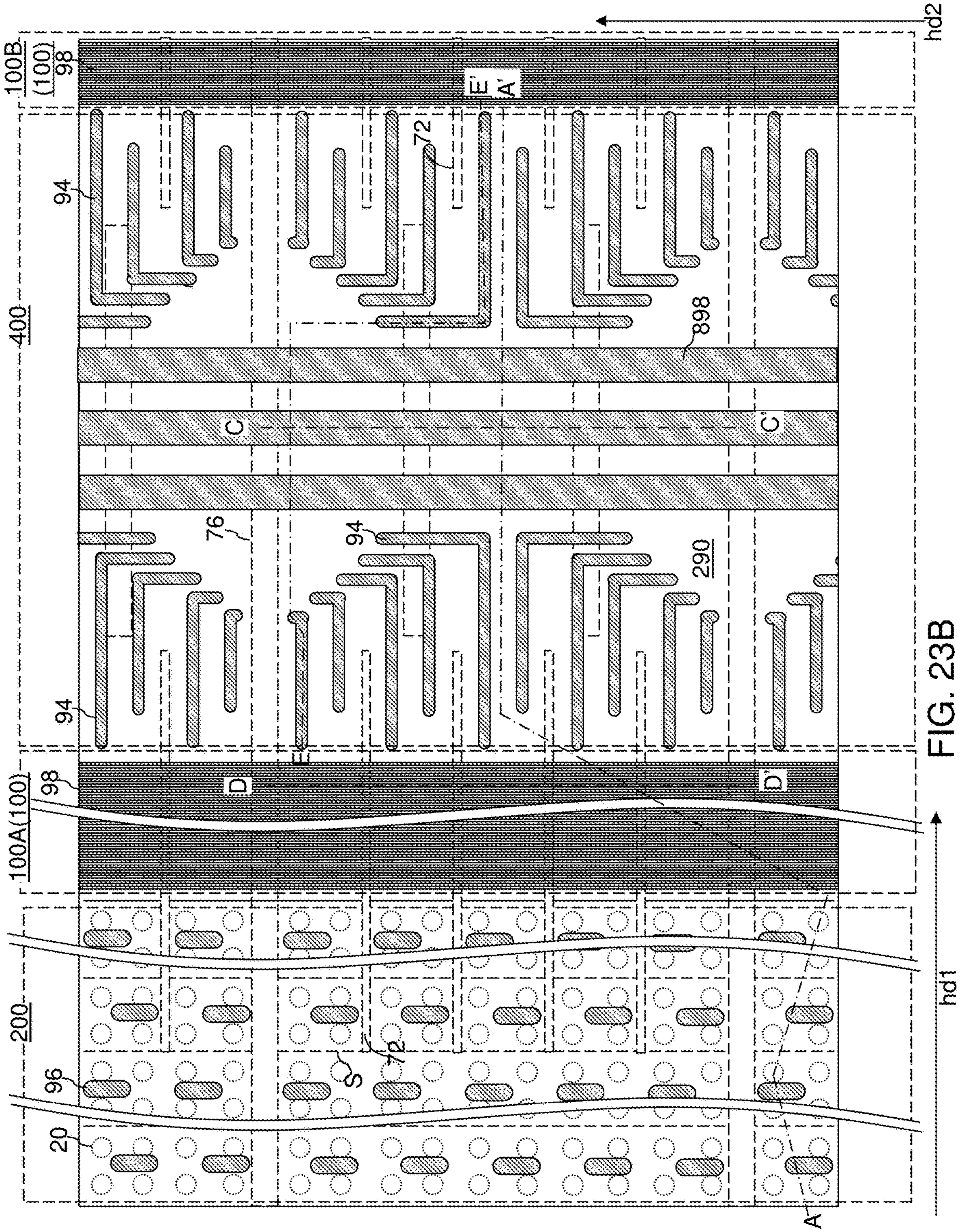
FIG. 23B is a top-down view of the exemplary structure of FIG. 23A. Some covered structures are illustrated in dotted lines. The hinged vertical plane A-A' corresponds to the plane of the vertical cross-sectional view of FIG. 23A.
Figure 23D:
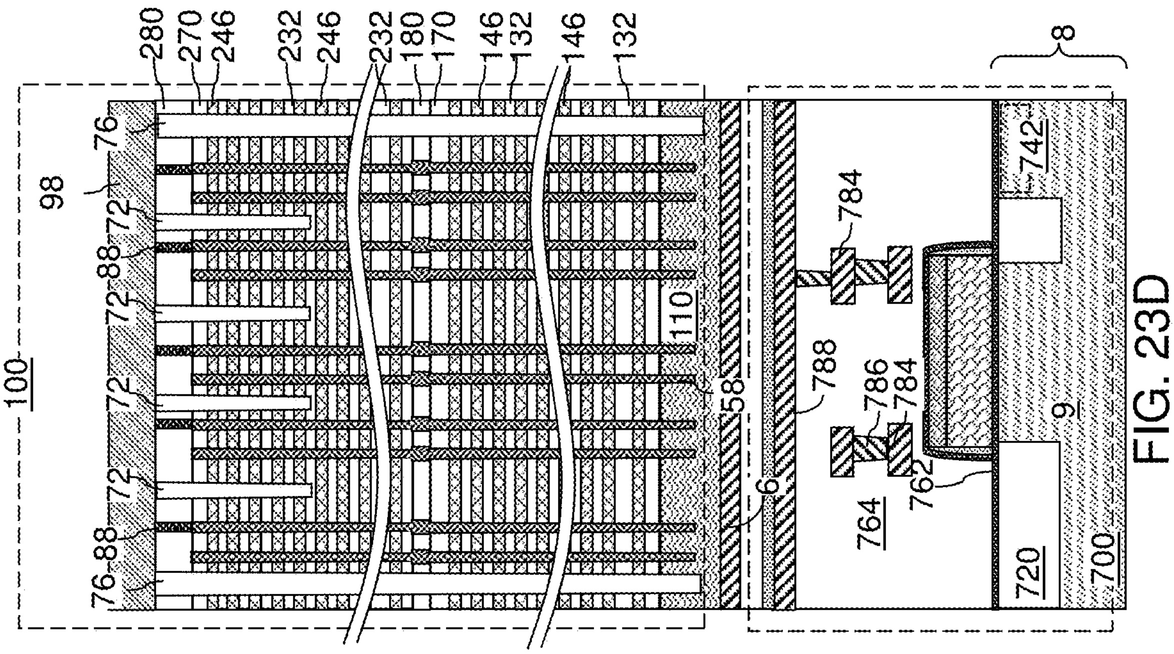
FIG. 23D is a vertical cross-sectional view of the exemplary structure along the vertical plane D-D' of FIG. 23B.
Figure 23C:
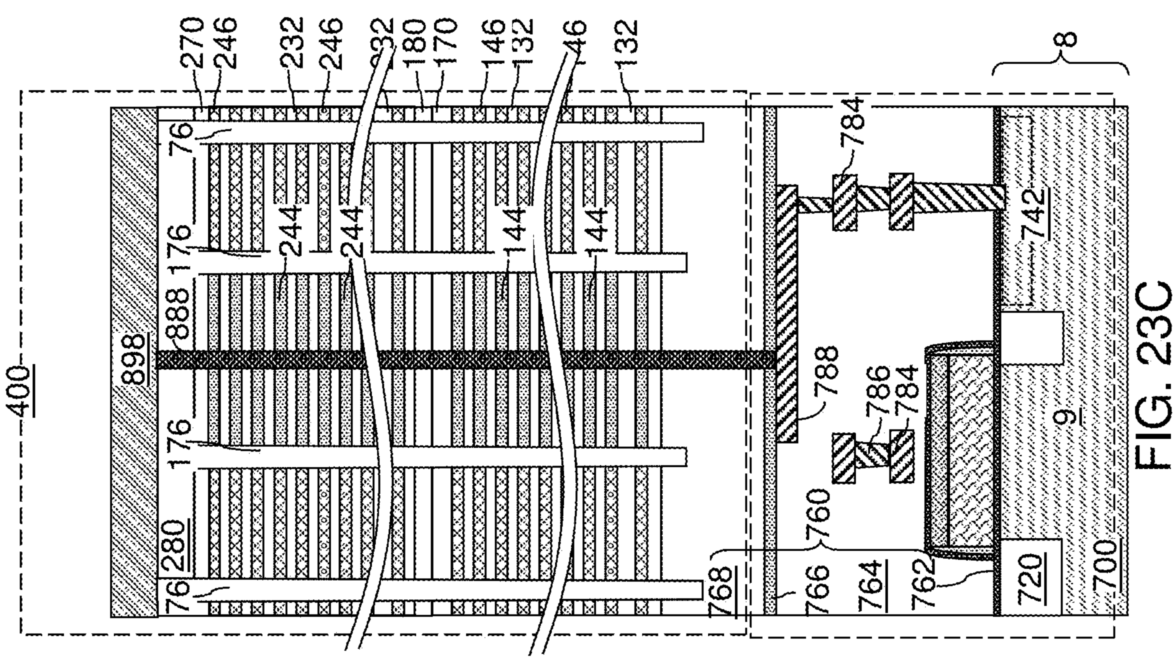
FIG. 23C is a vertical cross-sectional view of the exemplary structure along the vertical plane C-C' of FIG. 23B.
Figure 23E:
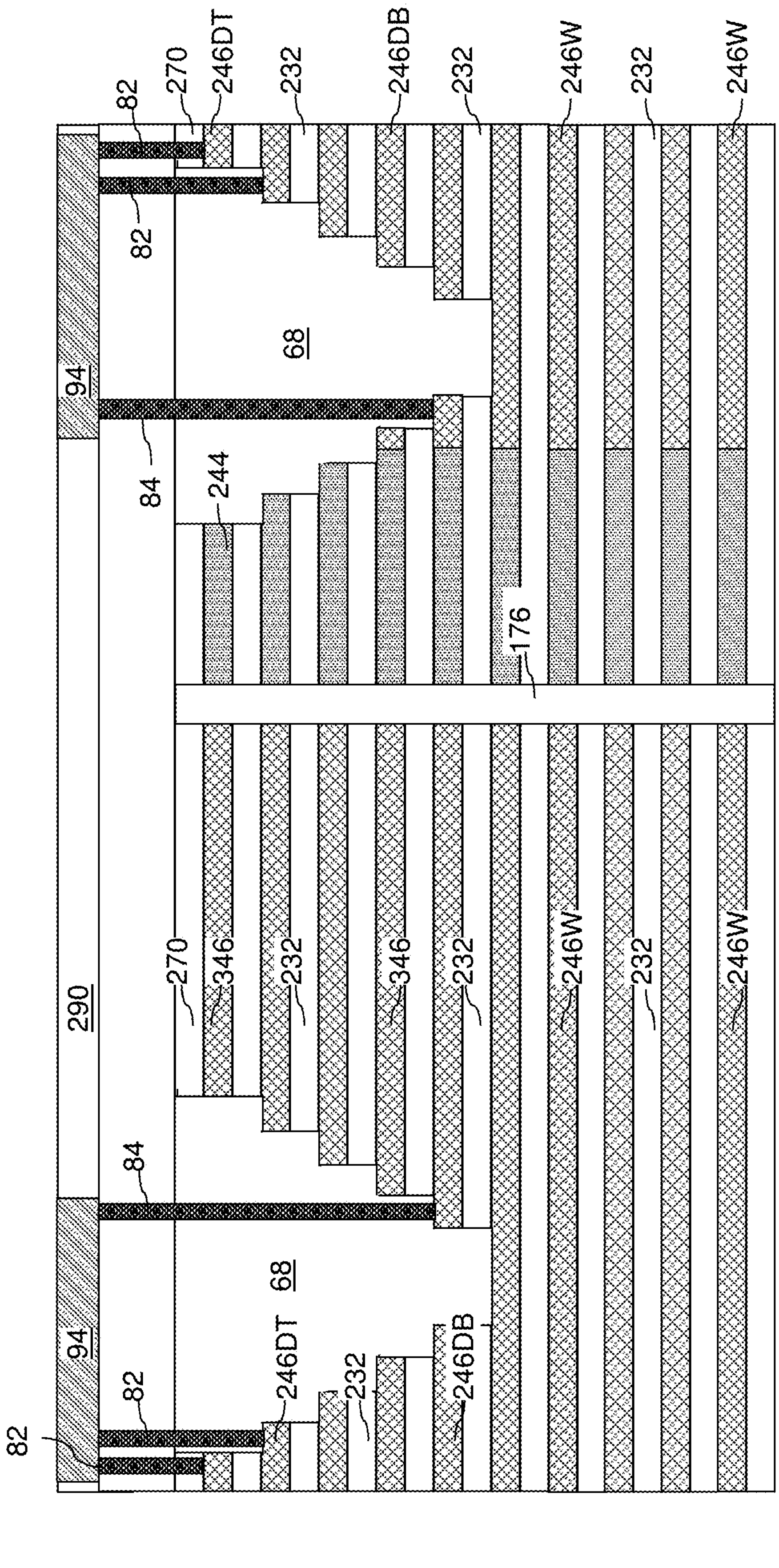
FIG. 23E is a vertical cross-sectional view of an upper region of the exemplary structure along the hinged vertical plane E-E' of FIG. 23B.

As shown in FIGS. 22E and 23E, the drain select gate electrodes 246D may optionally include plural top drain select gate electrodes 246DT ("SGDT) and/or plural bottom drain select gate electrodes 246DB ("SGDB" or "SGD"). The plural top drain select gate electrodes 246DT are electrically connected to each other by the connection metal interconnect structures (94, 82) and are thus controlled together. The plural bottom drain select gate electrodes 246DB are electrically connected to each other by the connection metal interconnect structures (94, 82) and are thus controlled together. However, the top and bottom drain select gate electrodes may be controlled separately from each other.

Figure 23F:
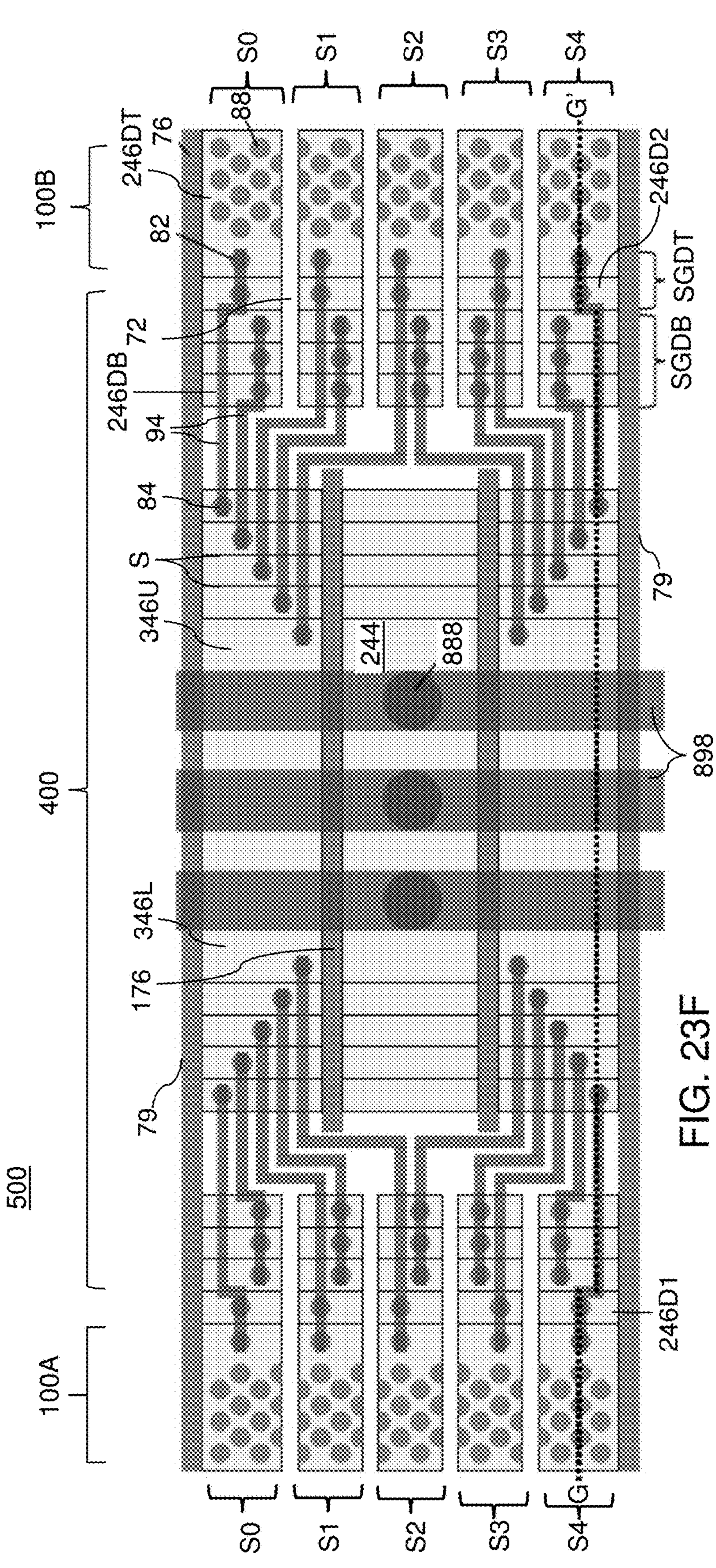
FIG. 23F is a schematic see through top view of the exemplary structure with a first configuration of connection metal line structures.
Figure 23G:
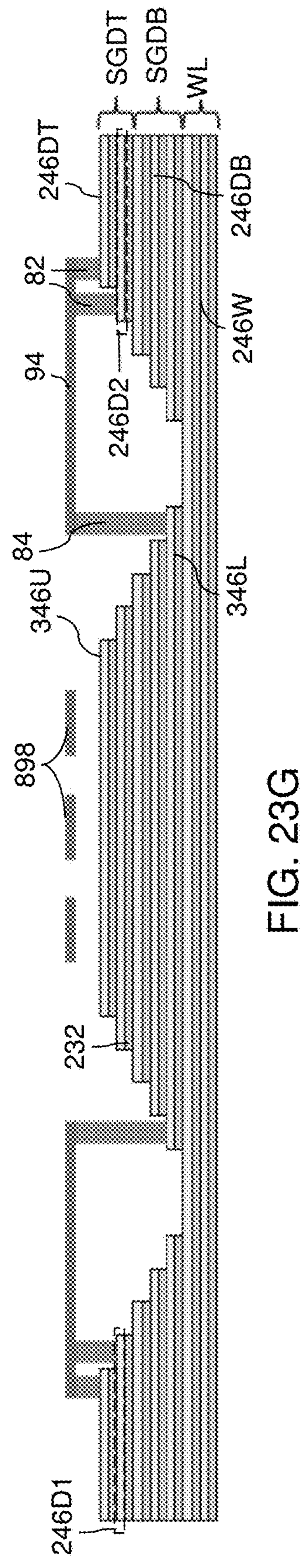
FIG. 23G is a schematic vertical cross-sectional view the exemplary structure along the hinged vertical plane G-G' of FIG. 23F.
Figure 23H:
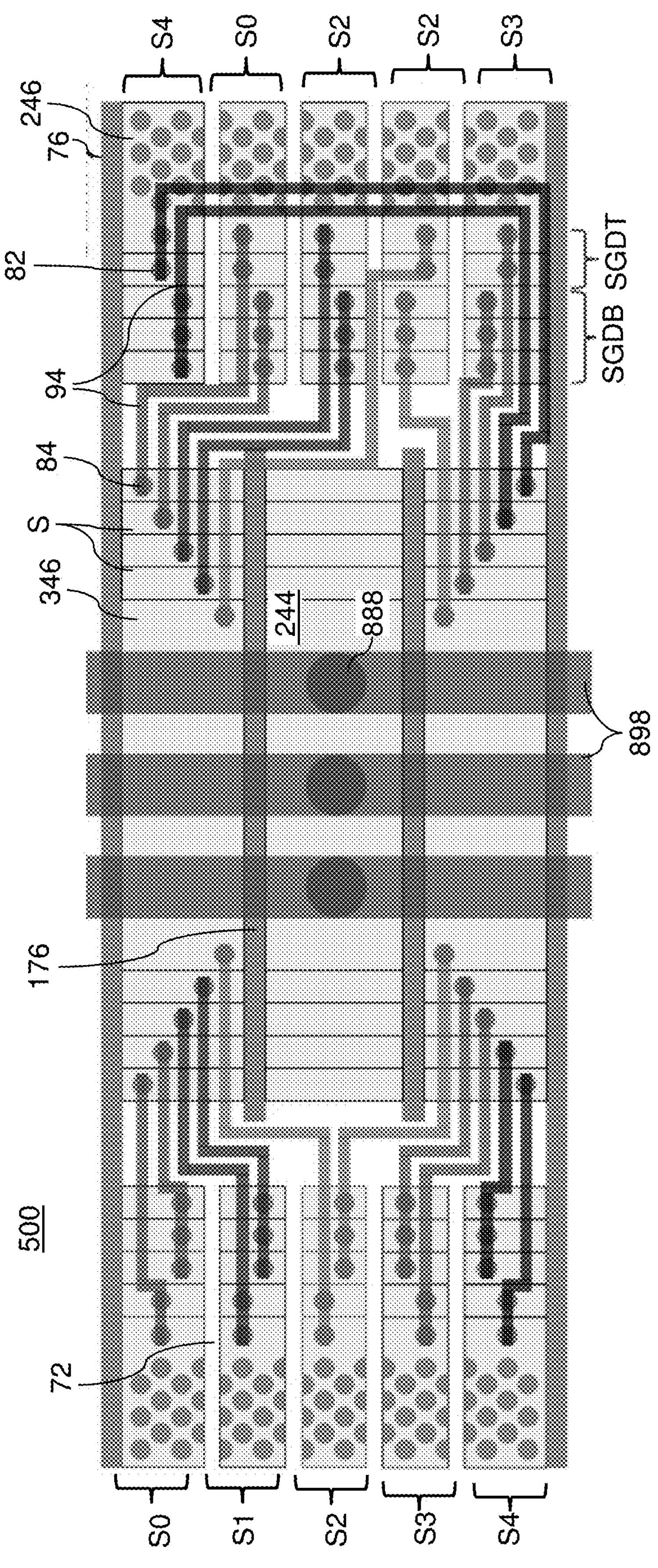
FIG. 23H is a schematic see through top view of the exemplary structure with a second configuration of connection metal line structures.

FIGS. 23F-23H are schematic see through top views of the exemplary structure with a first and second configuration of connection metal line structures (82, 84, 94). In one embodiment, the each memory block 500 shown in FIGS. 23F and 23H contains five string sets S0, S1, S2, S3 and S4. However, less than five and more than five string sets, such as four to eight string sets may be located in each memory block 500 located between adjacent backside trenches 79 containing backside trench fill structures 76. Adjacent string sets in each memory block 500 are separated at the levels of the drain select gate electrodes 246 by the drain-select-level isolation structures 72. However, the word lines (146W, 246W) are not separated in each memory block 500 between the adjacent string sets.

The top drain select gate electrodes 246DT in a first memory array region 100A are electrically connected to the top drain select gate electrodes 246DT in the second memory array region 100B in the same string set (e.g., any one of S0 through S5) through the connection metal interconnect structures (94, 82, 84) and the connection plates 346 located in the connection region 400. The bottom drain select gate electrodes 246DB in the first memory array region 100A are electrically connected to the bottom drain select gate electrodes 246DB in the second memory array region 100B in the same string set (e.g., any one of S0 through S5) through the connection metal interconnect structures (94, 82, 84) and the connection plates 346 located in the connection region 400.

In one embodiment shown in FIGS. 23F and 23G, the top drain select gate electrodes 246DT in the memory array regions (100A, 100B) of the same string set (e.g., S0) are electrically connected to the lower connection plates 346L, while the bottom drain select gate electrodes 246DB in the same memory array regions (100A, 100B) of the same string (e.g., S0) set are electrically connected to the upper connection plates 346U which overly the lower connection plates 346L. In this embodiment, the length of the electrical connections is about the same between the respective top and bottom drain select gate electrodes in adjacent memory array regions.

In another embodiment shown in FIG. 23H, the positions of the string sets in the first memory array region 100A and in the second memory array region 100B may be different. For example, in the first memory array region 100A, string sets S0, S1, S2, S3 and S4 may be located in the respective first, second, third, fourth and fifth lateral positions starting from one of the backside trench fill structures 76 and ending at the other backside trench fill structure 76 in the same memory block 500. In the second memory array region 100B, string sets S4, S0, S1, S2, and S3 may be located in the respective first, second, third, fourth and fifth lateral positions starting from one of the backside trench fill structures 76 and ending at the other backside trench fill structure 76 in the same memory block 500. The string set lateral position change is accomplished by laterally shifting the respective connection metal line structures 94 between the connection region 400 and at least one of the memory array regions (100A, 100B). This lateral shifting (i.e., switching) of the connection metal line structures 94 may reduce or eliminate the drain select gate electrode RC string set dependence, since inner string sets (e.g., S1, S2, and S3) may have a higher drain select gate RC than the outer string sets (e.g., S0 and S4) due to the length and curvature of the connection metal line structures 94. The switching of the connection metal line structures 94 reduces or eliminates the RC difference between inner and outer string sets and improves device performance.

Referring to all drawings and according to various embodiments of the present disclosure, a three-dimensional memory device is provided, which comprises: a first alternating stack of insulating layers (132, 232) and electrically conductive layers (146, 246) located over a substrate 8 and laterally spaced apart from neighboring alternating stacks of respective insulating layers (132, 232) and respective electrically conductive layers (146, 246) by a first backside trench 79 and a second backside trench 79 that laterally extend along a first horizontal direction hd1; first memory stack structures 55 extending through a first memory array region 100A of the first alternating stack and second memory stack structures 55 extending through a second memory array region 100 of the first alternating stack, wherein the second memory array region 100B is laterally offset from the memory array region 100A by a connection region 400; and dielectric wall structures 176 located in the connection region 400 and vertically extending through the first alternating stack.

Each electrically conductive layer (146S, 146W, 246W) within a first subset of the electrically conductive layers (146, 246) comprises a word line (146W, 246W) or a source select gate electrode (146S), and continuously extends between the first memory array region 100A and the second memory array region 100B through the connection region 400. Each electrically conductive layer 246D within a second subset of the electrically conductive layers (146, 246) comprises a drain select gate electrode, and does not extend through the connection region 400 such that each drain select gate electrode is physically divided into a first portion 246D1 located in the first memory array region 100A and a second portion 246D2 located in the second memory array region 100B, as shown in FIGS. 23F and 23G. The first portion 246D1 of each drain select gate electrode 246D is electrically connected to a second portion 246D2 of the same drain select gate electrode 246D by a respective set of connection metal interconnect structures (94, 82, 84) through a respective connection plate 346 located between one of the dielectric wall structures 176 and a proximal one of the first and second backside trenches 79.

In one embodiment, the dielectric wall structures 176 comprise a first dielectric wall structure 176 and a second dielectric wall structure 176 that are spaced apart along a second horizontal direction hd2; and each of the first dielectric wall structure 176 and the second dielectric wall structure 176 vertically extends from a topmost layer within the first alternating stack {(132, 146), (232, 246)} to a bottommost layer within the first alternating stack {(132, 146), (232, 246)}.

In one embodiment, each of the first dielectric wall structure 176 and the second dielectric wall structure 176 has a respective pair of lengthwise sidewalls that are parallel to the first horizontal direction hd1; and each of the connection plates 346 has a uniform width along the second horizontal direction hd2 and is laterally bounded by a combination of the first dielectric wall structure 176 and the first backside trench 79 or by a combination of the second dielectric wall structure 176 and the second backside trench 79.

In one embodiment, a vertical stack of dielectric plates (144, 244) may be located between the first dielectric wall structure 176 and the second dielectric wall structure 176 and may be vertically spaced apart from each other by portions of the insulating layers (132, 232) located in the connection region 400 between the first and the second dielectric wall structures 176.

In one embodiment, the vertical stack of dielectric plates has stepped surfaces such that each dielectric plate (144, 244) within the vertical stack of dielectric plates (144, 244) has a lateral extend along the first horizontal direction hd1 that is less than a length of the first dielectric wall structure 176 along the first horizontal direction hd1 and is less than a length of the second dielectric wall structure 176 along the first horizontal direction hd1; and each dielectric plate (144, 244) has four concave sidewalls with a respective radius of curvature that is greater than one half of a lateral separation distance between the first dielectric wall structure 176 and the second dielectric wall structure 176.

In one embodiment, a through-memory-level metal via structure 888 may vertically extend though the vertical stack of dielectric plates (144, 244) and each of the insulating layers (132, 232); and an upper-level metal line structure (such as a bus metal line 898) may contact a top surface of the connection metal via structure 888 and may extend over the first alternating stack {(132, 146), (232, 246)} and over the neighboring alternating stacks {(132, 146), (232, 246)}.

In one embodiment, each set of connection metal interconnect structures (94, 82, 84) may comprise: a connection metal via structure 82 contacting a respective discrete portion of the second subset of the electrically conductive layers 246 in the first memory array region 100A or in the second memory array region 100B; a plate contact via structure 84 contacting one of the connection plates 346; and a connection metal line structure 94 contacting the connection metal via structure 82 and the plate contact via structure 84.

In one embodiment, portions of the second subset of the electrically conductive layers 246 extending into the first memory array region 100A have first stepped surfaces in the connection region 400; portions of the second subset of the electrically conductive layers 246 extending into the second memory array region 100B have second stepped surfaces in the connection region 400; and the connection plates 346 in the connection region 400 have third stepped surfaces located adjacent to the first stepped surfaces and fourth stepped surfaces located adjacent to the second stepped surfaces. In one embodiment, each of the connection metal via structures 82 contacts a respective one of the first stepped surfaces and the second stepped surfaces; and each of the plate contact via structures 84 contacts a respective one of the third stepped surfaces and the fourth stepped surfaces.

In one embodiment illustrated in FIG. 23H, the connection metal line structures 94 are laterally shifted between the connection region 400 and at least one of the first and second memory array regions (100A, 100B) to laterally shift positions of string sets (S0 through S4) between the first memory array region and the second memory array region.

In another embodiment illustrated in FIGS. 23F and 23G, first portions 246D1 of top drain select gate electrodes 246DT are electrically connected to second portions 246D2 of the top drain select gate electrodes 246DT through lower connection plates 346L, while first portions 246D1 of bottom drain select gate electrodes 246DB are electrically connected to second portions 246D2 of the bottom drain select gate electrodes 246DB through upper connection plates 346U which overlie the lower connection plates 346L.

In one embodiment, gate contact via structures 86 may be located within a staircase region 200 in which the first alternating stack {(132, 146), (232, 246)} has stepped surfaces, wherein each of the electrically conductive layers (146, 246) is contacted by a respective one of the gate contact via structures 86 within the staircase region 200.

In one embodiment, each of the first memory stack structures 55 and the second memory stack structures 55 comprises: a memory film 50 vertically extending through multiple electrically conductive layers (146, 246) within the first alternating stack {(132, 146), (232, 246)}; and a vertical semiconductor channel 60 contacting a sidewall of the memory film 50.

The through-memory-level metal via structures 888 are electrically connected to lower-level metal interconnect structures 780 through vertical stacks of dielectric plates (144, 244) and insulating layers (132, 232). Because the dielectric plates (144, 244) and the insulating layers (132, 232) provide electrical isolation, formation of dielectric spacers around the through-memory-level metal via structures 888 is not necessary, which simplifies the process. However, the placement of the vertical stacks of dielectric plates (144, 244) and insulating layers (132, 232) between the dielectric wall structures 176 leave a narrow space between the dielectric wall structure 176 and adjacent backside trench 79 for the drain select gate electrodes 246D to pass through the connection region 400 between adjacent memory array regions 100A, 100B. This increases the electrical resistance of the drain select gate electrodes 246D. Furthermore, formation of the drain-select-level isolation structures 72 angled through the narrow space between the drain select gate electrodes 246 adds additional process complexity.

In the embodiments of the present disclosure, a combination of the stepped connection plates 346 and the connection metal interconnect structures (94, 82, 84) electrically connects the drain select gate electrodes 246D across the connection region 400 between a first memory array region 100A and a second memory array region 100B. Thus, the drain select gate electrodes 246D and the drain-select-level isolation structures 72 do not have to be squeezed through the narrow space between the backside trench 79 and the adjacent dielectric wall structure 176. This simplifies the process and avoids the increase in the resistance of the drain select gate electrodes 246D.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

a first alternating stack of insulating layers and electrically conductive layers located over a substrate and laterally spaced apart from neighboring alternating stacks of respective insulating layers and respective electrically conductive layers by a first backside trench and a second backside trench that laterally extend along a first horizontal direction;

first memory stack structures extending through a first memory array region of the first alternating stack and second memory stack structures extending through a second memory array region of the first alternating stack, wherein the second memory array region is laterally offset from the first memory array region by a connection region; and dielectric wall structures located in the connection region and vertically extending through the first alternating stack, wherein:

each electrically conductive layer within a first subset of the electrically conductive layers comprises a word line or a source select gate electrode, and continuously extends between the first memory array region and the second memory array region through the connection region;

each electrically conductive layer within a second subset of the electrically conductive layers comprises a drain select gate electrode, and does not extend through the connection region such that each drain select gate electrode is physically divided into a first portion located in the first memory array region and a second portion located in the second memory array region; and the first portion of each drain select gate electrode is electrically connected to a second portion of the same drain select gate electrode by a respective set of connection metal interconnect structures through a respective connection plate located between one of the dielectric wall structures and a proximal one of the first and second backside trenches.

2. The three-dimensional memory device of claim 1, wherein:

the dielectric wall structures comprise a first dielectric wall structure and a second dielectric wall structure that are spaced apart along a second horizontal direction; and each of the first dielectric wall structure and the second dielectric wall structure vertically extends from a topmost layer within the first alternating stack to a bottommost layer within the first alternating stack.

3. The three-dimensional memory device of claim 2, wherein:

each of the first dielectric wall structure and the second dielectric wall structure has a respective pair of lengthwise sidewalls that are parallel to the first horizontal direction; and each of the connection plates has a uniform width along the second horizontal direction and is laterally bounded by a combination of the first dielectric wall structure and the first backside trench or by a combination of the second dielectric wall structure and the second backside trench.

4. The three-dimensional memory device of claim 2, further comprising a vertical stack of dielectric plates located between the first dielectric wall structure and the second dielectric wall structure and vertically spaced apart from each other by portions of the insulating layers located in the connection region located between the first and the second dielectric wall structures.

5. The three-dimensional memory device of claim 4, wherein:

the vertical stack of dielectric plates has stepped surfaces such that each dielectric plate within the vertical stack of dielectric plates has a lateral extend along the first horizontal direction that is less than a length of the first dielectric wall structure along the first horizontal direction and is less than a length of the second dielectric wall structure along the first horizontal direction; and each dielectric plate has four concave sidewalls with a respective radius of curvature that is greater than one half of a lateral separation distance between the first dielectric wall structure and the second dielectric wall structure.

6. The three-dimensional memory device of claim 4, further comprising:

a through-memory-level metal via structure that vertically extends though the vertical stack of dielectric plates and each of the insulating layers; and an upper-level metal line structure contacting a top surface of the connection metal via structure and extending over the first alternating stack and over the neighboring alternating stacks.

7. The three-dimensional memory device of claim 6, wherein each set of connection metal interconnect structures comprises:

a connection metal via structure contacting a respective discrete portion of the second subset of the electrically conductive layers in the first memory array region or in the second memory array region;

a plate contact via structure contacting one of the connection plates; and a connection metal line structure contacting the connection metal via structure and the plate contact via structure.

8. The three-dimensional memory device of claim 7, wherein:

portions of the second subset of the electrically conductive layers extending into the first memory array region have first stepped surfaces in the connection region;

portions of the second subset of the electrically conductive layers extending into the second memory array region have second stepped surfaces in the connection region; and the connection plates in the connection region have third stepped surfaces located adjacent to the first stepped surfaces and fourth stepped surfaces located adjacent to the second stepped surfaces.

9. The three-dimensional memory device of claim 8, wherein:

each of the connection metal via structures contacts a respective one of the first stepped surfaces or the second stepped surfaces; and each of the plate contact via structures contacts a respective one of the third stepped surfaces or the fourth stepped surfaces.

10. The three-dimensional memory device of claim 7, wherein the connection metal line structures are laterally shifted between the connection region and at least one of the first and second memory array regions to laterally shift positions of string sets between the first memory array region and the second memory array region.

11. The three-dimensional memory device of claim 1, wherein:

first portions of top drain select gate electrodes are electrically connected to second portions of the top drain select gate electrodes through lower connection plates; and first portions of bottom drain select gate electrodes are electrically connected to second portions of the bottom drain select gate electrodes through upper connection plates which overlie the lower connection plates.

12. The three-dimensional memory device of claim 1, further comprising gate contact via structures located within a staircase region in which the first alternating stack has stepped surfaces, wherein each of the electrically conductive layers is contacted by a respective one of the gate contact via structures within the staircase region.

13. The three-dimensional memory device of claim 1, wherein each of the first memory stack structures and the second memory stack structures comprises:

a memory film vertically extending through multiple electrically conductive layers within the first alternating stack; and a vertical semiconductor channel contacting a sidewall of the memory film.

14. A method of forming a three-dimensional memory device, comprising:

forming a vertically alternating sequence of continuous insulating layers and continuous sacrificial material layers over a substrate;

forming memory stack structures extending through the vertically alternating sequence;

forming dielectric wall structures that laterally extend along a first horizontal direction and laterally spaced apart from each other along a second horizontal direction through each layer of the vertically alternating sequence;

forming backside trenches laterally extending along the first horizontal direction through the vertically alternating sequence, wherein the vertically alternating sequence is divided into multiple alternating stacks;

replacing first portions of the continuous sacrificial material layers with electrically conductive layers, wherein a first alternating stack of insulating layers and electrically conducive layers is formed between a first backside trench and a second backside trench, the first alternating stack comprises a first memory array region including a first subset of the memory stack structures, a second memory array region including a second subset of the memory stack structures, and a connection region including a pair of the dielectric wall structures, and second portions of the continuous sacrificial material layers remain between the pair of dielectric wall structures as a vertical stack of dielectric plates;

patterning an upper subset of the electrically conductive layers by forming drain-select-level isolation structures therethrough without patterning a lower subset of the electrically conductive layers, wherein connection plates are formed between each of the pair of dielectric wall structures and a proximal one of the first and second backside trenches; and electrically connecting the connection plates to a respective patterned portion of the upper subset of the electrically conductive layers in the first memory array region and to a respective patterned portion of the upper subset of the electrically conductive layers in the second memory array region through connection metal interconnect structures.

15. The method of claim 14, further comprising:

forming connection region stepped surfaces on a subset of the continuous sacrificial material layers within the connection region; and forming dielectric rail structures having stepped bottom surfaces on the connection region stepped surfaces;

wherein each electrically conductive layer within the upper subset of the electrically conductive layers extends underneath the connection region stepped surfaces and a respective one of the dielectric rail structures; and wherein each set of connection metal interconnect structures is formed through a respective one of the dielectric rail structures on a respective one of the connection region stepped surfaces.

16. The method of claim 15, wherein each set of connection metal interconnect structures comprises:

a connection metal via structure contacting a respective discrete portion of the upper subset of the electrically conductive layers in the first memory array region or in the second memory array region;

a plate contact via structure contacting one of the connection plates; and a connection metal line structure contacting the connection metal via structure and the plate contact via structure.

17. The method of claim 14, wherein:

the dielectric wall structures comprise a first dielectric wall structure and a second dielectric wall structure that are spaced apart along a second horizontal direction;

each of the first dielectric wall structure and the second dielectric wall structure vertically extends from a topmost layer within the first alternating stack to a bottommost layer within the first alternating stack;

each of the first dielectric wall structure and the second dielectric wall structure has a respective pair of lengthwise sidewalls that are parallel to the first horizontal direction; and each of the connection plates has a uniform width along the second horizontal direction and is laterally bounded by a combination of the first dielectric wall structure and the first backside trench or by a combination of the second dielectric wall structure and the second backside trench.

18. The method of claim 14, wherein:

each dielectric plate within the vertical stack of dielectric plates has a lateral extend along the first horizontal direction that is less than a length of the first dielectric wall structure along the first horizontal direction and is less than a length of the second dielectric wall structure along the first horizontal direction; and each dielectric plate has four concave sidewalls with a respective radius of curvature that is greater than one half of a lateral separation distance between the first dielectric wall structure and the second dielectric wall structure.

19. The method of claim 18, further comprising:

forming a through-memory-level metal via structure though the vertical stack of dielectric plates and each of the insulating layers; and forming an upper-level metal line structure on a top surface of the connection metal via structure, wherein the upper-level metal line structure extends over the first alternating stack.

20. The method of claim 19, further comprising:

forming field effect transistors located on a top surface of the substrate; and forming lower-level metal interconnect structures embedded within lower-level dielectric material layers overlying the substrate, wherein the vertically alternating sequence is formed over the lower-level dielectric material layers, wherein the through-memory-level metal via structure is formed directly on one of the lower-level metal interconnect structures.

* * * * *